(12) United States Patent
Sudo et al.

(10) Patent No.: US 12,514,059 B2
(45) Date of Patent: Dec. 30, 2025

(54) DISPLAY DEVICE AND ELECTRONIC DEVICE

(71) Applicant: Sony Semiconductor Solutions Corporation, Kanagawa (JP)

(72) Inventors: Shoji Sudo, Kanagawa (JP); Tomoaki Sawabe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 369 days.

(21) Appl. No.: 18/260,370

(22) PCT Filed: Feb. 10, 2022

(86) PCT No.: PCT/JP2022/005309
§ 371 (c)(1),
(2) Date: Jul. 5, 2023

(87) PCT Pub. No.: WO2022/172981
PCT Pub. Date: Aug. 18, 2022

(65) Prior Publication Data
US 2024/0122042 A1 Apr. 11, 2024

(30) Foreign Application Priority Data
Feb. 12, 2021 (JP) .................................. 2021-021209

(51) Int. Cl.
*H10K 50/852* (2023.01)
*H10K 59/38* (2023.01)
*H10K 59/80* (2023.01)

(52) U.S. Cl.
CPC ........... *H10K 50/852* (2023.02); *H10K 59/38* (2023.02); *H10K 59/876* (2023.02)

(58) Field of Classification Search
CPC .... H10K 50/852; H10K 59/38; H10K 59/876; G02B 5/20; G09F 9/30; H05B 33/12;
(Continued)

(56) References Cited

U.S. PATENT DOCUMENTS

2011/0198629 A1* 8/2011 Lee ...................... H10K 50/852
257/89

FOREIGN PATENT DOCUMENTS

JP   2005197010 A   7/2005
JP   2005197011 A   7/2005
(Continued)

OTHER PUBLICATIONS

International Search Report (PCT/ISA/210), International Application No. PCT/JP2022/005309, dated Apr. 19, 2022.

*Primary Examiner* — Donald L Raleigh
(74) *Attorney, Agent, or Firm* — Michael Best & Friedrich LLP

(57) ABSTRACT

Display devices that suppress complications due to uneven shape of a surface on which a semi-transmissive reflective layer is formed are disclosed. In one example, a display device includes first sub-pixels, second sub-pixels, and third sub-pixels. The first sub-pixel includes a first light emitting element that emits first light and third light, the second sub-pixel includes a second light emitting element that emits second light, and the third sub-pixel includes a third light emitting element that emits first light and third light. The light emitting elements respectively include a first electrode, an organic layer including a light emitting layer, a second electrode, and a semi-transmissive reflective layer, and a resonator structure is configured by the first electrode and the semi-transmissive reflective layer. The heights of the semi-transmissive reflective layers in the first light emitting element and the third light emitting element are the same.

20 Claims, 46 Drawing Sheets

(58) Field of Classification Search
CPC ........ H05B 33/22; H05B 33/24; H05B 33/26; H05B 33/28
See application file for complete search history.

(56) References Cited

FOREIGN PATENT DOCUMENTS

| | | | |
|---|---|---|---|
| JP | 2008539554 | A | 11/2008 |
| JP | 2011165664 | A | 8/2011 |
| JP | 2015216113 | A | 12/2015 |
| JP | 2016143585 | A | 8/2016 |

* cited by examiner

FIG. 5
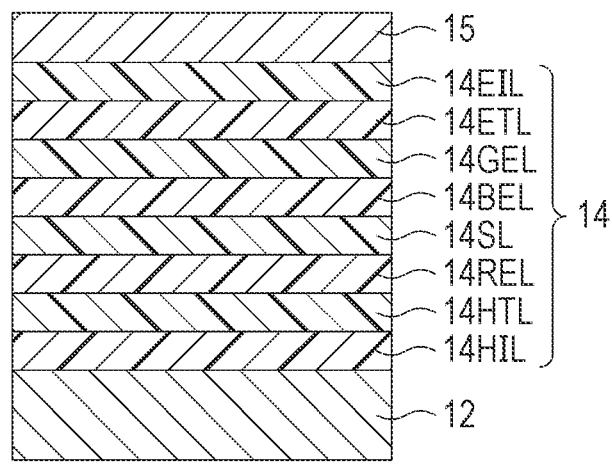
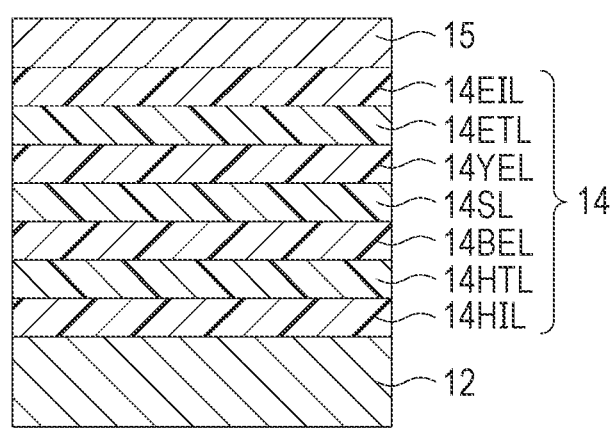

FIG. 6
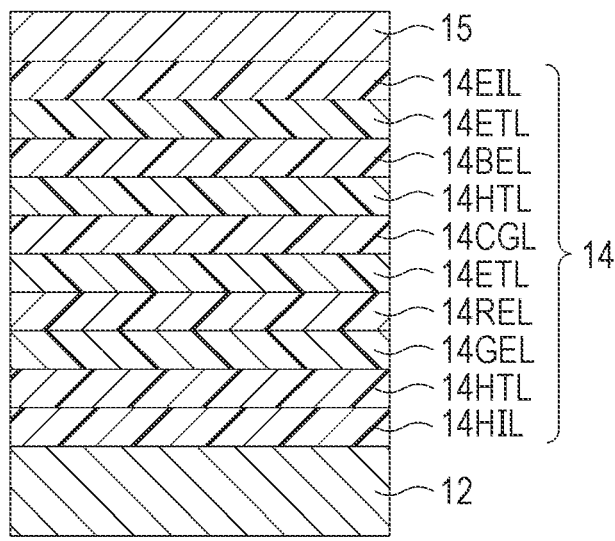
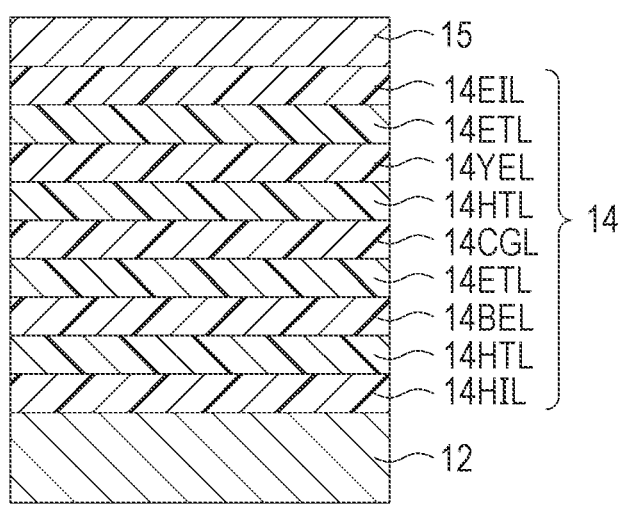

FIG. 27
A
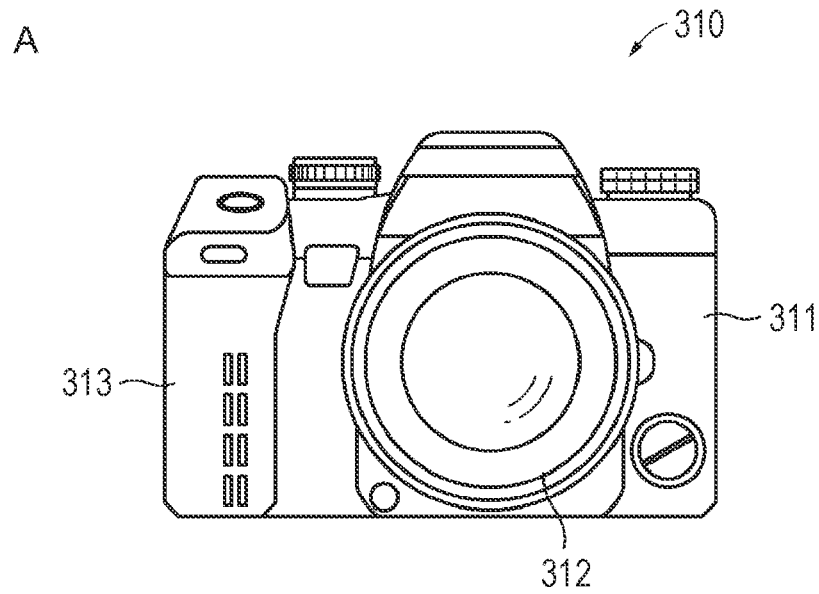
B
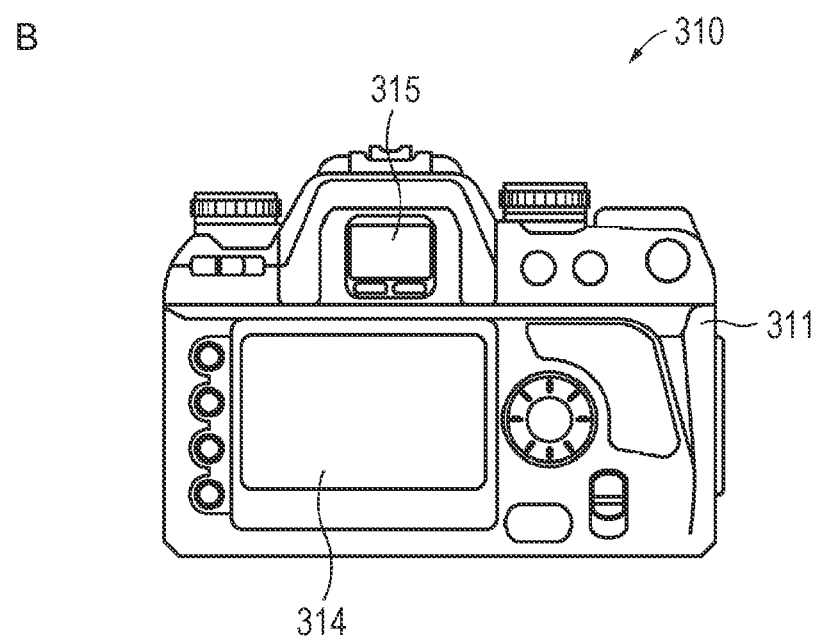

DISPLAY DEVICE AND ELECTRONIC DEVICE

TECHNICAL FIELD

The present disclosure relates to a display device and an electronic device including the display device.

BACKGROUND ART

In recent years, organic electroluminescence (EL) display devices (hereinafter simply referred to as a "display device") have become widespread. In this display device, it is proposed to provide a resonator structure (cavity structure) in order to improve light extraction efficiency.

For example, Patent Document 2 (see, for example, paragraph 0067) discloses a resonator structure in which a protective layer is provided between a cathode electrode and a semi-transmissive plate (semi-transmissive reflective layer), and the film thickness of the protective layer (optical adjustment layer) is changed for each emission color.

CITATION LIST

Patent Document

Patent Document 1: Japanese Patent Application Laid-Open No. 2016-143585

SUMMARY OF THE INVENTION

Problems to be Solved by the Invention

However, in the technique described in Patent Document 1, since the film thickness of the protective layer is changed for each emission color as described above, the uneven shape of the surface on which the semi-transmissive plate (semi-transmissive reflective layer) is formed becomes complicated. If the uneven shape is complicated in this way, the number of steps required for processing the protective layer increases, which may cause a decrease in productivity.

An object of the present disclosure is to provide a display device capable of suppressing complication of an uneven shape of a surface on which a semi-transmissive reflective layer is formed, and an electronic device including the display device.

Solutions to Problems

In order to solve the above problem, a first disclosure is a display device including a plurality of first sub-pixels, a plurality of second sub-pixels, and a plurality of third sub-pixels, in which the first sub-pixel includes a first light emitting element that emits first light and third light,
the second sub-pixel includes a second light emitting element that emits second light,
the third sub-pixel includes a third light emitting element that emits first light and third light,
the first light emitting element, the second light emitting element, and the third light emitting element each include a first electrode, an organic layer including a light emitting layer, a second electrode, and a semi-transmissive reflective layer, and a resonator structure is configured by the first electrode and the semi-transmissive reflective layer, and heights of the semi-transmissive reflective layers in the first light emitting element and the third light emitting element are the same.

A second disclosure is an electronic device including the display device of the first disclosure.

BRIEF DESCRIPTION OF DRAWINGS

FIG. 5A is a cross-sectional view illustrating a first example of a configuration of an organic EL layer including a single-layer light-emitting unit. FIG. 5B is a cross-sectional view illustrating a second example of a configuration of the organic EL layer including a single-layer light-emitting unit.

FIG. 6A is a cross-sectional view illustrating a first example of a configuration of an organic EL layer including a two-layer light-emitting unit. FIG. 6B is a cross-sectional view illustrating a second example of a configuration of the organic EL layer including a two-layer light-emitting unit.

FIG. 27A is a front view illustrating an example of an external appearance of a digital still camera. FIG. 27B is a rear view illustrating an example of an external appearance of the digital still camera.

MODE FOR CARRYING OUT THE INVENTION

Figure 1:
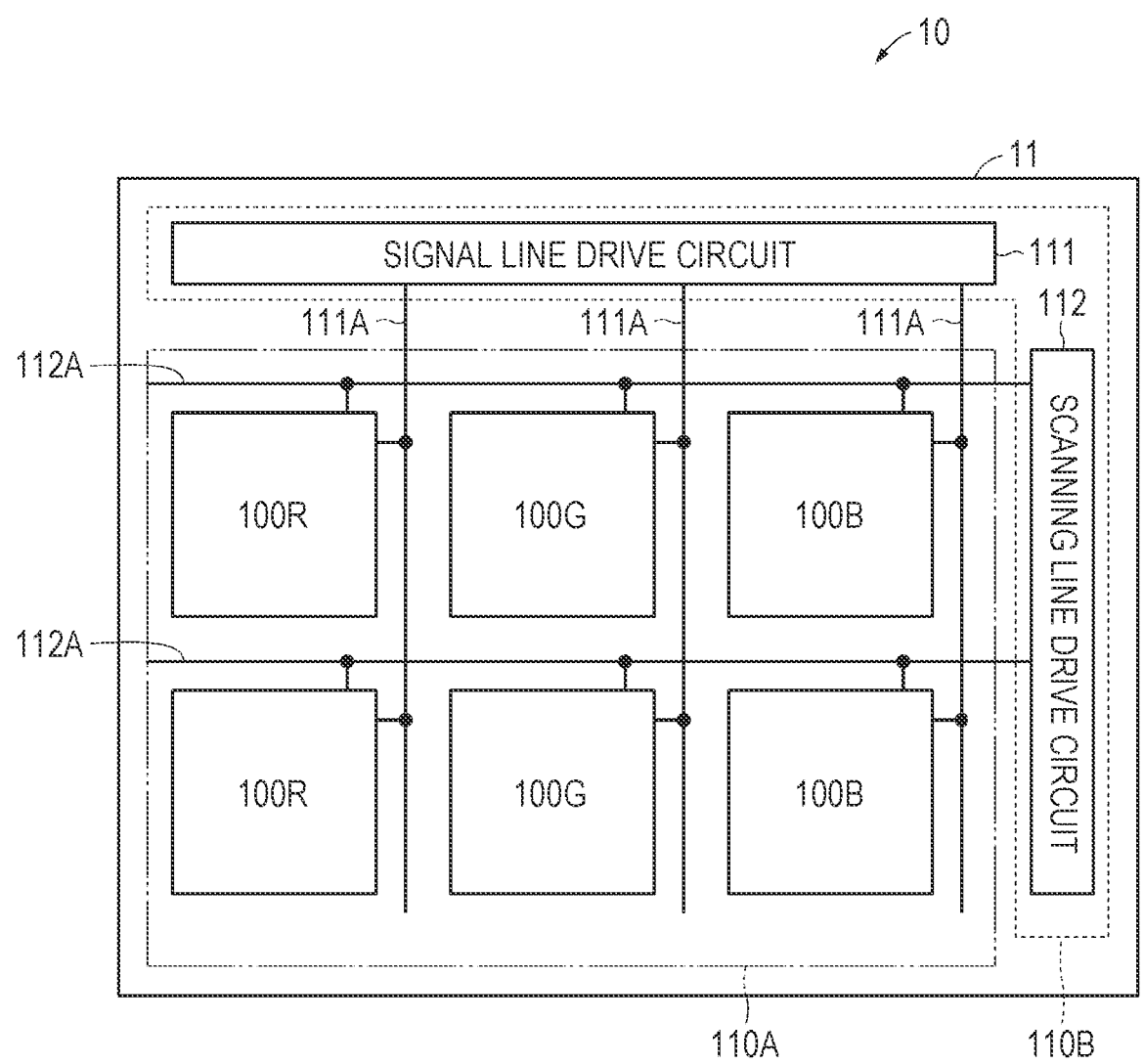
FIG. 1 is a schematic diagram illustrating an example of an overall configuration of a display device according to a first embodiment of the present disclosure.

Embodiments of the present disclosure will be described in the following order. Note that, in all the drawings of the following embodiments, the same or corresponding parts are denoted by the same reference numerals.
1 First Embodiment (Example of Display Device)
2 Second Embodiment (Example of Display Device)
3 Modifications (Modifications of Display Device)
4 Application Example (Example of Electronic Device)
5 Simulation Example 1 First Embodiment

[Configuration of Display Device]

FIG. 1 is a schematic diagram illustrating an example of an overall configuration of a display device 10 according to a first embodiment of the present disclosure. The display device 10 includes a display region 110A and a peripheral region 110B provided on a peripheral edge of the display region 110A. In the display region 110A, a plurality of sub-pixels 100R, a plurality of sub-pixels 100G, and a plurality of sub-pixels 100B are two-dimensionally arranged in a prescribed arrangement pattern such as a matrix.

The sub-pixel 100R emits red light, the sub-pixel 100G emits green light, and the sub-pixel 100B emits blue light. Note that, in the following description, in a case where the sub-pixels 100R, 100G, and 100B are collectively referred to without being particularly distinguished, they are referred to as sub-pixels 100. The red light, the blue light, and the green light are examples of first light, second light, and third light, respectively. The sub-pixel 100R, sub-pixel 100G, and sub-pixel 100B are examples of a first sub-pixel, a second sub-pixel, and a third sub-pixel, respectively. A combination of adjacent sub-pixels 100R, 100G, and 100B constitutes one pixel (pixel). FIG. 1 illustrates an example in which a combination of three sub-pixels 100R, 100G, and 100B arranged in a row direction (horizontal direction) constitutes one pixel, but the arrangement of the sub-pixels 100R, 100G, and 100B is not limited thereto.

In the peripheral region 110B, a signal line drive circuit 111 and a scanning line drive circuit 112, which are drivers for video display, are provided. The signal line drive circuit 111 supplies a signal voltage of a video signal corresponding to luminance information supplied from a signal supply source (not illustrated) to the sub-pixel 100 selected via a signal line 111A. The scanning line drive circuit 112 includes a shift register or the like that sequentially shifts (transfers) a start pulse in synchronization with an input clock pulse. The scanning line drive circuit 112 scans the sub-pixels 100 row by row at the time of writing the video signal to each sub-pixel 100, and sequentially supplies a scanning signal to each scanning line 112A.

The display device 10 is an example of a light emitting device. The display device 10 may be a microdisplay. The display device 10 may be provided in a virtual reality (VR) device, a mixed reality (MR) device, an augmented reality (AR) device, an electronic viewfinder (EVF), a small projector, or the like.

Figure 2:
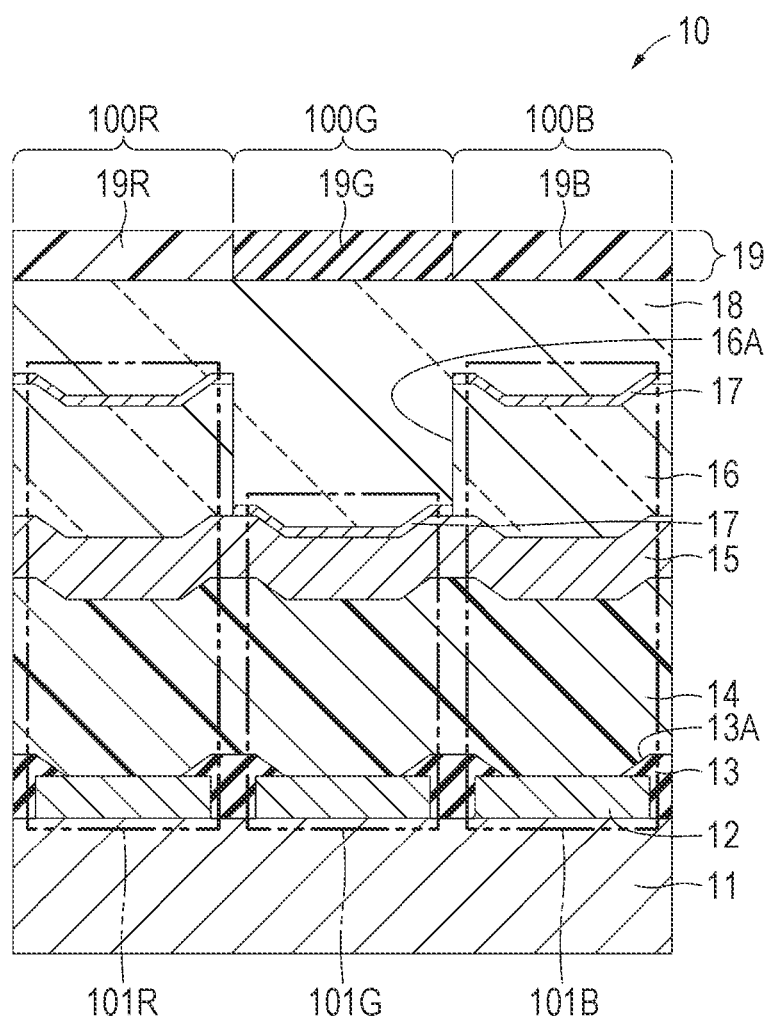
FIG. 2 is a cross-sectional view illustrating an example of a configuration of a display region 110A of the display device according to the first embodiment of the present disclosure.

FIG. 2 is a cross-sectional view illustrating an example of a configuration of the display region 110A of the display device 10 according to the first embodiment of the present disclosure. The display device 10 includes a drive substrate 11, a plurality of first electrodes 12, an insulating layer 13, an organic EL layer 14, a second electrode 15, an optical adjustment layer 16, a semi-transmissive reflective layer 17, a protective layer 18, and a color filter 19.

Figure 3:
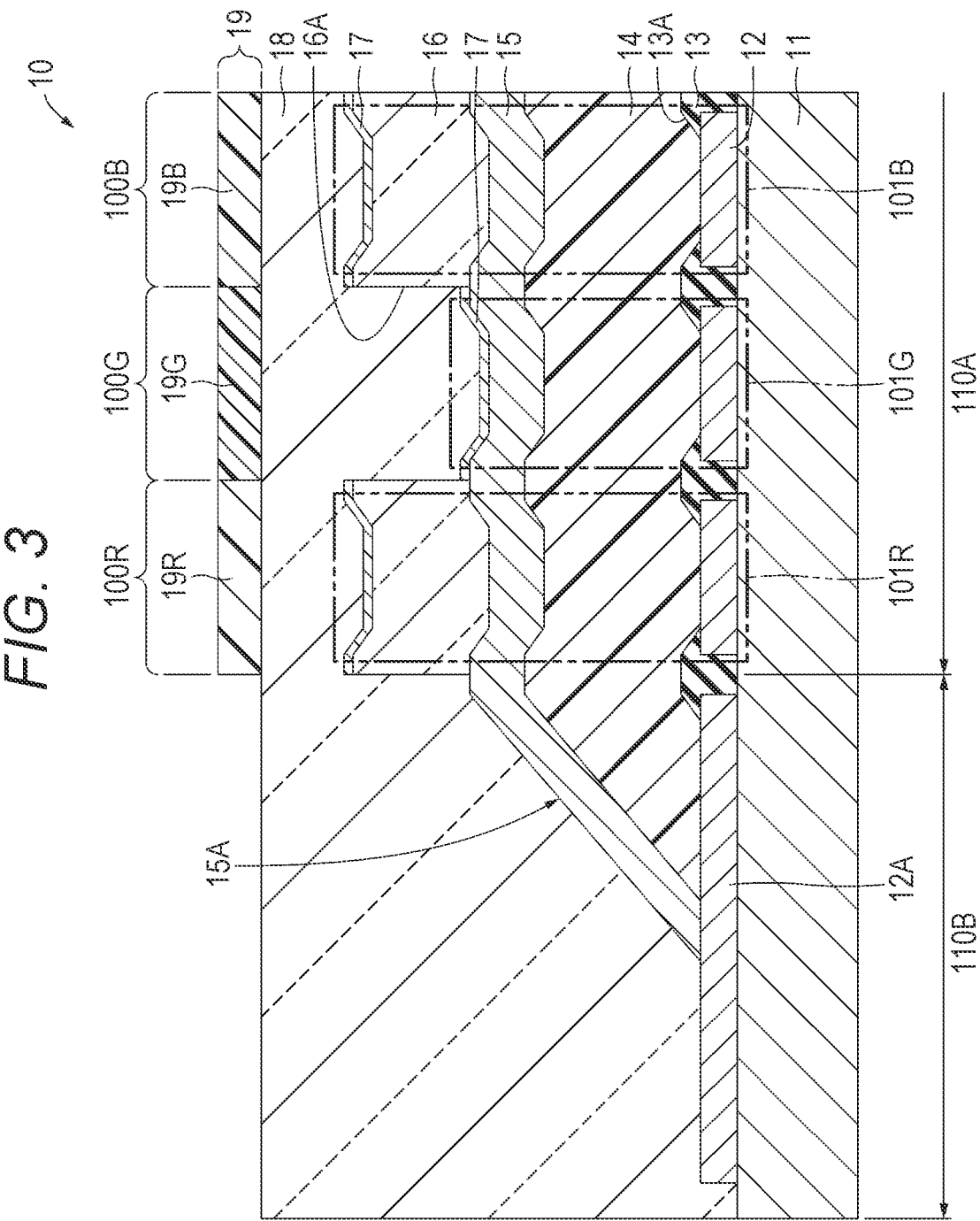
FIG. 3 is a cross-sectional view illustrating an example of a configuration of a peripheral region of the display device according to the first embodiment of the present disclosure.

FIG. 3 is a cross-sectional view illustrating an example of a configuration of the peripheral region 110B of the display device 10. The display device 10 further includes a contact portion 12A in the peripheral region 110B.

The display device 10 is a top emission type display device. The color filter 19 side of the display device 10 is the top side (display surface side), and the drive substrate 11 side of the display device 10 is the bottom side. In the following description, in each layer constituting the display device 10, a surface on the top side of the display device 10 is referred to as a first surface, and a surface on the bottom side of the display device 10 is referred to as a second surface.

(Sub-Pixel)

The sub-pixel 100R includes a light emitting element 101R that emits red light and blue light. The sub-pixel 100G includes a light emitting element 101G that emits green light. The sub-pixel 100B includes a light emitting element 101B that emits red light and blue light. The light emitting element 101R and the light emitting element 101B have the same configuration, and include the first electrode 12, the organic EL layer 14, the second electrode 15, the optical adjustment layer 16, and the semi-transmissive reflective layer 17 in that order. The light emitting element 101G includes the first electrode 12, the organic EL layer 14, the second electrode 15, and the semi-transmissive reflective layer 17 in that order. In the following description, in a case where the light emitting elements 101R, 101G, and 101B are collectively referred to without being particularly distinguished, they are referred to as light emitting elements 101.

Each of the light emitting elements 101R, 101G, and 101B has a resonator structure. Thus, the light extraction efficiency can be improved. The resonator structure is configured by the first electrode 12 and the semi-transmissive reflective layer 17. The resonator structures of the light emitting elements 101R and 101B have the same configuration, and are configured to resonate and emphasize red light and blue light included in white light generated in the organic EL layer 14, and emit the red light and the blue light toward the display surface. The resonator structure of the light emitting element 101G is configured to resonate and emphasize green light contained in white light generated in the organic EL layer 14 and emit the green light toward the display surface.

In the resonator structure of the light emitting elements 101R and 101B, an optical path length between the first electrode 12 and the semi-transmissive reflective layer 17 is set such that red light and blue light resonate and are emphasized. In the resonator structure of the light emitting element 101G, an optical path length between the first electrode 12 and the semi-transmissive reflective layer 17 is set such that green light resonates and is emphasized.

The resonance condition of the resonator structure is expressed by, for example, the following equation.

$$L=(m-\Phi/2\pi)\times\lambda/2$$

L: Optical path length of resonator structure
m: Natural number
Φ: Radians, phase shift amount in first electrode 12 (may include the phase shift amount in the semi-transmissive reflective layer 17)
λ: Wavelength of light emitted from organic EL layer 14

(Drive Substrate)

The drive substrate 11 is a so-called backplane. A first surface of the drive substrate 11 is provided with a drive circuit that drives the plurality of light emitting elements 101, a power supply circuit that supplies power to the plurality of light emitting elements 101, and the like (none of which is illustrated). Further, an insulating layer is provided on the first surface of the drive substrate 11 to cover the drive circuit, the power supply circuit, and the like. Accordingly, the first surface of the drive substrate 11 is flattened.

The substrate body of the drive substrate 11 may be formed by, for example, a semiconductor easily formed with a transistor or the like, or may be formed by glass or resin having low moisture and oxygen permeability. Specifically, the substrate body may be a semiconductor substrate, a glass substrate, a resin substrate, or the like. The semiconductor substrate includes, for example, amorphous silicon, polycrystalline silicon, monocrystalline silicon, or the like. The glass substrate includes, for example, high strain point glass, soda glass, borosilicate glass, forsterite, lead glass, quartz glass, or the like. The resin substrate includes, for example, at least one selected from a group including polymethyl methacrylate, polyvinyl alcohol, polyvinyl phenol, polyethersulfone, polyimide, polycarbonate, polyethylene terephthalate, polyethylene naphthalate, and the like.

(First Electrode)

The plurality of first electrodes 12 is two-dimensionally arranged on the first surface of the drive substrate 11 in an arrangement pattern similar to that of the plurality of sub-pixels 100. The first electrode 12 is an anode. If a voltage is applied between the first electrode 12 and the second electrode 15, holes are injected from the first electrode 12 into the organic EL layer 14. The adjacent first electrodes 12 are electrically separated by the insulating layer 13.

The thickness of each first electrode 12 may be the same. The first electrode 12 may be formed by, for example, a metal layer, or may be formed by a metal layer and a transparent conductive oxide layer. In a case where the first electrode 12 is formed by a metal layer and a transparent conductive oxide layer, the transparent conductive oxide layer is preferably provided on the organic EL layer 14 side from the viewpoint of placing a layer having a high work function adjacent to the organic EL layer 14.

The metal layer also has a function as a reflective layer that reflects light generated in the organic EL layer 14. The metal layer includes, for example, at least one metal element selected from a group including chromium (Cr), gold (Au), platinum (Pt), nickel (Ni), copper (Cu), molybdenum (Mo), titanium (Ti), tantalum (Ta), aluminum (Al), magnesium (Mg), iron (Fe), tungsten (W), and silver (Ag). The metal layer may include the at least one metal element described above as a constituent element of an alloy. Specific examples of the alloy include an aluminum alloy and a silver alloy. Specific examples of the aluminum alloy include AlNd and AlCu, for example.

A base layer (not illustrated) may be provided adjacent to the second surface side of the metal layer. The base layer is for improving the crystal orientation of the metal layer at the time of forming the metal layer. The base layer includes, for example, at least one metal element selected from a group including titanium (Ti) and tantalum (Ta). The base layer may include the at least one metal element described above as a constituent element of an alloy.

The transparent conductive oxide layer includes a transparent conductive oxide. The transparent conductive oxide includes, for example, at least one selected from a group including a transparent conductive oxide including indium (hereinafter referred to as "indium-based transparent conductive oxide"), a transparent conductive oxide including tin (hereinafter referred to as a "tin-based transparent conductive oxide"), and a transparent conductive oxide including zinc (hereinafter referred to as a "zinc-based transparent conductive oxide").

The indium-based transparent conductive oxide includes, for example, indium tin oxide (ITO), indium zinc oxide (IZO), indium gallium oxide (IGO), or indium gallium zinc oxide (IGZO) fluorine-doped indium oxide (IFO). Among these transparent conductive oxides, the indium tin oxide (ITO) is particularly preferable. This is because indium tin oxide (ITO) has a particularly low barrier for hole injection into the organic EL layer 14 in terms of a work function, so that the drive voltage of the display device 10 can be particularly reduced. The tin-based transparent conductive oxide includes, for example, tin oxide, antimony-doped tin oxide (ATO), or fluorine-doped tin oxide (FTO). The zinc-based transparent conductive oxide includes, for example, zinc oxide, aluminum-doped zinc oxide (AZO), boron-doped zinc oxide, or gallium-doped zinc oxide (GZO).

(Insulating Layer)

The insulating layer 13 is provided in a portion between the adjacent first electrodes 12 on the first surface of the drive substrate 11. The insulating layer 13 insulates the adjacent first electrodes 12 from each other. The insulating layer 13 has a plurality of openings 13A. Each of the plurality of openings 13A is provided corresponding to each sub-pixel 100. More specifically, each of the plurality of openings 13A is provided on the first surface (surface on the organic EL layer 14 side) of each first electrode 12. The first electrode 12 and the organic EL layer 14 are in contact with each other through the opening 13A.

The insulating layer 13 may be an organic insulating layer, an inorganic insulating layer, or a stacked body thereof. The organic insulating layer includes, for example, at least one selected from a group including a polyimide-based resin, an acrylic-based resin, a novolac-based resin, and the like. The inorganic insulating layer includes, for example, at least one selected from a group including silicon oxide ($SiO_x$), silicon nitride ($SiN_x$), silicon oxynitride ($SiO_xN_y$), and the like.

(Organic EL Layer)

The organic EL layer 14 is provided between the plurality of first electrodes 12 and the second electrode 15. The organic EL layer 14 is continuously provided over all the sub-pixels 100 (that is, the plurality of sub-pixels 100R, the plurality of sub-pixels 100G, and the plurality of sub-pixels 100B) in the display region 110A, and is a layer common to all the sub-pixels 100 in the display region 110A.

The organic EL layer 14 is an example of an organic layer including a light emitting layer. The organic EL layer 14 is configured to emit white light. The organic EL layer 14 may be the organic EL layer 14 including a single-layer light-emitting unit, may be the organic EL layer (tandem structure) 14 including two layers or two or more layers of light-emitting units, or may be the organic EL layer 14 having a structure other than these.

For example, as illustrated in FIG. 5A, the organic EL layer 14 including the single-layer light-emitting unit has a configuration in which a hole injection layer 14HIL, a hole transport layer 14HTL, a red light emitting layer 14REL, a light emission separation layer 14SL, a blue light emitting layer 14BEL, a green light emitting layer 14GEL, an electron transport layer 14ETL, and an electron injection layer 14EIL are stacked in that order from the first electrode 12 toward the second electrode 15. Alternatively, for example, as illustrated in FIG. 5B, the organic EL layer 14 including the single-layer light-emitting unit has a configuration in which a hole injection layer 14HIL, a hole transport layer 14HTL, a blue light emitting layer 14BEL, a light emission separation layer 14SL, a yellow light emitting layer 14YEL, an electron transport layer 14ETL, and an electron injection layer 14EIL are stacked in that order. Note that the laminating positions of the blue light emitting layer 14BEL and the yellow light emitting layer 14YEL are not limited to the example illustrated in FIG. 5B, and the blue light emitting layer 14BEL and the yellow light emitting layer 14YEL may be interchanged.

For example, as illustrated in FIG. 6A, the organic EL layer 14 including the two-layer light-emitting unit has a configuration in which a hole injection layer 14HIL, a hole transport layer 14HTL, a green light emitting layer 14GEL, a red light emitting layer 14REL, an electron transport layer 14ETL, a charge generation layer 14CGL, a hole transport layer 14HTL, a blue light emitting layer 14BEL, an electron transport layer 14ETL, and an electron injection layer 14EIL are stacked in that order from the first electrode 12 toward the second electrode 15. Alternatively, as illustrated in FIG. 6B, for example, the organic EL layer 14 including the two-layer light-emitting unit has a configuration in which a hole injection layer 14HIL, a hole transport layer 14HTL, a blue light emitting layer 14BEL, an electron transport layer 14ETL, a charge generation layer 14CGL, a hole transport layer 14HTL, a yellow light emitting layer 14YEL, an electron transport layer 14ETL, and an electron injection layer 14EIL are stacked in that order from the first electrode 12 toward the second electrode 15. Note that the laminating positions of the blue light emitting layer 14BEL and the yellow light emitting layer 14YEL are not limited to the example illustrated in FIG. 6B, and the blue light emitting layer 14BEL and the yellow light emitting layer 14YEL may be interchanged.

The hole injection layer 14HIL is for enhancing hole injection efficiency into each light emitting layer and suppressing leakage. The hole transport layer 14HTL is for enhancing hole transport efficiency to each light emitting layer. The electron injection layer 14EIL is for enhancing electron injection efficiency into each light emitting layer. The electron transport layer 14ETL is for enhancing electron transport efficiency to each light emitting layer. The light emission separation layer 14SL is a layer for adjusting injection of carriers into each light emitting layer, and light emission balance of each color is adjusted by injecting electrons or holes into each light emitting layer via the light emission separation layer 14SL. The charge generation layer 14CGL supplies electrons and holes to two light emitting layers sandwiching the charge generation layer 14CGL.

If an electric field is applied to each of the red light emitting layer 14REL, the green light emitting layer 14GEL, the blue light emitting layer 14BEL, and the yellow light emitting layer 14YEL, recombination of holes injected from the first electrode 12 and electrons injected from the second electrode 15 occurs, and red light, green light, blue light, and yellow light are generated.

(Second Electrode)

The second electrode 15 is provided to face the plurality of first electrodes 12. The second electrode 15 is provided continuously over all the sub-pixels 100 in the display region 110A, and serves as a common electrode for all the sub-pixels 100 in the display region 110A. The second electrode 15 is a cathode. If a voltage is applied between the first electrode 12 and the second electrode 15, electrons are injected from the second electrode 15 into the organic EL layer 14. The second electrode 15 is a transparent electrode having transparency to light generated in the organic EL layer 14. The second electrode 15 is preferably formed by a material having as high transparency as possible and a small work function in order to enhance luminous efficiency.

The second electrode 15 is formed by, for example, at least one of a metal layer or a transparent conductive oxide layer. More specifically, the second electrode 15 is formed by a single layer film of a metal layer or a transparent conductive oxide layer, or a stacked film of a metal layer and a transparent conductive oxide layer. In a case where the second electrode 15 is formed by a stacked film, the metal layer may be provided on the organic EL layer 14 side, or the transparent conductive oxide layer may be provided on the organic EL layer 14 side, but from the viewpoint of placing a layer having a low work function adjacent to the organic EL layer 14, the metal layer is preferably provided on the organic EL layer 14 side.

The second electrode 15 adjusts the optical path length between the first electrode 12 and the semi-transmissive reflective layer 17 in the sub-pixel 100G. The thickness of the second electrode 15 is set such that green light corresponding to the color of the sub-pixel 100G resonates and is emphasized in the resonator structure. Although FIG. 2 illustrates an example in which the thickness of the second electrode 15 in the sub-pixel 100G is the same as the thickness of the second electrode 15 in the sub-pixels 100R and 100B, the thickness of the second electrode 15 in the sub-pixel 100G may be thinner than the thickness of the second electrode 15 in the sub-pixels 100R and 100B.

The metal layer includes, for example, at least one metal element selected from a group including magnesium (Mg), aluminum (Al), silver (Ag), calcium (Ca), and sodium (Na). The metal layer may include the at least one metal element described above as a constituent element of an alloy. Specific examples of the alloy include an MgAg alloy, an MgAl alloy, an AlLi alloy, and the like. The transparent conductive oxide layer includes a transparent conductive oxide. As the transparent conductive oxide, a material similar to the transparent conductive oxide of the first electrode 12 described above can be exemplified.

(Contact Portion)

The contact portion 12A is an auxiliary electrode that connects the second electrode 15 and a base wiring (not illustrated). The base wiring is provided on the first surface of the drive substrate 11, for example. A peripheral edge portion 15A of the second electrode 15 extends to the peripheral region 110B. The first surface of the contact portion 12A is connected to the peripheral edge portion 15A of the second electrode 15. On the other hand, the second surface of the contact portion 12A is connected to the base wiring via a contact plug (not illustrated). In the present specification, the peripheral edge portion 15A of the second electrode 15 refers to a region having a predetermined width from the peripheral edge of the second electrode 15 toward the inside.

The contact portion 12A may have a closed loop shape surrounding the rectangular display region 110A in plan view. FIG. 1 illustrates an example in which the peripheral region 110B has an inverted L shape in plan view, but the peripheral region 110B may have a closed loop shape in plan view. Specific examples of the closed loop shape of the contact portion 12A and the peripheral region 110B include a rectangular ring shape and the like.

The contact portion 12A is formed by at least one of a metal layer or a metal oxide layer. More specifically, the contact portion 12A is formed by a single layer film of a metal layer or a metal oxide layer, or a stacked film of a metal layer and a metal oxide layer. In a case where the contact portion 12A is formed by a stacked film, the metal oxide layer may be provided on the second electrode 15 side, or the metal layer may be provided on the second electrode 15 side.

As a constituent material of the contact portion 12A, a material similar to that of the first electrode 12 can be exemplified. Specifically, as the constituent materials of the metal layer and the metal oxide layer of the contact portion 12A, the materials similar to those of the metal layer and the metal oxide layer of the first electrode 12 can be exemplified, respectively.

The contact portion 12A may have the same configuration as the first electrode 12. The metal layer and the metal oxide layer of the contact portion 12A may be formed by the same material as the metal layer and the metal oxide layer of the first electrode 12, respectively.

(Optical Adjustment Layer)

The optical adjustment layer 16 has an opening 16A in each of portions corresponding to the plurality of sub-pixels 100G. The sub-pixel 100R and the sub-pixel 100B include the optical adjustment layer 16 between the second electrode 15 and the semi-transmissive reflective layer 17. Accordingly, in the sub-pixel 100R and the sub-pixel 100B, the second electrode 15 and the semi-transmissive reflective layer 17 are separated from each other. On the other hand, the sub-pixel 100G does not include the optical adjustment layer 16 between the second electrode 15 and the semi-transmissive reflective layer 17. Accordingly, in the sub-pixel 100G, the second electrode 15 and the semi-transmissive reflective layer 17 are adjacent to each other.

The optical adjustment layer 16 has transparency to light generated in the organic EL layer 14. The thicknesses of the optical adjustment layers 16 in the sub-pixels 100R and 100B are the same. Accordingly, the heights of the first surfaces of the optical adjustment layers 16 in the sub-pixels 100R and 100B are the same. The optical adjustment layer 16 adjusts the optical path length between the first electrode 12 and the semi-transmissive reflective layer 17 in each of the sub-pixels 100R and 100B. The thickness of the optical adjustment layer 16 in the sub-pixels 100R and 100B is set such that red light corresponding to the color of the sub-pixel 100R and blue light corresponding to the color of the sub-pixel 100B resonate and are emphasized in the resonator structure.

The optical adjustment layer 16 may be an organic layer, an inorganic layer, or a stacked body thereof. The organic layer includes, for example, at least one selected from a group including a polyimide-based resin, an acrylic-based resin, a novolac-based resin, a para-xylylene-based compound such as parylene (registered trademark), a polymer of a monomer material used in organic EL, and the like. The inorganic layer includes, for example, at least one selected from a group including silicon oxide ($SiO_x$), silicon nitride ($SiN_x$), silicon oxynitride ($SiO_xN_y$), and the like.

(Semi-Transmissive Reflective Layer)

Figure 4:
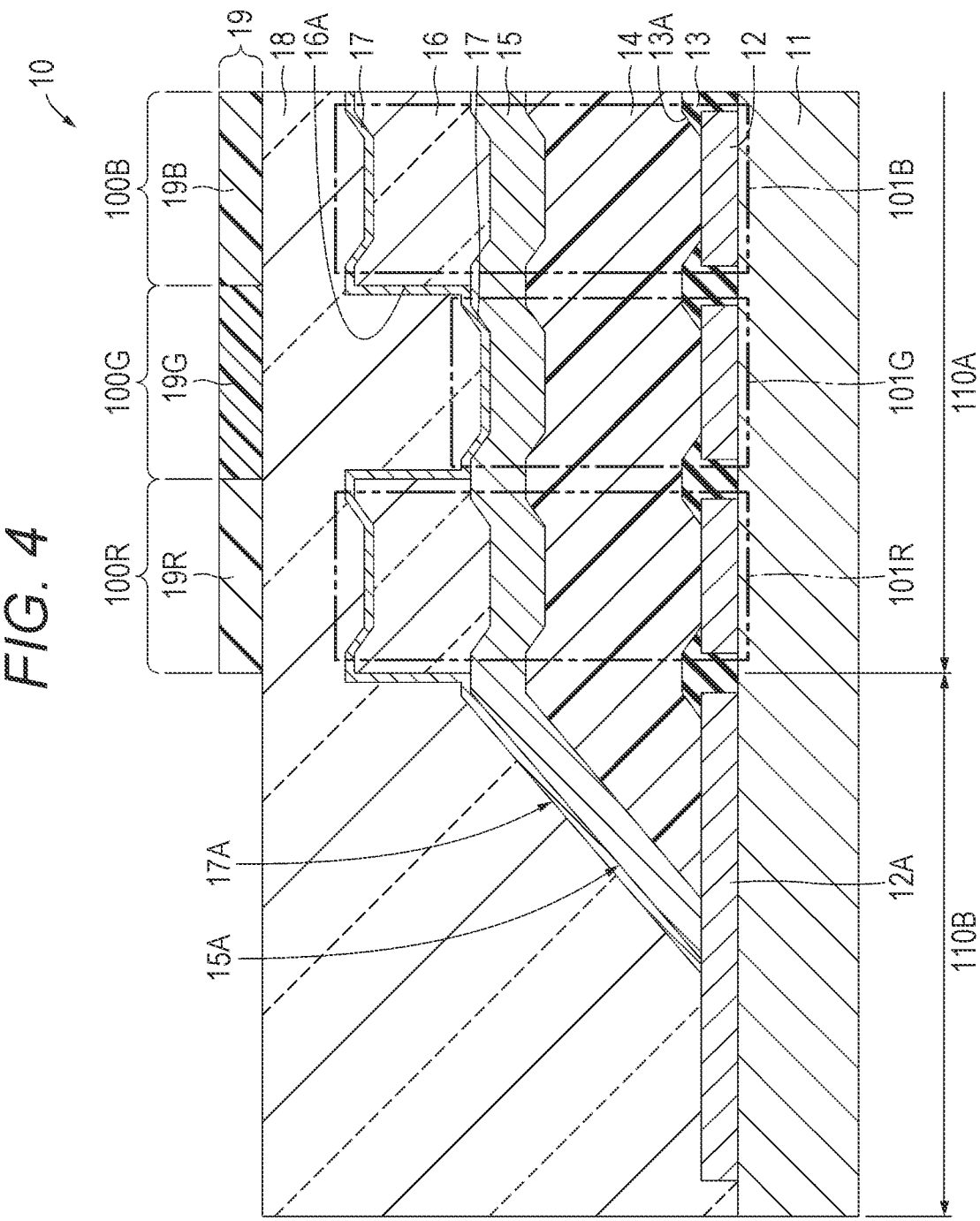
FIG. 4 is a cross-sectional view illustrating another example of a configuration of the peripheral region of the display device according to the first embodiment of the present disclosure.

The semi-transmissive reflective layer 17 is provided on the first surface of the optical adjustment layer 16 in the sub-pixels 100R and 100B, and is provided on the first surface of the second electrode 15 in the sub-pixel 100G. The heights of the semi-transmissive reflective layers 17 in the sub-pixels 100R and 100B are the same. Accordingly, complication of the uneven shape of the surface on which the semi-transmissive reflective layer 17 is formed can be suppressed. The semi-transmissive reflective layer 17 transmits part of the light generated in the organic EL layer 14 and reflects the rest. FIG. 2 illustrates an example in which the semi-transmissive reflective layer 17 is divided between the sub-pixel 100R and the sub-pixel 100G and between the sub-pixel 100G and the sub-pixel 100B. However, as illustrated in FIG. 4, the semi-transmissive reflective layer 17 may be connected between the sub-pixel 100R and the sub-pixel 100G and between the sub-pixel 100G and the sub-pixel 100B. That is, the semi-transmissive reflective layer 17 may be connected between the sub-pixels 100 in the display region 110A. In this case, the resistance of the second electrode 15 can be reduced.

Further, as illustrated in FIG. 4, a peripheral edge portion 17A of the semi-transmissive reflective layer 17 may extend to the peripheral region 110B. In this case, the peripheral edge portion 17A of the semi-transmissive reflective layer 17 may be directly connected to the first surface of the contact portion 12A, or the peripheral edge portion 17A of the semi-transmissive reflective layer 17 may be connected to the first surface of the contact portion 12A to sandwich the peripheral edge portion 15A of the second electrode 15 therebetween.

The semi-transmissive reflective layer 17 is, for example, a metal layer. The metal layer includes, for example, at least one metal element selected from a group including magnesium (Mg), aluminum (Al), silver (Ag), calcium (Ca), gold (Au), copper (Cu), tin (Sn), zinc (Zn), sodium (Na), and the like. The metal layer may include the at least one metal element described above as a constituent element of an alloy. Specific examples of the alloy include an MgAg alloy, an MgAl alloy, an AlLi alloy, and the like.

The semi-transmissive reflective layer 17 may be a multilayer film in which a first metal layer and a second metal layer are stacked. The first metal layer of the first metal layer and the second metal layer may be provided on the organic EL layer 14 side. The first metal layer includes, for example, at least one selected from a group including calcium (Ca), barium (Ba), lithium (Li), cesium (Cs), indium (In), magnesium (Mg), and silver (Ag). The first metal layer may include the at least one metal element described above as a constituent element of an alloy. The second metal layer includes, for example, at least one selected from a group including magnesium (Mg) and silver (Ag). The second metal layer may include the at least one metal element described above as a constituent element of an alloy.

The semi-transmissive reflective layer 17 may be a transparent material layer containing a transparent material. The transparent material layer may have a refractive index different from that of the optical adjustment layer 16 and the second electrode 15 which are lower layers of the transparent material layer. The transparent material layer may have a refractive index different from that of the protective layer 18 which is an upper layer of the transparent material layer.

A refractive index difference $\Delta n_1$ between the transparent material layer and the optical adjustment layer 16 and a refractive index difference $\Delta n_2$ between the transparent material layer and the second electrode 15 are preferably 0.1 or more from the viewpoint of improving the reflectance. Here, the refractive index difference $\Delta n_1$ represents at least one of a refractive index difference at a peak wavelength of blue light emitted from the sub-pixel 100B or a refractive index difference at a peak wavelength of red light emitted from the sub-pixel 100R. Furthermore, a refractive index difference $\Delta n_2$ between the transparent material layer and the second electrode 15 represents a refractive index difference at a peak wavelength of green light emitted from the sub-pixel 100G.

A refractive index difference $\Delta n_3$ between the transparent material layer and the protective layer 18 is preferably 0.1 or more from the viewpoint of improving the reflectance. Here, the refractive index difference $\Delta n_3$ between the transparent material layer and the protective layer 18 represents at least one of a refractive index difference at a peak wavelength of blue light emitted from the sub-pixel 100B, a refractive index difference at a peak wavelength of green light emitted from the sub-pixel 100G, or a refractive index difference at a peak wavelength of red light emitted from the sub-pixel 100R.

The transparent material includes a transparent conductive oxide or a dielectric. As the transparent conductive oxide, a material similar to the transparent conductive oxide of the first electrode 12 described above can be exemplified. The dielectric includes, for example, at least one selected from a group including an oxide, a nitride, a sulfide, a carbide, a fluoride, and the like.

(Protective Layer)

The protective layer 18 is provided on the first surface of the semi-transmissive reflective layer 17 and covers the plurality of light emitting elements 101. The protective layer 18 shields the light emitting element 101 from the outside air, and suppresses moisture infiltration into the light emitting element 101 from the external environment. Furthermore, in a case where the semi-transmissive reflective layer 17 is formed by a metal layer, the protective layer 18 may have a function of suppressing oxidation of the metal layer.

The protective layer 18 includes, for example, an inorganic material or a polymer resin having low hygroscopicity. The protective layer 18 may have a single layer structure or a multilayer structure. In a case where the thickness of the protective layer 18 is increased, it is preferable to have a multilayer structure. This is for alleviating the internal stress in the protective layer 18. The inorganic material includes, for example, at least one selected from a group including silicon oxide ($SiO_x$), silicon nitride ($SiN_x$), silicon oxynitride ($SiO_xN_y$), titanium oxide ($TiO_x$), aluminum oxide ($AlO_x$), and the like. The polymer resin includes, for example, at least one selected from a group including a thermosetting resin, an ultraviolet curable resin, and the like.

(Color Filter)

The color filter 19 is provided on the first surface of the protective layer 18. The color filter 19 is, for example, an on-chip color filter (OCCF). The color filter 19 includes a red filter 19R, a green filter 19G, and a blue filter 19B. The red filter 19R is a filter having the same color as the red light emitted from the light emitting element 101R. The green filter 19G is a filter having the same color as the green light emitted from the light emitting element 101G. The blue filter 19B is a filter having the same color as the blue light emitted from the light emitting element 101B.

The red filter 19R, the green filter 19G, and the blue filter 19B are provided to face the light emitting element 101R, the light emitting element 101G, and the light emitting element 101B, respectively. The red filter 19R and the light emitting element 101R constitute the sub-pixel 100R, the green filter 19G and the light emitting element 101G constitute the sub-pixel 100G, and the blue filter 19B and the light emitting element 101B constitute the sub-pixel 100B.

The red light emitted from the light emitting element 101R passes through the red filter 19R, whereas the blue light emitted from the light emitting element 101R is blocked by the red filter 19R. Accordingly, red light having high color purity is emitted from the sub-pixel 100R.

The green light emitted from the light emitting element 101G passes through the green filter 19G, whereas the visible light other than the green light emitted from the light emitting element 101G is blocked by the green filter 19G. Accordingly, green light having high color purity is emitted from the sub-pixel 100G.

The blue light emitted from the light emitting element 101B passes through the blue filter 19B, whereas the red light emitted from the light emitting element 101B is blocked by the blue filter 19B. Accordingly, blue light having high color purity is emitted from the sub-pixel 100B.

Furthermore, a light shielding layer may be provided between the color filters 19R, 19G, and 19B, that is, in a region between the sub-pixels 100.

[Method for Manufacturing Display Device]

Hereinafter, an example of a method for manufacturing the display device 10 according to the first embodiment of the present disclosure will be described.

First, a metal layer and a transparent conductive oxide layer are sequentially formed on the first surface of the drive substrate 11 by, for example, a sputtering method, and then the metal layer and the transparent conductive oxide layer are patterned using, for example, a photolithography technique and an etching technique. Accordingly, the plurality of first electrodes 12 is formed.

Next, the insulating layer 13 is formed on the first surface of the drive substrate 11 to cover the plurality of first electrodes 12 by, for example, a chemical vapor deposition (CVD) method. Next, the opening 13A is formed in a portion of the insulating layer 13 located on the first surface of each first electrode 12 by, for example, the photolithography technique and the dry etching technique.

Next, the hole transport layer, the red light emitting layer, the light emission separation layer, the blue light emitting layer, the green light emitting layer, the electron transport layer, and the electron injection layer are stacked in that order on the first surface of the plurality of first electrodes 12 and the first surface of the insulating layer 13 by, for example, a vapor deposition method, thereby forming the organic EL layer 14. Next, the second electrode 15 is formed on the first surface of the organic EL layer 14 by, for example, the vapor deposition method or the sputtering method.

Next, the optical adjustment layer 16 is formed on the first surface of the second electrode 15 by, for example, a CVD method. Next, the opening 16A is formed in a portion of the optical adjustment layer 16 corresponding to each sub-pixel 100G by, for example, the photolithography technique and the dry etching technique. Next, the semi-transmissive reflective layer 17 is formed on the first surface of the second electrode 15 and the first surface of the optical adjustment layer 16 by, for example, the vapor deposition method or the sputtering method.

Next, the protective layer 18 is formed on the first surface of the semi-transmissive reflective layer 17 to fill the opening 16A by, for example, the CVD method or the vapor deposition method, and then the color filter 19 is formed on the first surface of the protective layer 18 by, for example, photolithography. As described above, the display device 10 illustrated in FIG. 2 is obtained.

[Operation and Effect]

As described above, in the display device 10 according to the first embodiment, the sub-pixel 100R and the sub-pixel 100B include the optical adjustment layer 16 between the second electrode 15 and the semi-transmissive reflective layer 17, and the thicknesses of the optical adjustment layers 16 in the sub-pixel 100R and the sub-pixel 100B are the same. Accordingly, the heights of the semi-transmissive reflective layers 17 in the sub-pixel 100R and the sub-pixel 100B can be made same. Therefore, as compared with a display device in which the thickness of the optical adjustment layer is changed for each color of the sub-pixel (see, for example, Patent Document 1), complication of the uneven shape of the surface on which the semi-transmissive reflective layer 17 is formed (that is, the first surface of the optical adjustment layer 16) can be suppressed. Therefore, an increase in the number of steps required for processing the optical adjustment layer 16 can be suppressed, thereby suppressing a decrease in productivity.

In addition, since each of the plurality of light emitting elements 101R, 101G, and 101B has a resonator structure, the light extraction efficiency can be improved. Therefore, luminous efficiency can be improved. In addition, the color gamut can be expanded.

The method for manufacturing the display device 10 according to the first embodiment only further includes a step of forming the optical adjustment layer 16, a step of etching the optical adjustment layer 16 (a step of etching only a portion of the optical adjustment layer 16 corresponding to the sub-pixel 100G), and a step of forming the semi-transmissive reflective layer 17, as compared with the conventional method for manufacturing a display device. Therefore, since only three steps are added to the conventional method for manufacturing a display device, it is possible to manufacture the display device 10 having a resonator structure in each sub-pixel 100 while suppressing an increase in manufacturing steps. That is, the display device 10 can be manufactured while suppressing an increase in manufacturing cost. Here, it is assumed that the conventional display device means a display device in which each sub-pixel is not provided with a resonator structure.

2 Second Embodiment

[Configuration of Display Device]

Figure 7:
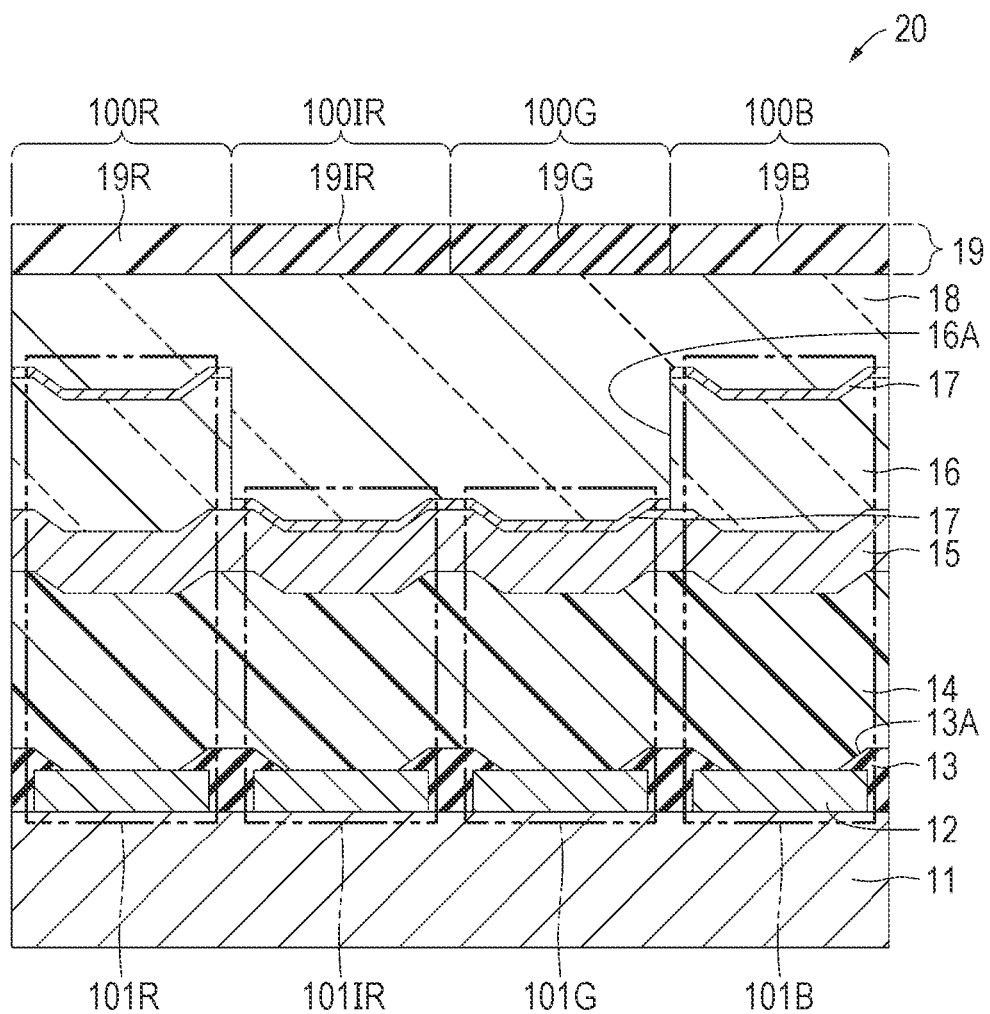
FIG. 7 is a cross-sectional view illustrating an example of a configuration of a display device according to a second embodiment of the present disclosure.

FIG. 7 is a cross-sectional view illustrating an example of a configuration of a display device 20 according to a second embodiment of the present disclosure. The display device 20 is different from the display device 10 according to the first embodiment in that it further includes a plurality of sub-pixels 100IR in the display region 110A.

(Sub-Pixel)

The sub-pixel 100IR includes a light emitting element 101IR that emits green light and infrared light (IR). The sub-pixel 100IR has a layer configuration similar to that of the sub-pixel 100G. That is, the sub-pixel 100IR includes the first electrode 12, the organic EL layer 14, the second electrode 15, and the semi-transmissive reflective layer 17 in that order. The infrared light is an example of fourth light. The sub-pixel 100IR is an example of a fourth sub-pixel. In the second embodiment, the sub-pixel 100G includes a light emitting element 101G that emits green light and infrared light (IR).

The sub-pixel 100IR has a resonator structure. The resonator structure of the sub-pixel 100IR is configured by the first electrode 12 and the semi-transmissive reflective layer 17. The resonator structure of the sub-pixels 100G and 100IR is configured to resonate and emphasize green light and infrared light contained in light generated in the organic EL layer 14 and emit the green light and the infrared light toward the display surface. In the second embodiment, it is assumed that light generated in the organic EL layer 14 includes at least white light and infrared light. In the resonator structure of the sub-pixels 100G and 100IR, the optical path length between the first electrode 12 and the semi-transmissive reflective layer 17 is set such that green light and infrared light resonate and are emphasized.

(Organic EL Layer)

The organic EL layer 14 is continuously provided over all the sub-pixels 100 (that is, the plurality of sub-pixels 100R, the plurality of sub-pixels 100G, the plurality of sub-pixels 100B, and the plurality of sub-pixels 100IR) in the display region 110A, and is a layer common to all the sub-pixels 100 in the display region 110A.

(Second Electrode)

The second electrode 15 adjusts the optical path length between the first electrode 12 and the semi-transmissive reflective layer 17 in the sub-pixels 100G and 100IR. The thickness of the optical adjustment layer 16 of the sub-pixel 100G is set such that green light corresponding to the sub-pixel 100G and infrared light corresponding to the sub-pixel 100IR resonate and are emphasized in the resonator structure. Although FIG. 7 illustrates an example in which the thickness of the second electrode 15 in the sub-pixels 100G and 100IR is the same as the thickness of the second electrode 15 in the sub-pixels 100R and 100B, the thickness of the second electrode 15 in the sub-pixels 100G and 100IR may be thinner than the thickness of the second electrode 15 in the sub-pixels 100R and 100B.

(Optical Adjustment Layer)

The optical adjustment layer 16 has an opening 16A in each of portions corresponding to the plurality of sub-pixels 100G and the plurality of sub-pixels 100IR, respectively. The sub-pixel 100G and the sub-pixel 100IR do not include the optical adjustment layer 16 between the second electrode 15 and the semi-transmissive reflective layer 17. Accordingly, in the sub-pixel 100G and the sub-pixel 100IR, the second electrode 15 and the semi-transmissive reflective layer 17 are adjacent to each other. FIG. 7 illustrates an example in which the semi-transmissive reflective layer 17 is divided between the sub-pixel 100R and the sub-pixel 100IR and between the sub-pixel 100G and the sub-pixel 100B. However, the semi-transmissive reflective layer 17 may be connected between the sub-pixel 100R and the sub-pixel 100IR and between the sub-pixel 100G and the sub-pixel 100B. That is, the semi-transmissive reflective layer 17 may be connected between the sub-pixels 100 in the display region 110A. In this case, the resistance of the second electrode 15 can be reduced.

(Semi-Transmissive Reflective Layer)

The semi-transmissive reflective layer 17 is provided on the first surface of the optical adjustment layer 16 in the sub-pixels 100R and 100B, and is provided on the first surface of the second electrode 15 in the sub-pixels 100G and 100IR. The heights of the semi-transmissive reflective layers 17 in the sub-pixels 100R and 100B are the same. In addition, the heights of the semi-transmissive reflective layers 17 in the sub-pixels 100G and 100IR are the same. Accordingly, complication of the uneven shape of the surface on which the semi-transmissive reflective layer 17 is formed can be suppressed.

FIG. 7 illustrates an example in which the semi-transmissive reflective layer 17 is divided between the sub-pixel 100R and the sub-pixel 100IR and between the sub-pixel 100G and the sub-pixel 100B. However, the semi-transmissive reflective layer 17 may be connected between the sub-pixel 100R and the sub-pixel 100IR and between the sub-pixel 100G and the sub-pixel 100B. That is, the semi-transmissive reflective layer 17 may be connected between the sub-pixels 100 in the display region 110A. In this case, the resistance of the second electrode 15 can be reduced.

(Color Filter)

The color filter 19 includes a red filter 19R, a green filter 19G, a blue filter 19B, and an infrared light transmission filter 19IR. Each of the red filter 19R, the green filter 19G, and the blue filter 19B is as described in the first embodiment. The infrared light transmission filter 19IR is provided to face the light emitting element 101IR. The infrared light transmission filter 19IR and the light emitting element 101IR constitute the sub-pixel 100IR. The infrared light transmission filter 19IR is configured to transmit infrared light but block visible light having a lower wavelength range than infrared light. Note that the color filter 19 may not include the infrared light transmission filter 19IR.

The green light included in the light emitted from the light emitting element 101G passes through the green filter 19G, whereas the infrared light included in the light emitted from the light emitting element 101IR is blocked by the green filter 19G. Accordingly, green light having high color purity is emitted from the sub-pixel 100G.

The infrared light included in the light emitted from the light emitting element 101IR passes through the infrared light transmission filter 19IR, whereas the green light included in the light emitted from the light emitting element 101IR is blocked by the infrared light transmission filter 19IR. Accordingly, components other than infrared light are reduced, and infrared light having high purity is emitted from the sub-pixel 100IR.

[Operation and Effect]

As described above, in the display device 20 according to the second embodiment, the sub-pixel 100G and the sub-pixel 100IR do not include the optical adjustment layer 16 between the second electrode 15 and the semi-transmissive reflective layer 17. Accordingly, in the sub-pixel 100G and the sub-pixel 100IR, the semi-transmissive reflective layer 17 is provided adjacent to the second electrode 15 and has the same height. Therefore, even in a case where the four types of sub-pixels 100 including the sub-pixels 100R, 100G, and 100B and the sub-pixel 100IR are provided, complication of the uneven shape of the surface on which the semi-transmissive reflective layer 17 is formed (that is, the first surface of the optical adjustment layer 16) can be suppressed. Therefore, an increase in the number of steps required for processing the optical adjustment layer 16 can be suppressed, thereby suppressing a decrease in productivity.

3 Modifications

[Modification 1]

Figure 8:
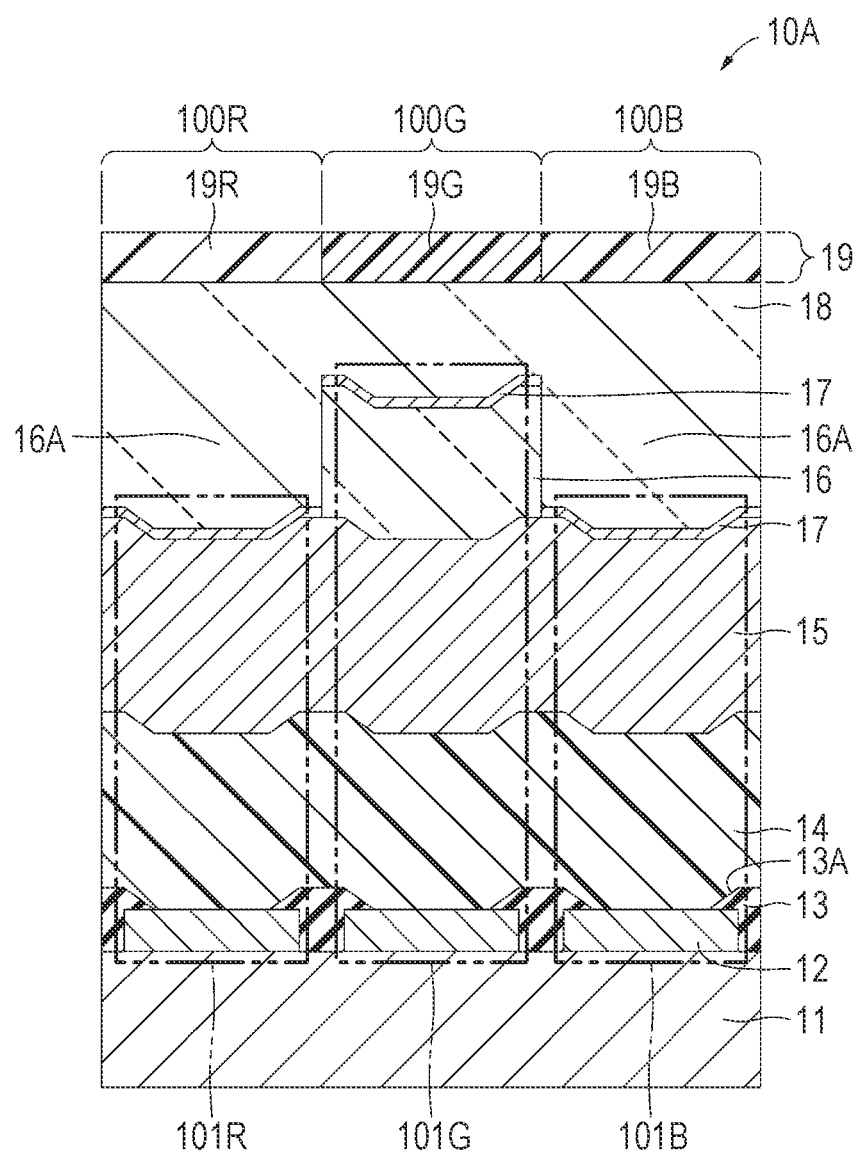
FIG. 8 is a cross-sectional view illustrating an example of a configuration of a display device according to Modification 1.

FIG. 8 is a cross-sectional view illustrating an example of a configuration of a display device 10A according to Modification 1. In the display device 10 according to the first embodiment, an example in which the optical adjustment layer 16 has the opening 16A in each of the portions corresponding to the plurality of sub-pixels 100G (see FIG. 2) has been described. However, in the display device 10A according to Modification 1, an example in which the optical adjustment layer 16 has the opening 16A in each of the portions corresponding to the plurality of sub-pixels 100R and 100B will be described.

(Sub-Pixel)

The sub-pixel 100R and the sub-pixel 100B do not include the optical adjustment layer 16 between the second electrode 15 and the semi-transmissive reflective layer 17. Accordingly, in the sub-pixel 100R and the sub-pixel 100B, the second electrode 15 and the semi-transmissive reflective layer 17 are adjacent to each other and have the same height.

On the other hand, the sub-pixel 100G includes the optical adjustment layer 16 between the second electrode 15 and the semi-transmissive reflective layer 17. Accordingly, in the sub-pixel 100G, the second electrode 15 and the semi-transmissive reflective layer 17 are separated from each other.

(Optical Adjustment Layer)

The optical adjustment layer 16 adjusts the optical path length between the first electrode 12 and the semi-transmissive reflective layer 17 in the sub-pixel 100G. The thickness of the optical adjustment layer 16 of the sub-pixel 100G is set such that green light corresponding to the color of the sub-pixel 100G resonates and is emphasized in the resonator structure.

(Second Electrode)

The second electrode 15 adjusts the optical path length between the first electrode 12 and the semi-transmissive reflective layer 17 in each of the sub-pixels 100R and 100B. The thickness of the second electrode 15 in the sub-pixels 100R and 100B is set such that red light corresponding to the color of the sub-pixel 100R and blue light corresponding to the color of the sub-pixel 100B resonate and are emphasized in the resonator structure.

[Modification 2]

Figure 9:
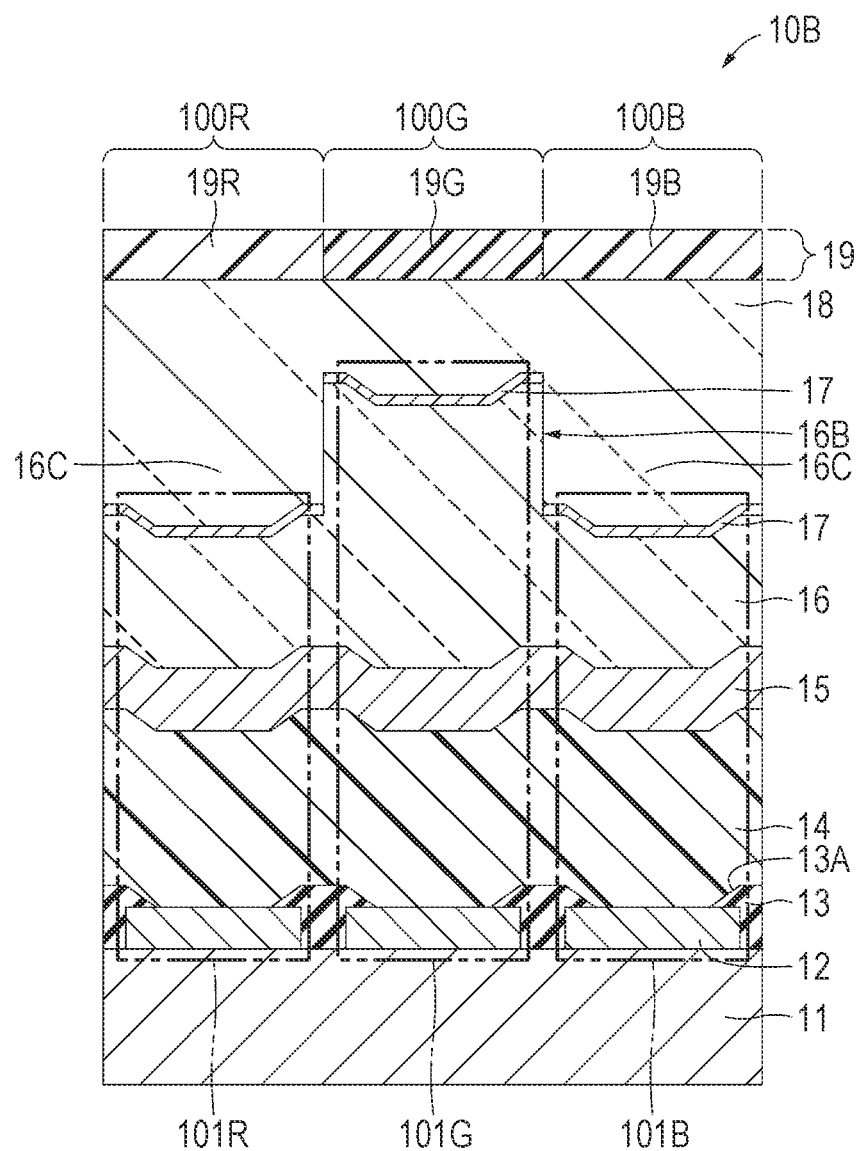
FIG. 9 is a cross-sectional view illustrating an example of a configuration of a display device according to Modification 2.

FIG. 9 is a cross-sectional view illustrating an example of a configuration of a display device 10B according to Modification 2. In the display device 10 according to the first embodiment, an example in which the optical adjustment layer 16 has the opening 16A in each of the portions corresponding to the plurality of sub-pixels 100G (see FIG. 2) has been described. However, in the display device 10B according to Modification 2, an example in which the optical adjustment layer 16 has a protrusion 16B in each of the portions corresponding to the plurality of sub-pixels 100G will be described. That is, an example in which the optical adjustment layer 16 has a recess 16C in each of the portions corresponding to the plurality of sub-pixels 100R and the plurality of sub-pixels 100B will be described.

(Sub-Pixel)

The sub-pixel 100G includes the optical adjustment layer 16 between the second electrode 15 and the semi-transmissive reflective layer 17. Accordingly, in the sub-pixel 100G, the second electrode 15 and the semi-transmissive reflective layer 17 are separated from each other. The thickness of the optical adjustment layer 16 in the sub-pixel 100G is different from the thickness of the optical adjustment layer 16 in the sub-pixels 100R and 100B. More specifically, the thickness of the optical adjustment layer 16 in the sub-pixel 100G is thicker than the thickness of the optical adjustment layer 16 in the sub-pixels 100R and 100B. However, the thickness of the optical adjustment layer 16 in the sub-pixel 100G may be thinner than the thickness of the optical adjustment layer 16 in the sub-pixels 100R and 100B.

(Optical Adjustment Layer)

The optical adjustment layer 16 adjusts the optical path length between the first electrode 12 and the semi-transmissive reflective layer 17 in the sub-pixel 100G. The thickness of the optical adjustment layer 16 of the sub-pixel 100G is set such that green light corresponding to the color of the sub-pixel 100G resonates and is emphasized in the resonator structure.

[Modification 3]

Figure 10:
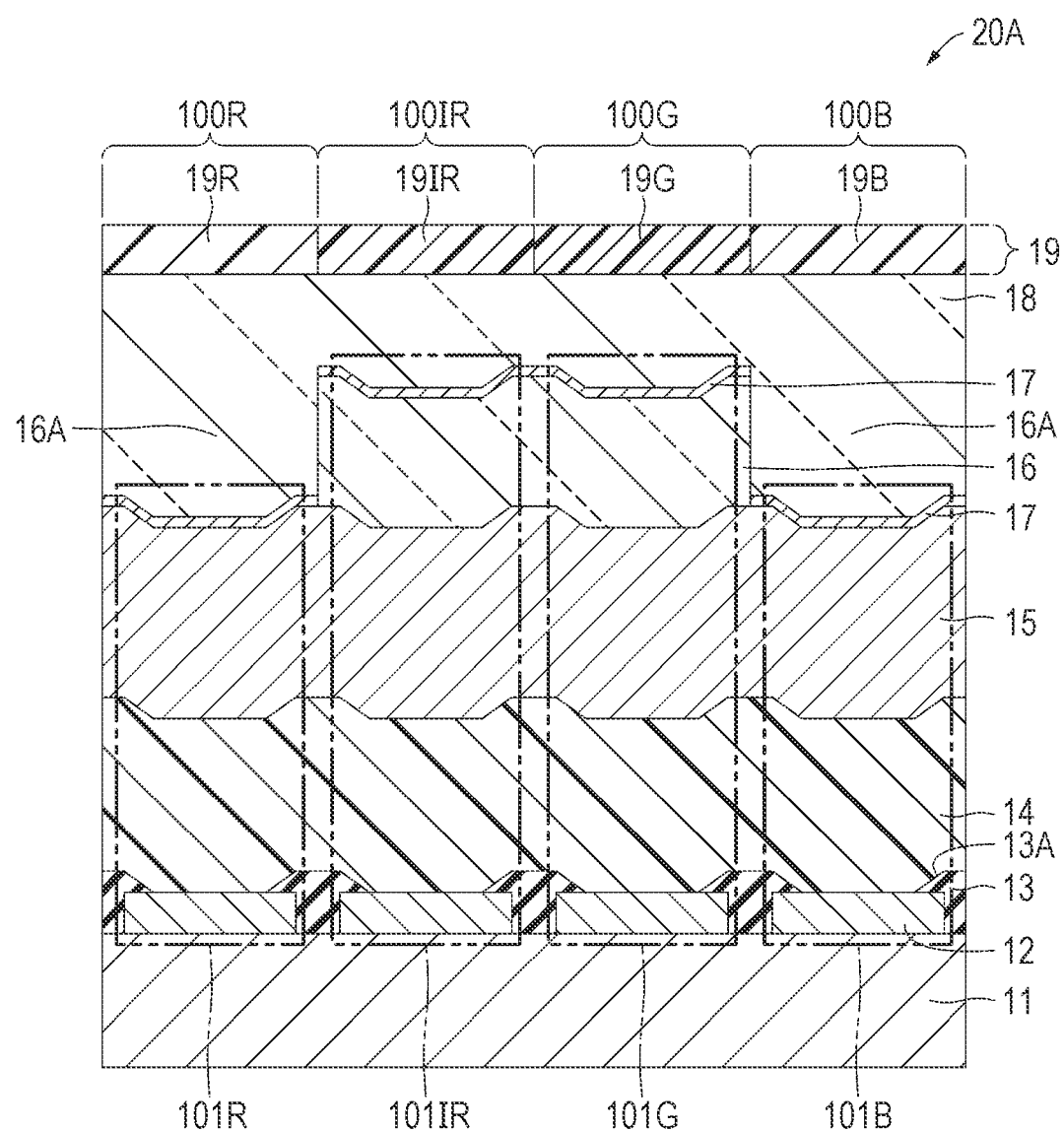
FIG. 10 is a cross-sectional view illustrating an example of a configuration of a display device according to Modification 3.

FIG. 10 is a cross-sectional view illustrating an example of a configuration of a display device 20A according to Modification 3. In the second embodiment, an example in which the optical adjustment layer 16 has the opening 16A in each of the portions corresponding to the plurality of sub-pixels 100G and 100IR (see FIG. 7) has been described. However, in the display device 10A according to Modification 3, an example in which the optical adjustment layer 16 has an opening 16A in each of the portions corresponding to the plurality of sub-pixels 100R and 100B will be described.

(Sub-Pixel)

The sub-pixel 100R and the sub-pixel 100B do not include the optical adjustment layer 16 between the second electrode 15 and the semi-transmissive reflective layer 17. Accordingly, in the sub-pixel 100R and the sub-pixel 100B, the second electrode 15 and the semi-transmissive reflective layer 17 are adjacent to each other and have the same height. On the other hand, the sub-pixels 100G and 100IR include the optical adjustment layer 16 between the second electrode 15 and the semi-transmissive reflective layer 17. Accordingly, in the sub-pixels 100G and 100IR, the second electrode 15 and the semi-transmissive reflective layer 17 are separated from each other and have the same height.

(Optical Adjustment Layer)

The thicknesses of the optical adjustment layers 16 in the sub-pixels 100G and 100IR are the same. Accordingly, the heights of the first surfaces of the optical adjustment layers 16 in the sub-pixels 100G and 100IR are the same. The optical adjustment layer 16 adjusts the optical path length between the first electrode 12 and the semi-transmissive reflective layer 17 in each of the sub-pixels 100G and 100IR. The thickness of the optical adjustment layer 16 in the sub-pixels 100G and 100IR is set such that green light corresponding to the sub-pixel 100G and infrared light corresponding to the sub-pixel 100IR resonate and are emphasized in the resonator structure.

(Second Electrode)

The second electrode 15 adjusts the optical path length between the first electrode 12 and the semi-transmissive reflective layer 17 in each of the sub-pixels 100R and 100B. The thickness of the second electrode 15 in the sub-pixels 100R and 100B is set such that red light corresponding to the sub-pixel 100R and blue light corresponding to the color of the sub-pixel 100B resonate and are emphasized in the resonator structure.

[Modification 4]

Figure 11:
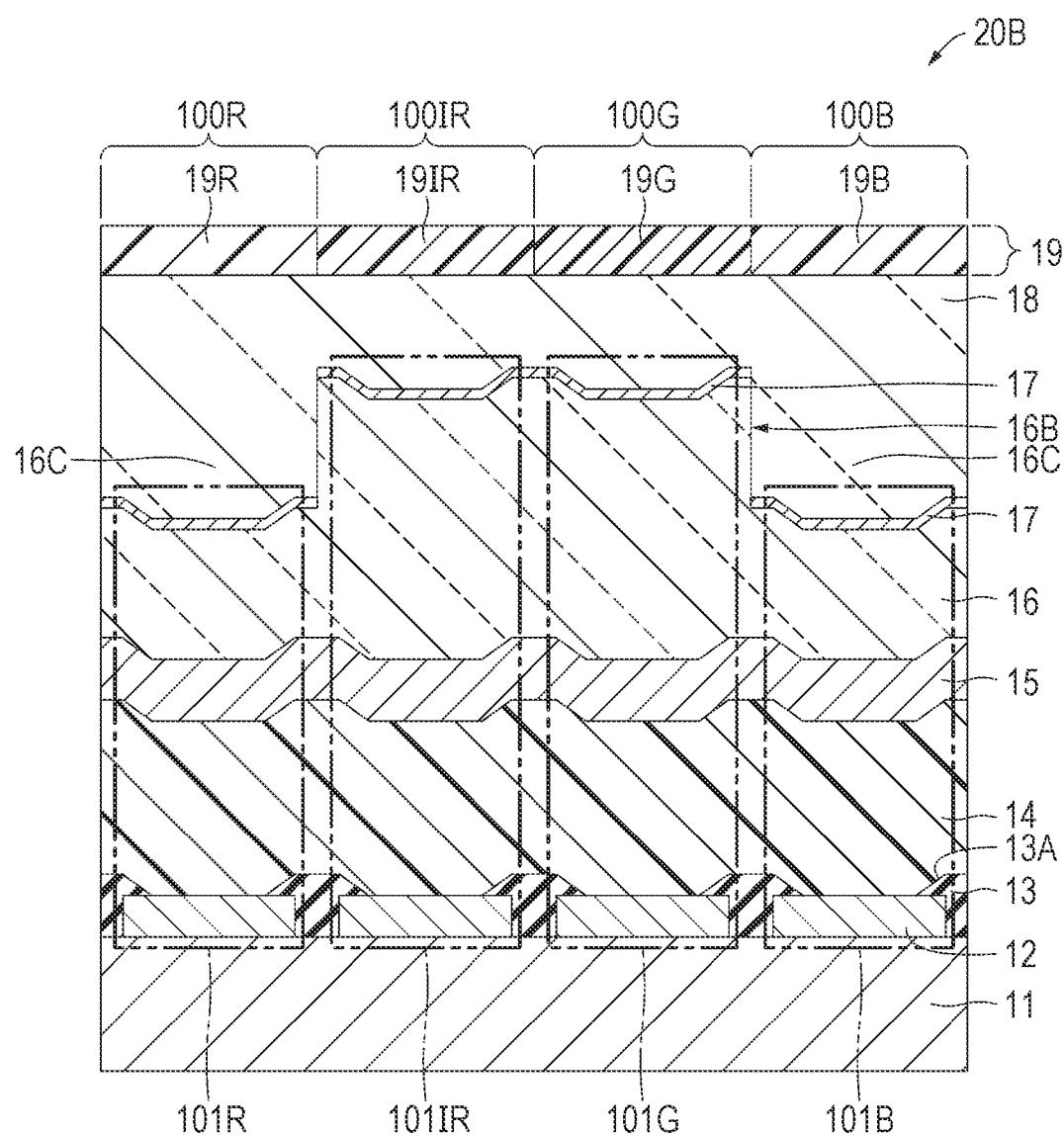
FIG. 11 is a cross-sectional view illustrating an example of a configuration of a display device according to Modification 4.

FIG. 11 is a cross-sectional view illustrating an example of a configuration of a display device 20B according to Modification 4. In the second embodiment, an example in which the optical adjustment layer 16 has the opening 16A in each of the portions corresponding to the plurality of sub-pixels 100G and 100IR (see FIG. 7) has been described. However, in the display device 10A according to Modification 4, an example in which the optical adjustment layer 16 has a protrusion 16B in each of the portions corresponding to the plurality of sub-pixels 100G and 100IR will be described. That is, an example in which the optical adjustment layer 16 has a recess 16C in each of the portions corresponding to the plurality of sub-pixels 100R and 100B will be described.

(Sub-Pixel)

The sub-pixels 100G and 100IR include the optical adjustment layer 16 between the second electrode 15 and the semi-transmissive reflective layer 17. Accordingly, in the sub-pixels 100G and 100IR, the second electrode 15 and the semi-transmissive reflective layer 17 are separated from each other. The thickness of the optical adjustment layer 16 in the sub-pixels 100G and 100IR is different from the thickness of the optical adjustment layer 16 in the sub-pixels 100R and 100B. More specifically, the thickness of the optical adjustment layer 16 in the sub-pixels 100G and 100IR is thicker than the thickness of the optical adjustment layer 16 in the sub-pixels 100R and 100B. However, the thickness of the optical adjustment layer 16 in the sub-pixels 100G and 100IR may be thinner than the thickness of the optical adjustment layer 16 in the sub-pixels 100R and 100B.

(Optical Adjustment Layer)

The thicknesses of the optical adjustment layers 16 in the sub-pixels 100G and 100IR are the same. Accordingly, the heights of the first surfaces of the optical adjustment layers 16 in the sub-pixels 100G and 100IR are the same. The optical adjustment layer 16 adjusts the optical path length between the first electrode 12 and the semi-transmissive reflective layer 17 in each of the sub-pixels 100G and 100IR. The thickness of the optical adjustment layer 16 in the sub-pixels 100G and 100IR is set such that green light corresponding to the sub-pixel 100G and infrared light corresponding to the sub-pixel 100IR resonate and are emphasized in the resonator structure.

[Modification 5]

In the first embodiment and Modifications 1 and 2, an example in which the display devices 10, 10A, and 10B include the color filter 19 has been described. However, the display devices 10, 10A, and 10B may not include the color filter 19. Similarly, display devices 10C, 10D, 10E, 10F, 10G, 10H, and 10I, which will be described later, may not include the color filter 19.

[Modification 6]

In the first embodiment and Modifications 1 and 2, an example in which all of the sub-pixel 100R, the sub-pixel 100G, and the sub-pixel 100B include a filter has been described. However, at least one of the sub-pixel 100R, the sub-pixel 100G, or the sub-pixel 100B may include a filter. That is, the color filter 19 may include at least one filter of the red filter 19R, the green filter 19G, or the blue filter 19B. For example, the color filter 19 may include the red filter 19R and the blue filter 19B. Similarly, in Modifications 11 to 13 and 17 to 19 to be described later, at least one of the sub-pixel 100R, the sub-pixel 100G, or the sub-pixel 100B may include a filter.

[Modification 7]

In the second embodiment and Modifications 3 and 4, an example in which the display devices 20, 20A, and 20B include the color filter 19 has been described. However, the display devices 20, 20A, and 20B may not include the color filter 19. Similarly, display devices 20C, 20D, 20E, 20F, 20G, and 20H, which will be described later, may not include the color filter 19.

[Modification 8]

In the second embodiment and Modifications 3 and 4, an example in which all of the sub-pixel 100R, the sub-pixel 100G, the sub-pixel 100B, and the sub-pixel 100IR include a filter has been described. However, at least one of the sub-pixel 100R, the sub-pixel 100G, the sub-pixel 100B, or the sub-pixel 100IR may include a filter. That is, the color filter 19 may include at least one filter of the red filter 19R, the green filter 19G, the blue filter 19B, or the infrared light transmission filter 19IR. Similarly, in Modifications 14 to 16 and 20 to 22 to be described later, at least one of the sub-pixel 100R, the sub-pixel 100G, the sub-pixel 100B, or the sub-pixel 100IR may include a filter.

[Modification 9]

In the first and second embodiments and Modification 1 to 8, an example in which the first electrode 12 is formed by the adjacent metal layer and transparent conductive oxide layer has been described. However, an insulating layer may be provided between the metal layer and the transparent conductive oxide layer, and the metal layer and the transparent conductive oxide layer may be separated from each other. In this case, the metal layer and the transparent conductive oxide layer may be electrically connected by a contact plug. The above configuration may be similarly used in Modification 11 to 23 to be described later.

[Modification 10]

In the first and second embodiments and Modifications 1 to 8 and 11 to 23, the display devices 10, 10A, 10B, 10C, 10D, 10E, 10F, 10G, 10H, 10I, 20, 20A, 20B, 20C, 20D, 20E, 20F, 20G, and 20H (hereinafter referred to as "the display device 10 and the like") may further include a filling resin layer and a counter substrate. The filling resin layer is provided between the color filter 19 and the counter substrate. The filling resin layer has a function as an adhesive layer for bonding the color filter 19 and the counter substrate. The filling resin layer includes, for example, at least one selected from a group including a thermosetting resin, an ultraviolet curable resin, and the like.

The counter substrate is provided to face the drive substrate 11. The counter substrate seals the plurality of light emitting elements 101, the color filter 19, and the like. The counter substrate includes a material such as glass transparent to each color of light emitted from the color filter 19.

As described above, in a case where the display device 10 and the like include a counter substrate, the color filter 19 may be provided on the second surface of the counter substrate (the surface facing the organic EL layer 14).

[Modification 11]

Figure 12:
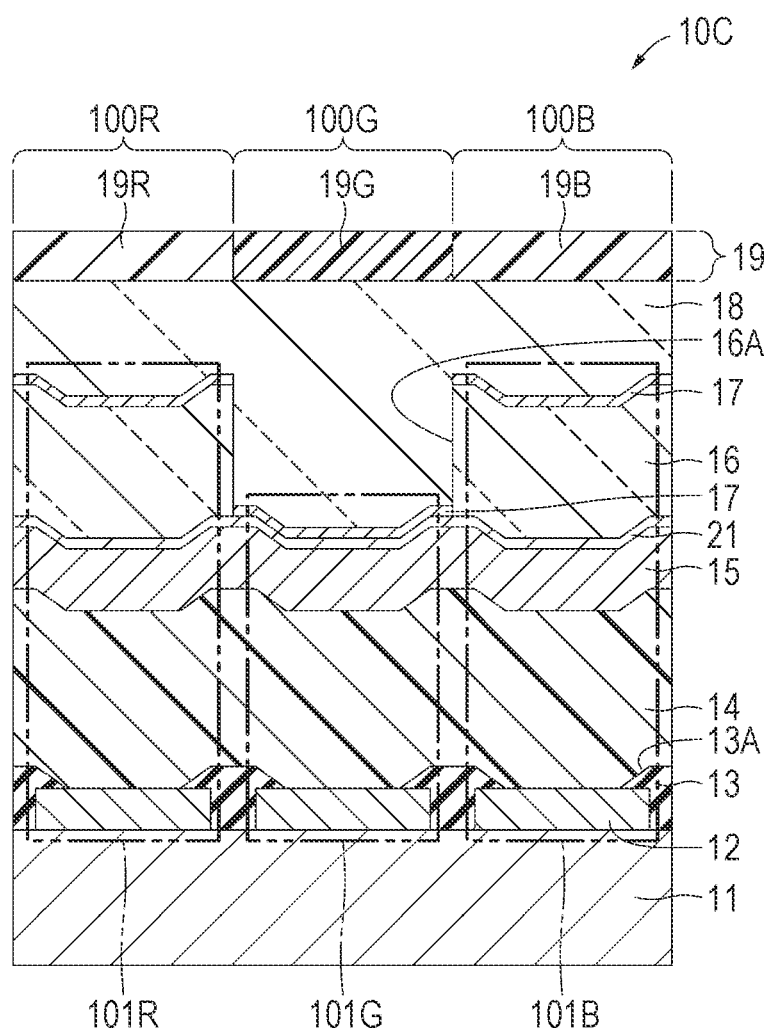
FIG. 12 is a cross-sectional view illustrating an example of a configuration of a display device according to Modification 11.

FIG. 12 is a cross-sectional view illustrating an example of a configuration of a display device 10C according to Modification 11. The display device 10C is different from the display device 10 according to the first embodiment (see FIG. 2) in that it further includes an etching stop layer 21.

The etching stop layer 21 is an example of a base layer. When the opening 16A is formed by etching, the etching stop layer 21 can stop the progress of etching. The etching stop layer 21 may have a function of a protective layer for suppressing intrusion of moisture and the like from the outside into the second electrode 15, the organic EL layer 14, and the like. The etching stop layer 21 has transparency to light generated in the organic EL layer 14.

An etching rate of the etching stop layer 21 is slower than an etching rate of the optical adjustment layer 16. Here, the etching rate is a thickness of a layer removed by etching per unit time. An etching selectivity ($S_b/S_a$) of the optical adjustment layer 16 to the etching stop layer 21 is preferably 5 or more, more preferably 10 or more, and still more preferably 15 or more. If the selection ratio ($S_b/S_a$) is 5 or more, it is possible to suppress a decrease in the thickness of the etching stop layer 21 due to etching when the opening 16A is formed by etching. In the present specification, the etching selectivity ($S_a/S_a$) of the optical adjustment layer 16 to the etching stop layer 21 represents an etching rate ratio ($S_b/S_a$) of an etching rate $S_b$ of the optical adjustment layer 16 to an etching rate $S_a$ of the etching stop layer 21.

The etching stop layer 21 is continuously provided over the plurality of sub-pixels 100 (that is, the plurality of sub-pixels 100R, the plurality of sub-pixels 100G, and the plurality of sub-pixels 100B) in the display region 110A, and is a layer common to the plurality of sub-pixels 100 in the display region 110A. The sub-pixel 100G includes the etching stop layer 21 between the second electrode 15 and the semi-transmissive reflective layer 17. The sub-pixel 100R and the sub-pixel 100B include the etching stop layer 21 and the optical adjustment layer 16 in that order between the second electrode 15 and the semi-transmissive reflective layer 17. The etching stop layer 21 is formed by, for example, a metal layer or a transparent conductive oxide layer.

A method for manufacturing the display device 10C according to Modification 11 is different from the method for manufacturing the display device 10 according to the first embodiment in that it further includes a step of forming the etching stop layer 21 between the step of forming the second electrode 15 and the step of forming the optical adjustment layer 16.

In the step of forming the etching stop layer 21, the etching stop layer 21 is formed on the first surface of the second electrode 15 by, for example, a vapor deposition method or a sputtering method.

As described above, in the display device 10C according to Modification 11, the sub-pixel 100G includes the etching stop layer 21 between the second electrode 15 and the semi-transmissive reflective layer 17. Accordingly, when the opening 16A is formed in the optical adjustment layer 16 by etching, the progress of etching can be stopped by the etching stop layer 21. Therefore, the processing accuracy of the depth of the opening 16A can be improved. That is, the accuracy of the optical path length between the first electrode 12 and the semi-transmissive reflective layer 17 in the sub-pixel 100G can be improved.

[Modification 12]

Figure 13:
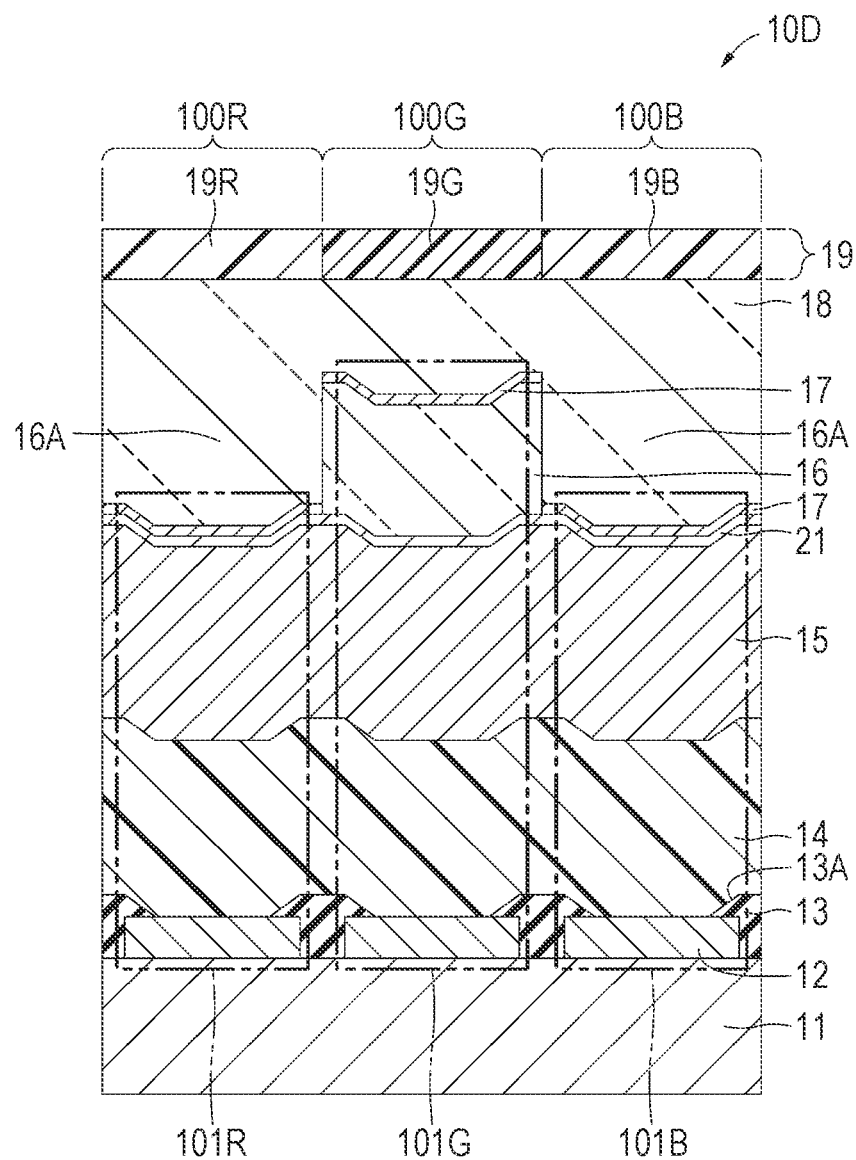
FIG. 13 is a cross-sectional view illustrating an example of a configuration of a display device according to Modification 12.

FIG. 13 is a cross-sectional view illustrating an example of a configuration of a display device 10D according to Modification 12. The display device 10D is different from the display device 10A according to Modification 1 (see FIG. 8) in that it further includes an etching stop layer 21.

The sub-pixel 100G includes the etching stop layer 21 and the optical adjustment layer 16 in that order between the second electrode 15 and the semi-transmissive reflective layer 17. The sub-pixel 100R and the sub-pixel 100B include the etching stop layer 21 between the second electrode 15 and the semi-transmissive reflective layer 17.

As described above, in the display device 10D according to Modification 12, the sub-pixel 100R and the sub-pixel 100B include the etching stop layer 21 between the second electrode 15 and the semi-transmissive reflective layer 17. Accordingly, when the opening 16A is formed in the optical adjustment layer 16 by etching, the progress of etching can be stopped by the etching stop layer 21. Therefore, the processing accuracy of the depth of the opening 16A can be improved. That is, the accuracy of the optical path length between the first electrode 12 and the semi-transmissive reflective layer 17 in the sub-pixel 100R and the sub-pixel 100B can be improved.

[Modification 13]

Figure 14:
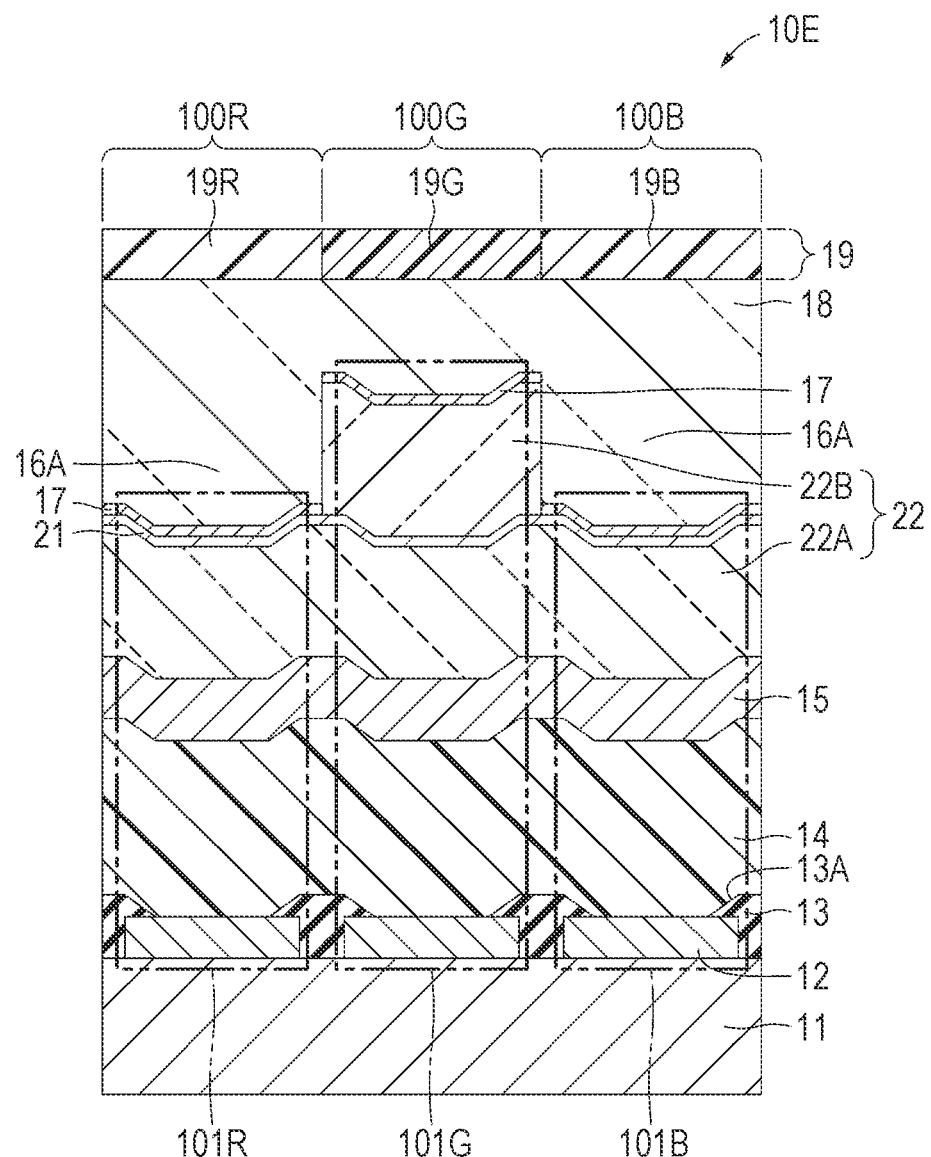
FIG. 14 is a cross-sectional view illustrating an example of a configuration of a display device according to Modification 13.

FIG. 14 is a cross-sectional view illustrating an example of a configuration of a display device 10E according to Modification 13. The display device 10E is different from the display device 10B according to Modification 2 (see FIG. 9) in that it includes an optical adjustment layer 22 instead of the optical adjustment layer 16 and further includes an etching stop layer 21.

The optical adjustment layer 22 includes a first optical adjustment layer 22A and a second optical adjustment layer 22B in that order. More specifically, the sub-pixel 100R and the sub-pixel 100B include the first optical adjustment layer 22A and the etching stop layer 21 in that order between the second electrode 15 and the semi-transmissive reflective layer 17. The sub-pixel 100G includes the first optical adjustment layer 22A, the etching stop layer 21, and the second optical adjustment layer 22B in that order between the second electrode 15 and the semi-transmissive reflective layer 17.

The first optical adjustment layer 22A has transparency to light generated in the organic EL layer 14. The first optical adjustment layer 22A is continuously provided over the plurality of sub-pixels 100 (that is, the plurality of sub-pixels 100R, the plurality of sub-pixels 100G, and the plurality of sub-pixels 100B) in the display region 110A, and is a layer common to the plurality of sub-pixels 100 in the display region 110A.

The thicknesses of the first optical adjustment layers 22A in the sub-pixels 100R, 100G, and 100B are substantially the same. Accordingly, the heights of the first surfaces of the first optical adjustment layers 22A in the sub-pixels 100R, 100G, and 100B are substantially the same. The first optical adjustment layer 22A can adjust the optical path length between the first electrode 12 and the semi-transmissive reflective layer 17 in each of the sub-pixels 100R and 100B. The thickness of the first optical adjustment layer 22A in the sub-pixels 100R and 100B is set such that red light corresponding to the color of the sub-pixel 100R and blue light corresponding to the color of the sub-pixel 100B resonate and are emphasized in the resonator structure.

The second optical adjustment layer 22B has transparency to light generated in the organic EL layer 14. The second optical adjustment layer 22B can adjust the optical path length between the first electrode 12 and the semi-transmissive reflective layer 17 in the sub-pixel 100G. The thickness of the second optical adjustment layer 22B in the sub-pixel 100G is set such that green light corresponding to the color of the sub-pixel 100G resonates and is emphasized in the resonator structure.

The first optical adjustment layer 22A may be an organic layer, an inorganic layer, or a stacked body thereof. As the materials of the organic layer and the inorganic layer, the materials similar to those of the optical adjustment layer 16 in the first embodiment can be exemplified.

The second optical adjustment layer 22B may be an organic layer, an inorganic layer, or a stacked body thereof. As the materials of the organic layer and the inorganic layer, the materials similar to those of the optical adjustment layer 16 in the first embodiment can be exemplified.

As described above, in the display device 10E according to Modification 13, the sub-pixel 100R and the sub-pixel 100B include the etching stop layer 21 between the first optical adjustment layer 22A and the second optical adjustment layer 22B. Accordingly, when the opening 16A is formed in the second optical adjustment layer 22B by etching, the progress of etching can be stopped by the etching stop layer 21. Therefore, the processing accuracy of the depth of the opening 16A can be improved. That is, the accuracy of the optical path length between the first electrode 12 and the semi-transmissive reflective layer 17 in the sub-pixel 100R and the sub-pixel 100B can be improved.

[Modification 14]

Figure 15:
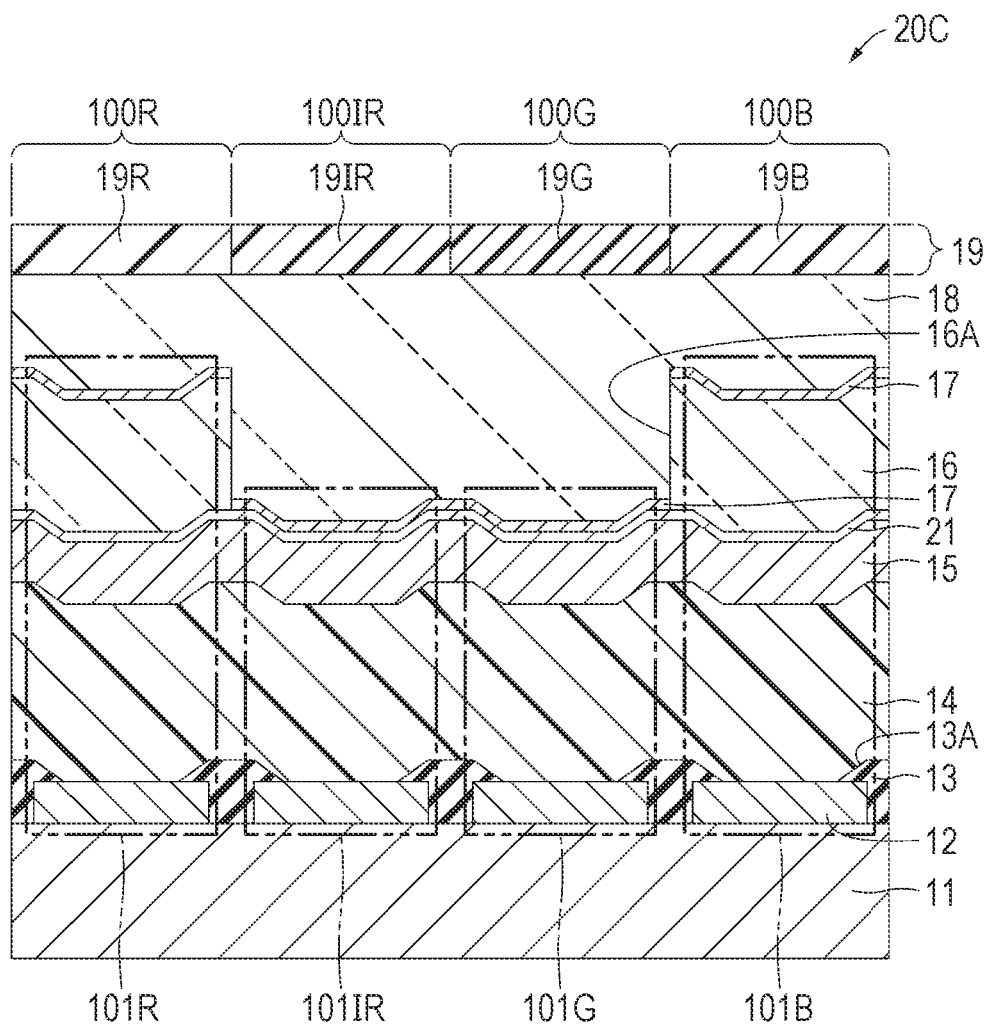
FIG. 15 is a cross-sectional view illustrating an example of a configuration of a display device according to Modification 14.

FIG. 15 is a cross-sectional view illustrating an example of a configuration of a display device 20C according to Modification 14. The display device 20C is different from the display device 20 according to the second embodiment (see FIG. 7) in that it further includes an etching stop layer 21.

The etching stop layer 21 is continuously provided over the plurality of sub-pixels 100 (that is, the plurality of sub-pixels 100R, the plurality of sub-pixels 100G, the plurality of sub-pixels 100B, and the plurality of sub-pixels 100IR) in the display region 110A, and is a layer common to the plurality of sub-pixels 100 in the display region 110A. The sub-pixel 100G and the sub-pixel 100IR include the etching stop layer 21 between the second electrode 15 and the semi-transmissive reflective layer 17. The sub-pixel 100R and the sub-pixel 100B include the etching stop layer 21 and the optical adjustment layer 16 in that order between the second electrode 15 and the semi-transmissive reflective layer 17.

As described above, in the display device 20C according to Modification 14, the sub-pixel 100G and the sub-pixel 100IR include the etching stop layer 21 between the second electrode 15 and the semi-transmissive reflective layer 17. Accordingly, when the opening 16A is formed in the optical adjustment layer 16 by etching, the progress of etching can be stopped by the etching stop layer 21. Therefore, the processing accuracy of the opening 16A can be improved. That is, the accuracy of the optical path length between the first electrode 12 and the semi-transmissive reflective layer 17 in the sub-pixel 100G and the sub-pixel 100IR can be improved.

[Modification 15]

Figure 16:
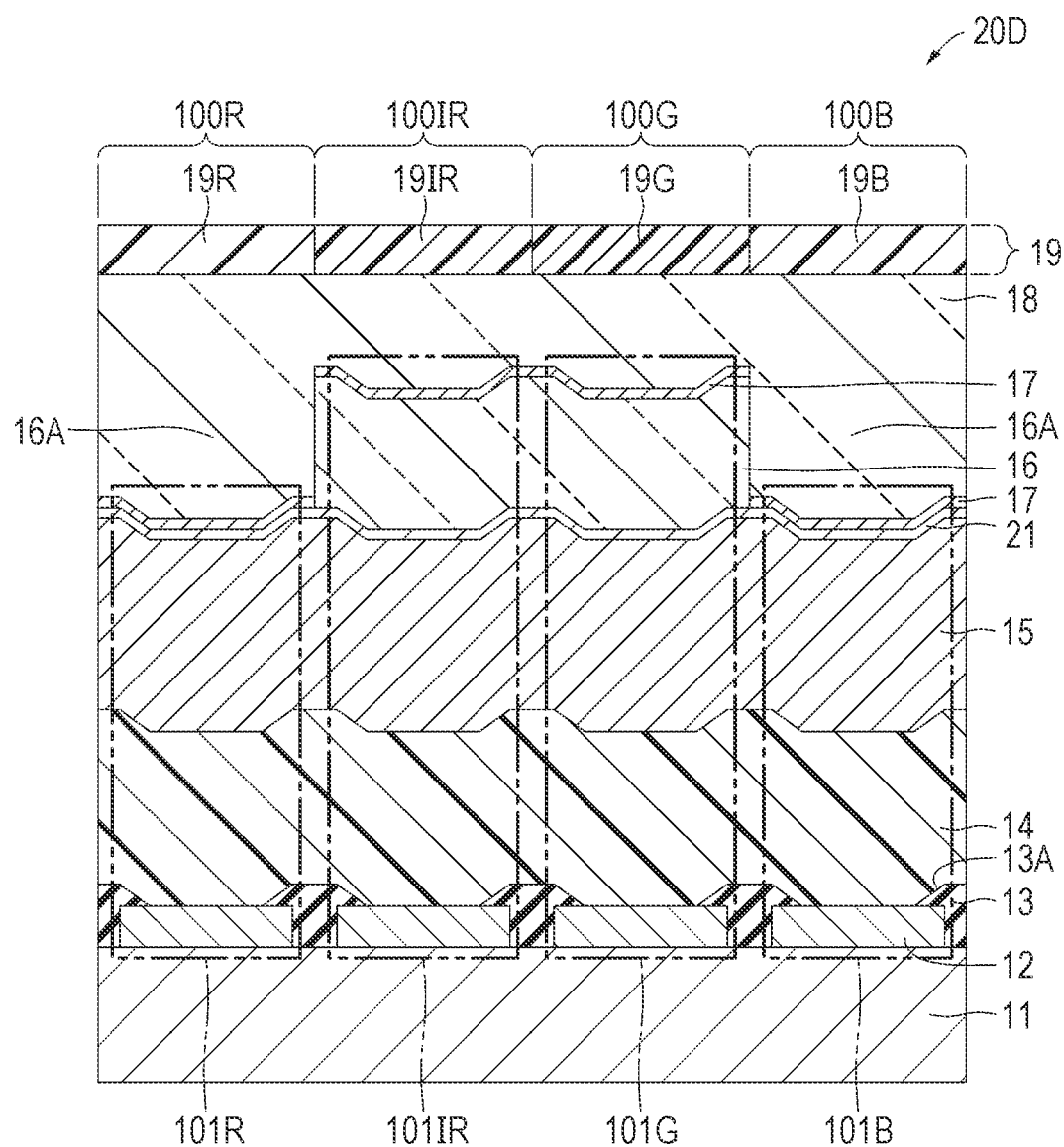
FIG. 16 is a cross-sectional view illustrating an example of a configuration of a display device according to Modification 15.

FIG. 16 is a cross-sectional view illustrating an example of a configuration of a display device 20D according to Modification 15. The display device 20D is different from the display device 20A according to Modification 3 (see FIG. 10) in that it further includes an etching stop layer 21.

The sub-pixel 100G and the sub-pixel 100IR include the etching stop layer 21 and the optical adjustment layer 16 in that order between the second electrode 15 and the semi-transmissive reflective layer 17. The sub-pixel 100R and the sub-pixel 100B include the etching stop layer 21 between the second electrode 15 and the semi-transmissive reflective layer 17.

As described above, in the display device 20D according to Modification 15, the sub-pixel 100R and the sub-pixel 100B include the etching stop layer 21 between the second electrode 15 and the semi-transmissive reflective layer 17. Accordingly, when the opening 16A is formed in the optical adjustment layer 16 by etching, the progress of etching can be stopped by the etching stop layer 21. Therefore, the processing accuracy of the depth of the opening 16A can be improved. That is, the accuracy of the optical path length between the first electrode 12 and the semi-transmissive reflective layer 17 in the sub-pixel 100R and the sub-pixel 100B can be improved.

[Modification 16]

Figure 17:
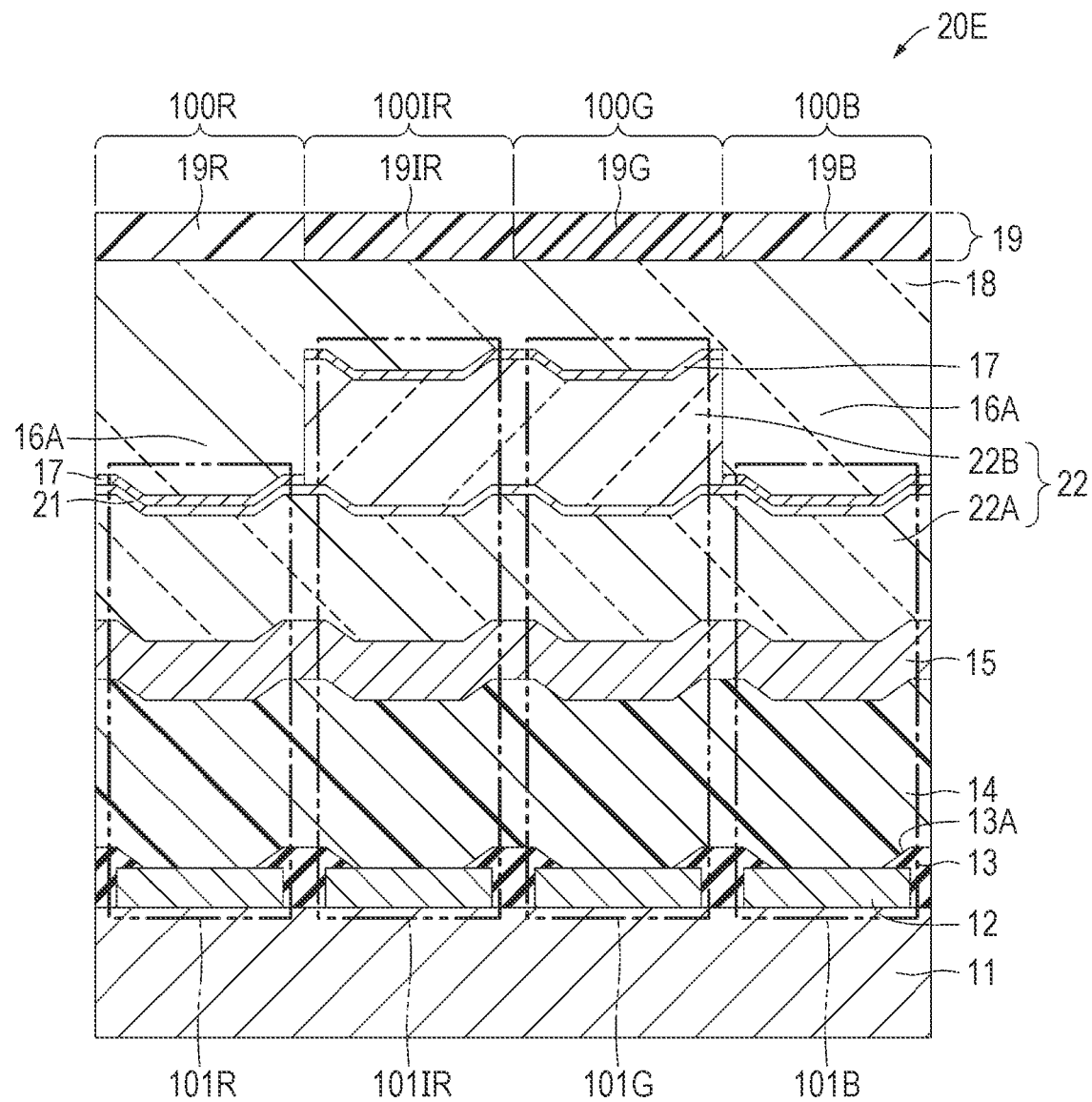
FIG. 17 is a cross-sectional view illustrating an example of a configuration of a display device according to Modification 16.

FIG. 17 is a cross-sectional view illustrating an example of a configuration of a display device 20E according to Modification 16. The display device 20E is different from the display device 20B according to Modification 4 (see FIG. 11) in that it includes an optical adjustment layer 22 instead of the optical adjustment layer 16 and further includes an etching stop layer 21.

The optical adjustment layer 22 includes a first optical adjustment layer 22A and a second optical adjustment layer 22B in that order. More specifically, the sub-pixel 100R and the sub-pixel 100B include the first optical adjustment layer 22A and the etching stop layer 21 in that order between the second electrode 15 and the semi-transmissive reflective layer 17. The sub-pixel 100G and the sub-pixel 100IR include the first optical adjustment layer 22A, the etching stop layer 21, and the second optical adjustment layer 22B in that order between the second electrode 15 and the semi-transmissive reflective layer 17.

The first optical adjustment layer 22A is continuously provided over the plurality of sub-pixels 100 (that is, the plurality of sub-pixels 100R, the plurality of sub-pixels 100G, and the plurality of sub-pixels 100B) in the display region 110A, and is a layer common to the plurality of sub-pixels 100 in the display region 110A.

The thicknesses of the first optical adjustment layers 22A in the sub-pixels 100R, 100G, 100B, and 100IR are substantially the same. Accordingly, the heights of the first surfaces of the first optical adjustment layers 22A in the sub-pixels 100R, 100G, 100B, and 100IR are substantially the same. The first optical adjustment layer 22A can adjust the optical path length between the first electrode 12 and the semi-transmissive reflective layer 17 in each of the sub-pixels 100R and 100B. The thickness of the first optical adjustment layer 22A in the sub-pixels 100R and 100B is set such that red light corresponding to the color of the sub-pixel 100R and blue light corresponding to the color of the sub-pixel 100B resonate and are emphasized in the resonator structure.

The second optical adjustment layer 22B can adjust the optical path length between the first electrode 12 and the semi-transmissive reflective layer 17 in each of the sub-pixels 100G and 100IR. The thickness of the second optical adjustment layer 22B in the sub-pixels 100G and 100IR is set such that green light corresponding to the sub-pixels 100G and 100IR and infrared light corresponding to the sub-pixel 100IR resonate and are emphasized in the resonator structure.

As described above, in the display device 20E according to Modification 16, the sub-pixel 100R and the sub-pixel 100B include the etching stop layer 21 between the first optical adjustment layer 22A and the semi-transmissive reflective layer 17. Accordingly, when the opening 16A is formed in the second optical adjustment layer 22B by etching, the progress of etching can be stopped by the etching stop layer 21. Therefore, the processing accuracy of the depth of the opening 16A can be improved. That is, the accuracy of the optical path length between the first electrode 12 and the semi-transmissive reflective layer 17 in the sub-pixel 100R and the sub-pixel 100B can be improved.

[Modification 17]

Figure 18:
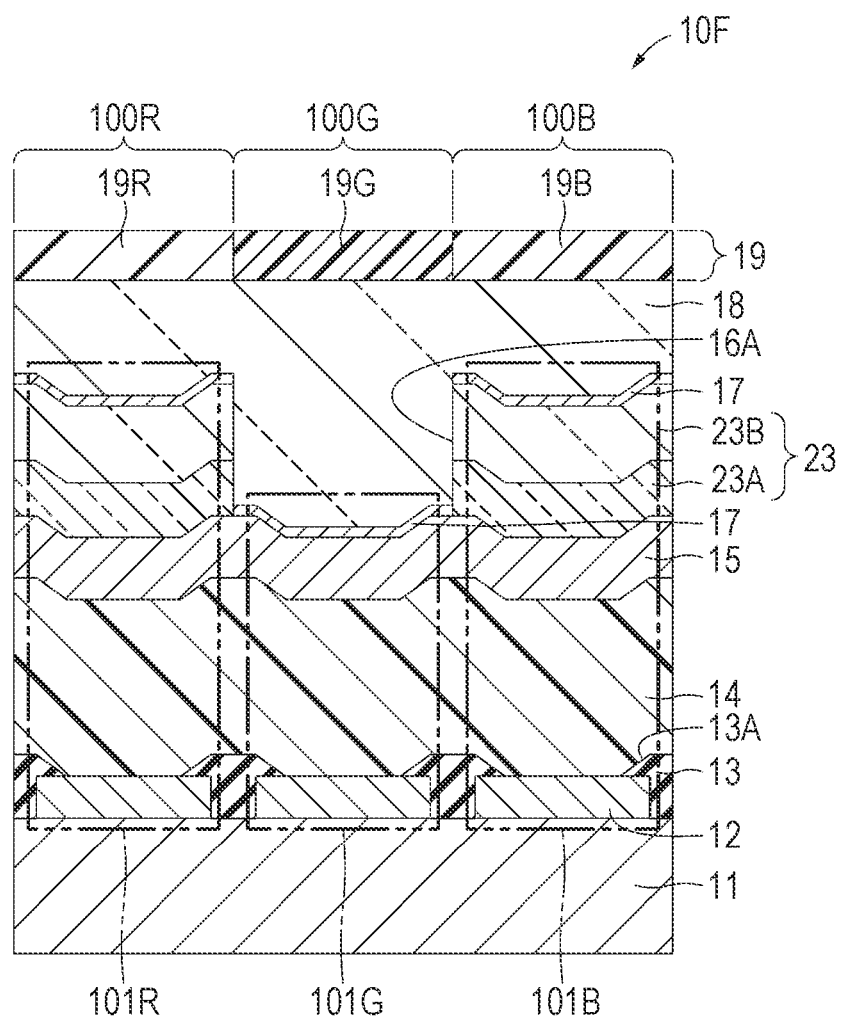
FIG. 18 is a cross-sectional view illustrating an example of a configuration of a display device according to Modification 17.

FIG. 18 is a cross-sectional view illustrating an example of a configuration of a display device 10F according to Modification 17. The display device 10F is different from the display device 10 according to the first embodiment (see FIG. 2) in that it includes an optical adjustment layer 23 instead of the optical adjustment layer 16.

Similarly to the optical adjustment layer 16 in the first embodiment, the optical adjustment layer 23 has an opening 16A in each of portions corresponding to the plurality of sub-pixels 100G. The optical adjustment layer 23 includes an organic layer 23A and an inorganic layer 23B on the first surface of the second electrode 15 in that order. Since the etching rate of the organic layer 23A is faster than the etching rate of the inorganic layer 23B, the progress of etching is easily stopped by the second electrode 15 when the optical adjustment layer 23 is processed by etching to form the opening 16A.

An etching selectivity ($S_c/S_d$) of the organic layer 23A to the inorganic layer 23B is preferably 5 or more, more preferably 10 or more, and still more preferably 15 or more. If the etching selectivity ($S_c/S_d$) is 5 or more, an etching selectivity ($S_c/S_a$) of the organic layer 23A to the second electrode 15 can be increased. Therefore, it is possible to suppress a decrease in the thickness of the second electrode 15 due to etching when the opening 16A is formed in the optical adjustment layer 23 by etching. In the present specification, the etching selectivity ($S_c/S_d$) of the organic layer 23A to the inorganic layer 23B represents an etching rate ratio ($S_c/S_d$) of an etching rate $S_c$ of the organic layer 23A to an etching rate $S_d$ of the inorganic layer 23B. Further, the etching selectivity ($S_c/S_a$) of the organic layer 23A to the second electrode 15 represents an etching rate ratio ($S_c/S_a$) of the etching rate $S_c$ of the organic layer 23A to the etching rate $S_a$ of the second electrode 15.

The etching selectivity ($S_c/S_d$) of the organic layer 23A to the second electrode 15 is preferably 5 or more, more preferably 10 or more, and still more preferably 15 or more. If the selection ratio ($S_c/S_a$) is 5 or more, it is possible to suppress a decrease in the thickness of the second electrode 15 due to etching when the opening 16A is formed in the optical adjustment layer 23 by the etching.

The organic layer 23A may include, for example, a known organic material used for the organic EL layer 14. Specifically, the organic layer 23A may include, for example, at least one selected from a group including a hole transport material and an electron transport material.

The hole transport material includes, for example, at least one selected from a group including poly (9,9-dioctylfluorene-alt-N-(4-butylphenyl)diphenylamine) (TFB), 4,4'-cyclohexylidenebis[N,N-bis(4-methylphenyl)benzenamine] (TAPC), N,N'-diphenyl-N,N'-di(m-tolyl)benzidine (TPD), N,N'-di(1-naphthyl)-N,N'-diphenylbenzidine (α-NPD), 4,4',4"tri-9-carbazolyltriphenylamine (TCTA), 4,4',4" tris[phenyl (m-tolyl)amino]triphenylamine, and the like.

The electron transport material includes, for example, at least one selected from a group including bis-4,6-(3,5-di-3-pyridylphenyl)-2-methylpyrimidine (B3PymPm), 2-(4-biphenylyl)-5-(p-t-butylphenyl)-1,3,4-oxadiazole (tBu-PBD), 1,3-bis[5-(4-t-butylphenyl)-2-[1,3,4]oxadiazolyl]benzene (OXD-7), 3-(biphenyl-4-yl)-5-(4-t-butylphenyl)-4-phenyl-4H-1,2,4-triazole (TAZ), bathocuproine (BCP), 1,3,5-tris(1-phenyl-1H-benzimidazole-2-yl)benzene (TPBi), and the like.

The organic layer 23A may include an organic material similar to that of the organic material contained in the organic EL layer 14. Specifically, for example, the organic layer 23A may include an organic material similar to that of the hole transport layer 14HTL or the electron transport layer 14ETL. In this case, since the organic layer 23A can be formed by a film forming device similar to that of the hole transport layer 14HTL or the electron transport layer 14ETL, manufacturing equipment can be simplified. The organic layer 23A may include a para-xylylene-based compound such as parylene (registered trademark). The organic layer 23A may include at least one selected from a group including a thermosetting resin, an ultraviolet curable resin, and the like.

As described above, in the display device 10F according to Modification 17, the optical adjustment layer 23 includes the organic layer 23A and the inorganic layer 23B on the first surface of the second electrode 15 in that order. Since the etching selectivity ($S_c/S_a$) of the organic layer 23A to the second electrode 15 is large, it is possible to suppress a decrease in the thickness of the second electrode 15 due to etching when the optical adjustment layer 23 is processed by etching to form the opening 16A. Therefore, since the processing accuracy of the depth of the opening 16A can be improved, the accuracy of the optical path length between the first electrode 12 and the semi-transmissive reflective layer 17 in the sub-pixel 100G can be improved.

[Modification 18]

Figure 19:
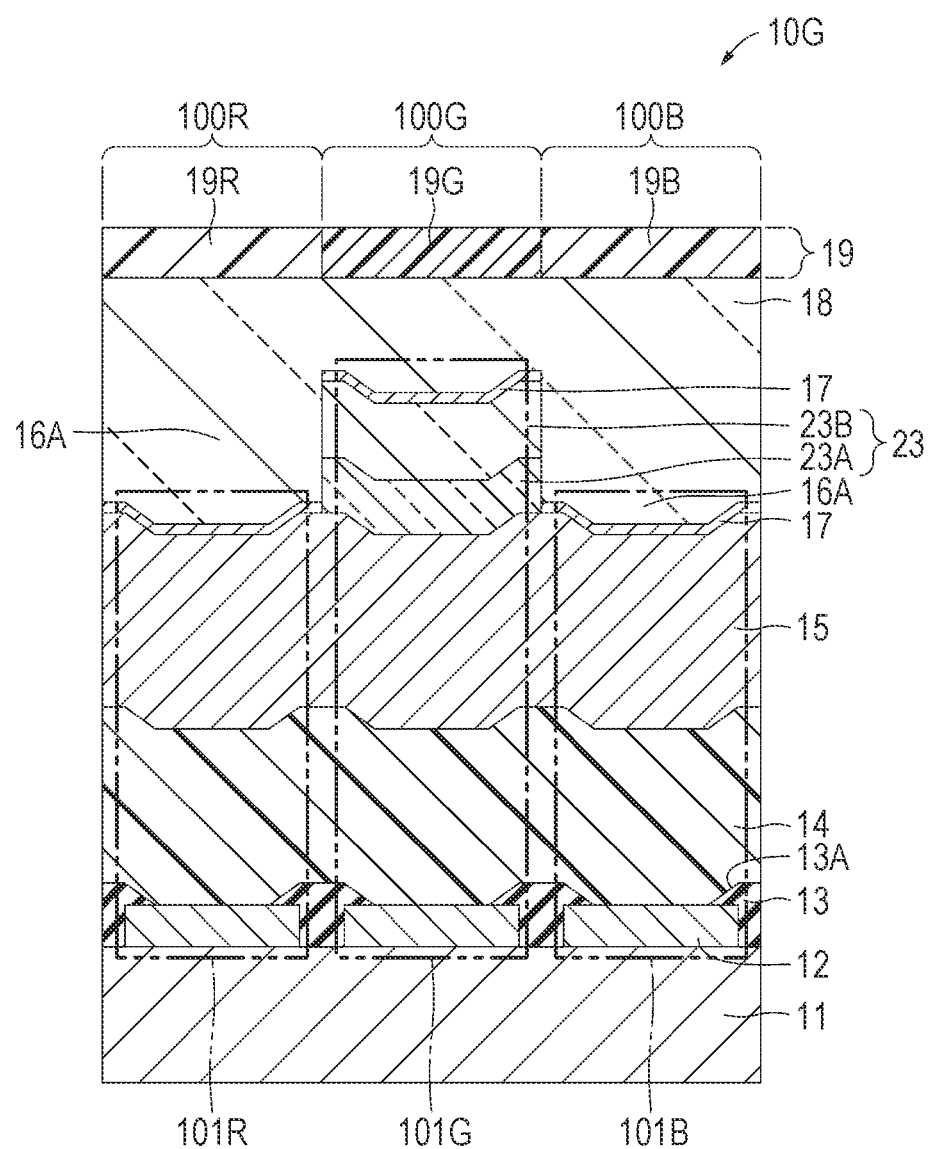
FIG. 19 is a cross-sectional view illustrating an example of a configuration of a display device according to Modification 18.

FIG. 19 is a cross-sectional view illustrating an example of a configuration of a display device 10G according to Modification 18. The display device 10G is different from the display device 10A according to Modification 1 (see FIG. 8) in that it includes an optical adjustment layer 23 instead of the optical adjustment layer 16.

Similarly to the optical adjustment layer 16 in Modification 1, the optical adjustment layer 23 has an opening 16A in each of portions corresponding to the plurality of sub-pixels 100R and 100B.

As described above, in the display device 10G according to Modification 18, the optical adjustment layer 23 includes the organic layer 23A and the inorganic layer 23B on the first surface of the second electrode 15 in that order. Since the etching selectivity ($S_c/S_a$) of the organic layer 23A to the second electrode 15 is large, it is possible to suppress a decrease in the thickness of the second electrode 15 due to etching when the optical adjustment layer 23 is processed by etching to form the opening 16A. Therefore, since the processing accuracy of the depth of the opening 16A can be improved, the accuracy of the optical path length between the first electrode 12 and the semi-transmissive reflective layer 17 in the sub-pixel 100R and the sub-pixel 100B can be improved.

[Modification 19]

Figure 20:
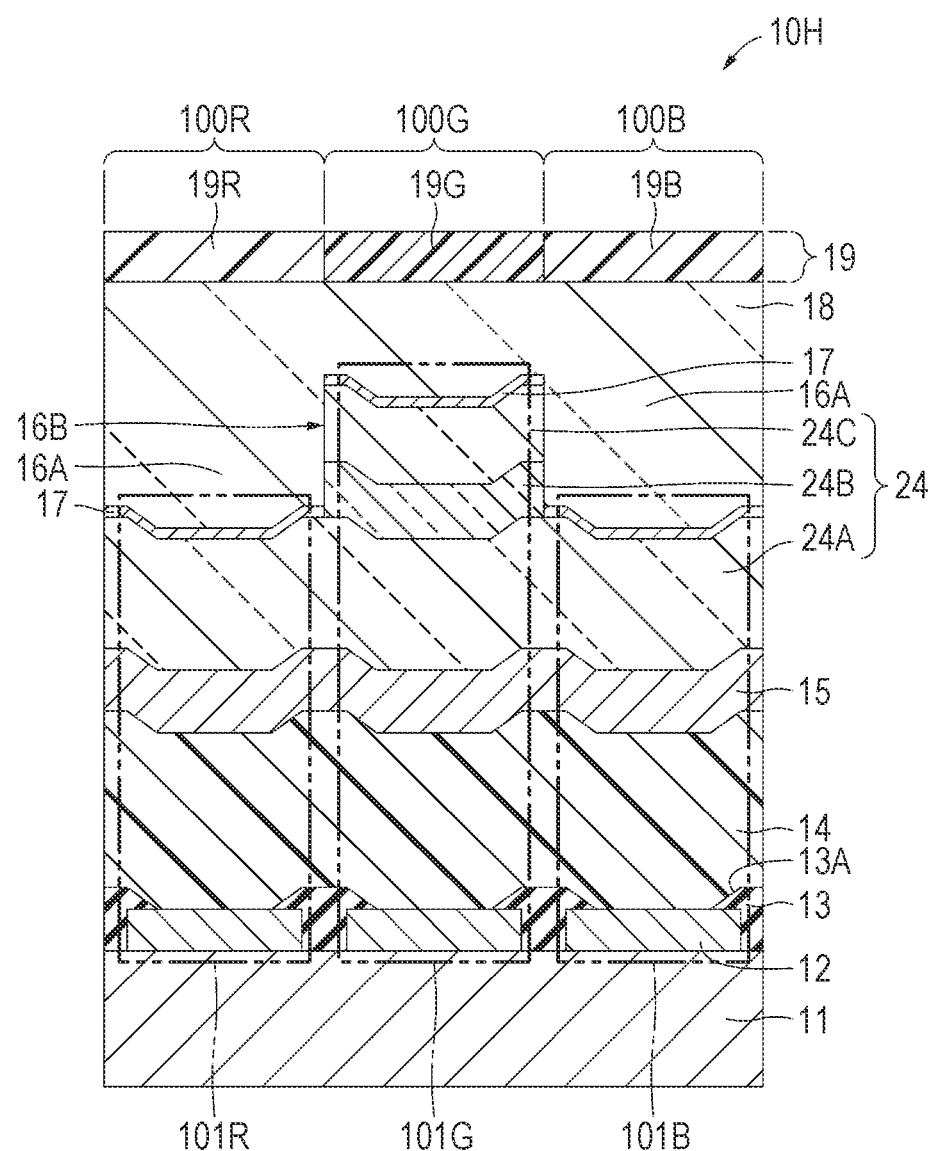
FIG. 20 is a cross-sectional view illustrating an example of a configuration of a display device according to Modification 19.

FIG. 20 is a cross-sectional view illustrating an example of a configuration of a display device 10H according to Modification 19. The display device 10H is different from the display device 10B according to Modification 2 (see FIG. 9) in that it includes an optical adjustment layer 24 instead of the optical adjustment layer 16.

The optical adjustment layer 24 has a protrusion 16B in each of portions corresponding to the plurality of sub-pixels 100G. The optical adjustment layer 24 includes an inorganic layer 24A, an organic layer 24B, and an inorganic layer 24C on the first surface of the second electrode 15 in that order. The protrusion 16B is formed by a stacked body of the organic layer 24B and the inorganic layer 24C. The stacked body of the organic layer 24B and the inorganic layer 24C has an opening 16A in each of portions corresponding to the plurality of sub-pixels 100R and 100B.

The inorganic layer 24A is similar to the first optical adjustment layer 22A in Modification 13 (see FIG. 14) except that the inorganic layer 24A is formed by an inorganic material. The organic layer 24B and the inorganic layer 24C are similar to the organic layer 23A and the inorganic layer 23B in Modification 19 (see FIG. 19), respectively.

An etching selectivity ($S_f/S_e$) of the organic layer 24B to the inorganic layer 24A is preferably 5 or more, more preferably 10 or more, and still more preferably 15 or more. If the etching selectivity ($S_f/S_e$) is 5 or more, it is possible to suppress a decrease in the thickness of the inorganic layer 24A due to etching when the opening 16A is formed in the organic layer 24B and the inorganic layer 24C by etching. In the present specification, the etching selectivity ($S_f/S_e$) of the organic layer 24B to the inorganic layer 24A represents an etching rate ratio ($S_f/S_e$) of an etching rate $S_f$ of the organic layer 23A to an etching rate $S_e$ of the inorganic layer 23B.

In the display device 10H according to Modification 19, the optical adjustment layer 23 includes the inorganic layer 24A, the organic layer 24B, and the inorganic layer 24C in that order. Since the etching selectivity ($S_f/S_e$) of the organic layer 24B to the inorganic layer 24A is large, it is possible to suppress a decrease in the thickness of the inorganic layer 24A due to etching when the organic layer 24B and the inorganic layer 24C are processed by etching to form the opening 16A. Therefore, since the processing accuracy of the depth of the opening 16A can be improved, the accuracy of the optical path length between the first electrode 12 and the semi-transmissive reflective layer 17 in the sub-pixel 100R and the sub-pixel 100B can be improved.

[Modification 20]

Figure 21:
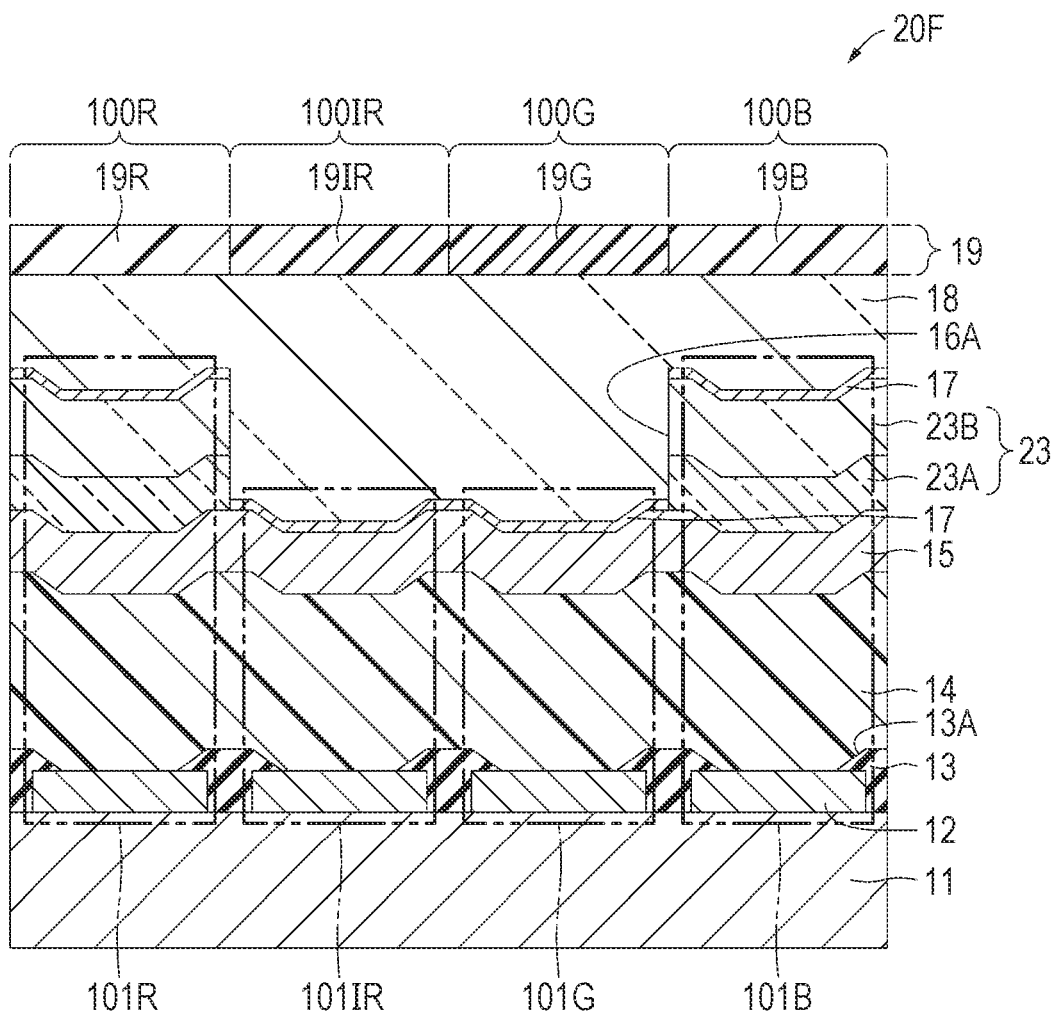
FIG. 21 is a cross-sectional view illustrating an example of a configuration of a display device according to Modification 20.

FIG. 21 is a cross-sectional view illustrating an example of a configuration of a display device 20F according to Modification 20. The display device 20F is different from the display device 20 according to the second embodiment (see FIG. 7) in that it includes an optical adjustment layer 23 instead of the optical adjustment layer 16.

In Modification 20, the optical adjustment layer 23 has an opening 16A in each of portions corresponding to the plurality of sub-pixels 100G and the plurality of sub-pixels 100IR, respectively.

As described above, in the display device 20F according to Modification 20, the optical adjustment layer 23 includes the organic layer 23A and the inorganic layer 23B on the first surface of the second electrode 15 in that order. Accordingly, the etching selectivity ($S_c/S_a$) of the organic layer 23A to the second electrode 15 can be increased. Therefore, the progress of etching is easily stopped by the second electrode 15 when the optical adjustment layer 23 is processed by etching to form the opening 16A. That is, the accuracy of the optical path length between the first electrode 12 and the semi-transmissive reflective layer 17 in the sub-pixel 100G and the sub-pixel 100IR can be improved.

[Modification 21]

Figure 22:
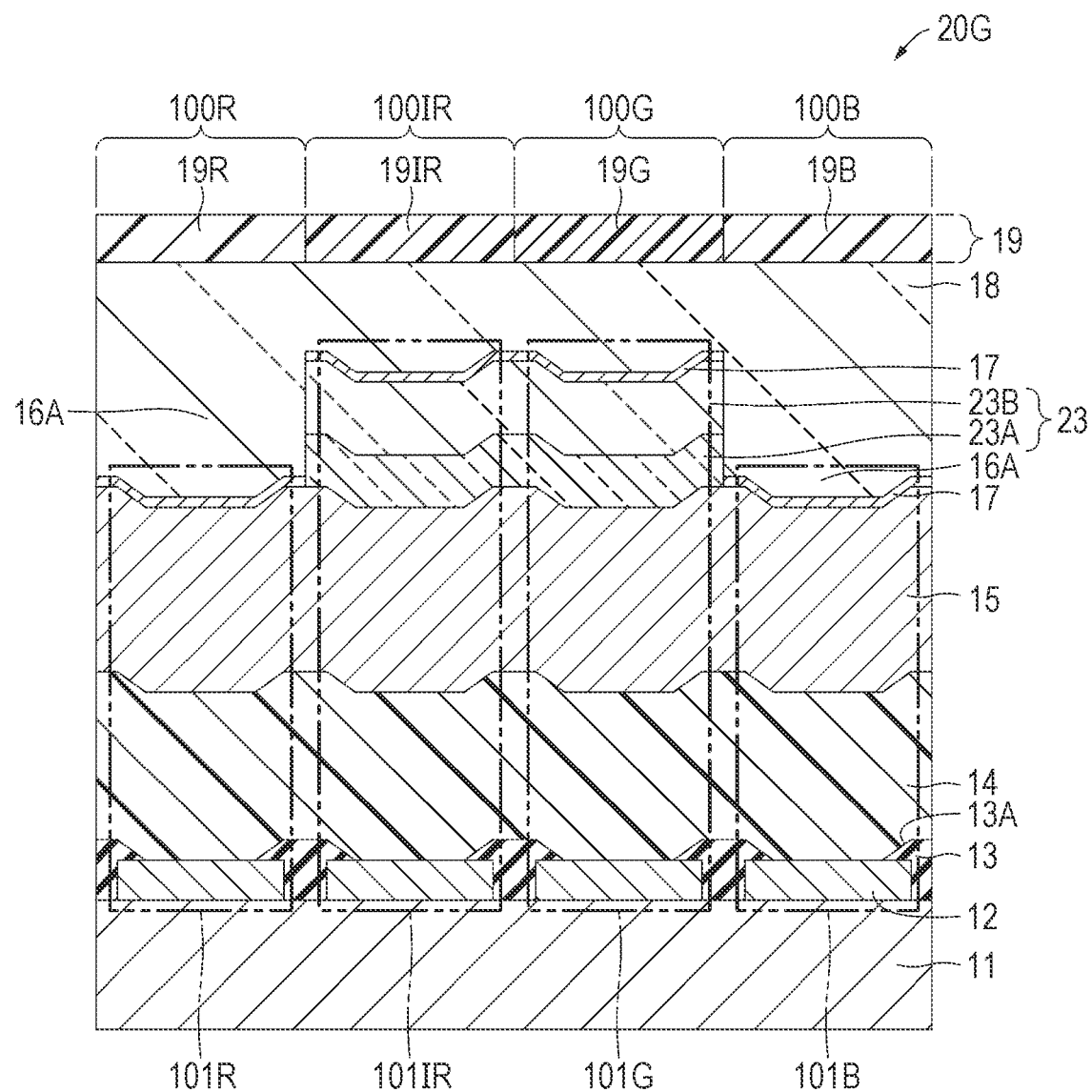
FIG. 22 is a cross-sectional view illustrating an example of a configuration of a display device according to Modification 21.

FIG. 22 is a cross-sectional view illustrating an example of a configuration of a display device 20G according to Modification 21. The display device 20G is different from the display device 20A according to Modification 3 (see FIG. 10) in that it includes an optical adjustment layer 23 instead of the optical adjustment layer 16.

In the optical adjustment layer 23, the optical adjustment layer 23 has an opening 16A in each of portions corresponding to the plurality of sub-pixels 100R and 100B.

In the display device 20G according to Modification 21, the optical adjustment layer 23 includes the organic layer 23A and the inorganic layer 23B on the first surface of the second electrode 15 in that order. Accordingly, the etching selectivity ($S_c/S_a$) of the organic layer 23A to the second electrode 15 can be increased. Therefore, the progress of etching is easily stopped by the second electrode 15 when the optical adjustment layer 23 is processed by etching to form the opening 16A. That is, the accuracy of the optical path length between the first electrode 12 and the semi-transmissive reflective layer 17 in the sub-pixel 100R and the sub-pixel 100B can be improved.

[Modification 22]

Figure 23:
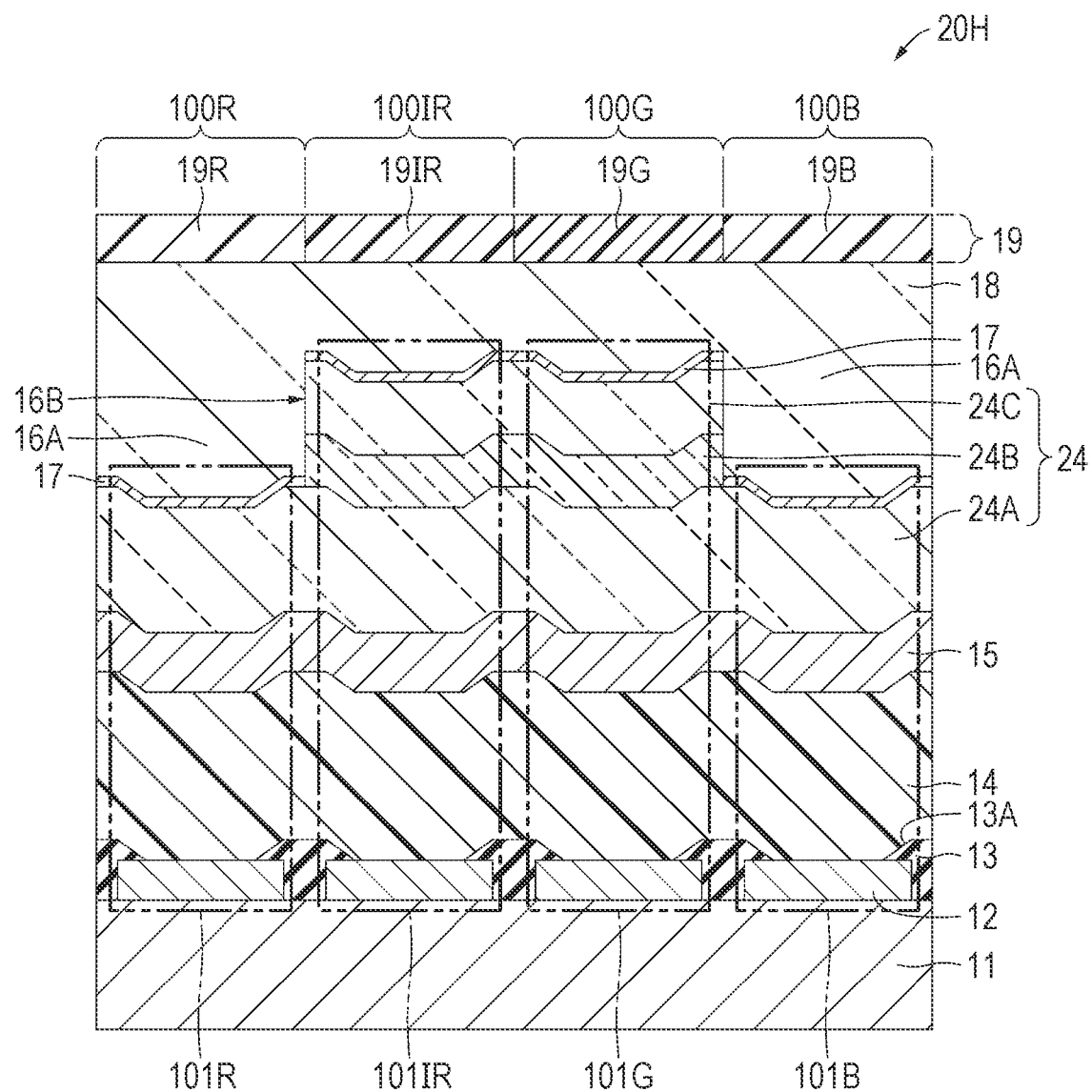
FIG. 23 is a cross-sectional view illustrating an example of a configuration of a display device according to Modification 22.

FIG. 23 is a cross-sectional view illustrating an example of a configuration of a display device 20H according to Modification 22. The display device 20H is different from the display device 20B according to Modification 4 (see FIG. 11) in that it includes an optical adjustment layer 23 instead of the optical adjustment layer 16.

In Modification 22, the optical adjustment layer 24 has a protrusion 16B in each of portions corresponding to the plurality of sub-pixels 100G and 100IR. The stacked body of the organic layer 24B and the inorganic layer 24C has an opening 16A in each of portions corresponding to the plurality of sub-pixels 100R and 100B.

As described above, in the display device 20H according to Modification 22, the optical adjustment layer 23 includes the inorganic layer 24A, the organic layer 24B, and the inorganic layer 24C on the first surface of the second electrode 15 in that order. Accordingly, the etching selectivity ($S_f/S_e$) of the organic layer 24B to the inorganic layer 24A can be increased. Therefore, it is possible to suppress a decrease in the thickness of the inorganic layer 24A due to etching when the organic layer 24B and the inorganic layer 24C are processed by etching to form the opening 16A. Therefore, since the processing accuracy of the depth of the opening 16A can be improved, the accuracy of the optical path length between the first electrode 12 and the semi-transmissive reflective layer 17 in the sub-pixel 100R and the sub-pixel 100B can be improved.

[Modification 23]

Figure 24:
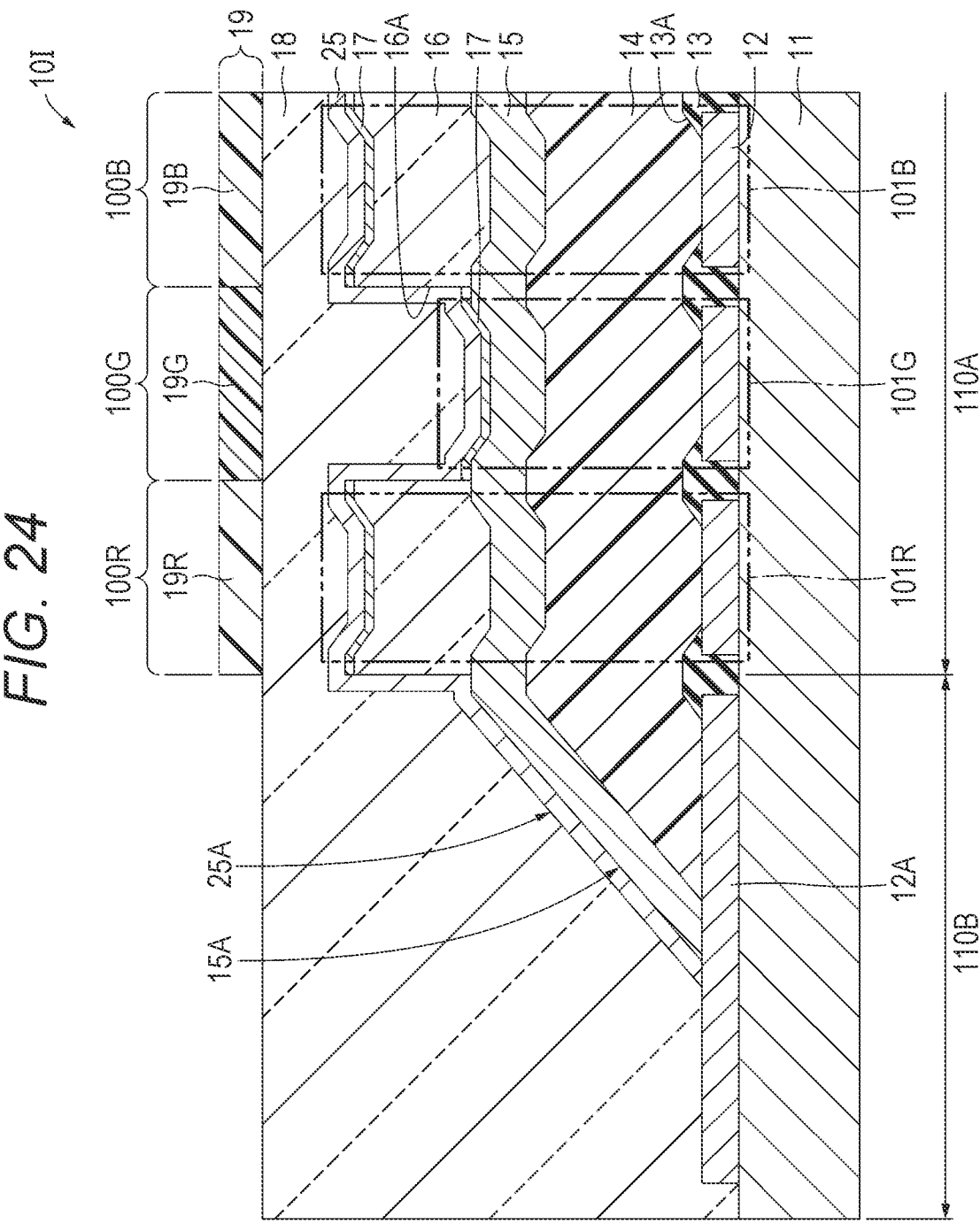
FIG. 24 is a cross-sectional view illustrating an example of a configuration of a display device according to Modification 23.

FIG. 24 is a cross-sectional view illustrating an example of a configuration of a display device 10I according to Modification 23. The display device 10I is different from the display device 10 according to the first embodiment (see FIG. 3) in that it further includes a transparent electrode 25.

The transparent electrode 25 is an auxiliary electrode that electrically connects the semi-transmissive reflective layer 17 and the contact portion 12A. The transparent electrode 25 has transparency to light generated in the organic EL layer 14. The transparent electrode 25 is provided on the first surface of the semi-transmissive reflective layer 17 to follow the irregularities formed by the plurality of openings 16A. A peripheral edge portion 25A of the transparent electrode 25 extends to the peripheral region 110B. The peripheral edge portion 25A of the transparent electrode 25 may be directly connected to the first surface of the contact portion 12A, or the peripheral edge portion 25A of the transparent electrode 25 may be electrically connected to the first surface of the contact portion 12A to sandwich the peripheral edge portion 15A of the second electrode 15 therebetween.

The transparent electrode 25 is formed by, for example, at least one of a metal layer or a transparent conductive oxide layer. More specifically, the second electrode 15 is formed by a single layer film of a metal layer or a transparent conductive oxide layer, or a stacked film of a metal layer and a transparent conductive oxide layer. As the metal layer, a material similar to the metal of the second electrode 15 can be exemplified. As the transparent conductive oxide, a material similar to the transparent conductive oxide of the second electrode 15 can be exemplified.

In the display device 10I according to Modification 23, since the display device 10I further includes the transparent electrode 25, the resistance of the second electrode 15 can be reduced.

Figure 25:
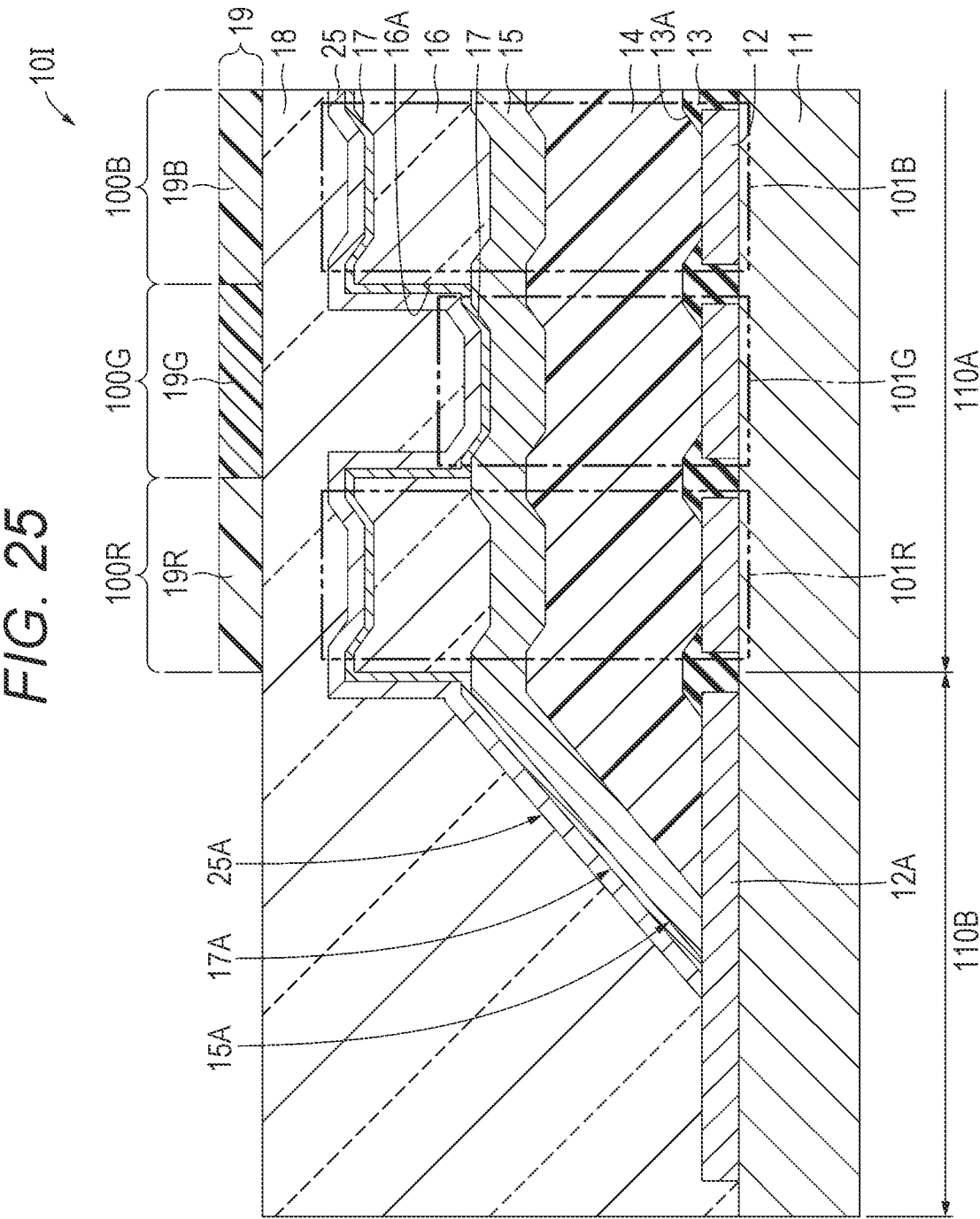
FIG. 25 is a cross-sectional view illustrating another example of a configuration of the display device according to Modification 23.

FIG. 24 illustrates an example in which the semi-transmissive reflective layer 17 is divided between the sub-pixel 100R and the sub-pixel 100G and between the sub-pixel 100G and the sub-pixel 100B. However, as illustrated in FIG. 25, the semi-transmissive reflective layer 17 may be connected between the sub-pixel 100R and the sub-pixel 100G and between the sub-pixel 100G and the sub-pixel 100B. That is, the semi-transmissive reflective layer 17 may be connected between the sub-pixels 100 in the display region 110A. In this case, the resistance of the second electrode 15 can be further reduced.

4 Application Example (Electronic Device)

Figure 26:
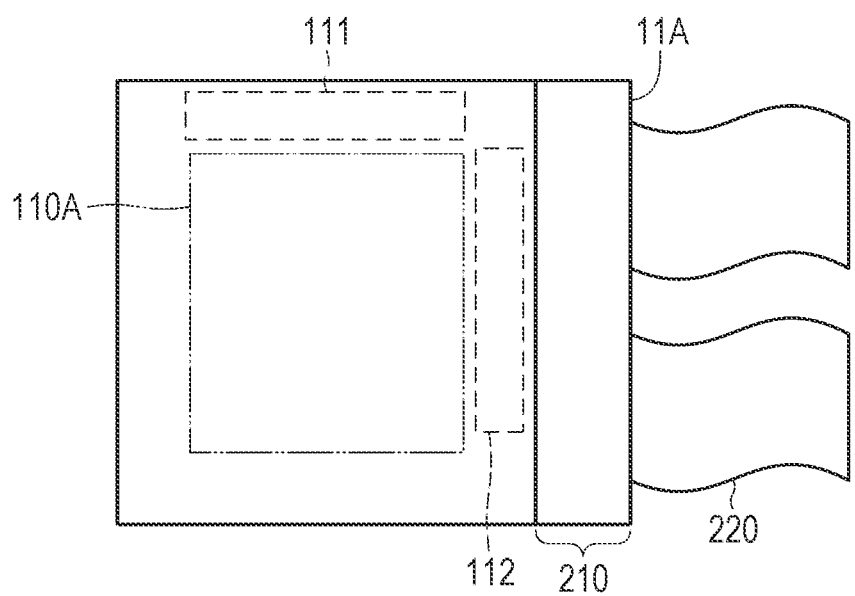
FIG. 26 is a plan view illustrating an example of a schematic configuration of a module.

The display device 10 and the like according to the above-described first and second embodiments and modifications thereof can be used for various electronic devices. The display device 10 and the like may be incorporated in various electronic devices, for example, as a module as illustrated in FIG. 26. In particular, it is suitable for an electronic viewfinder of a video camera or a single-lens reflex camera, a head mounted display, and the like, which require high resolution and are enlarged and used in close proximity to the eyes. This module includes a region 210 exposed without being covered with a counter substrate and the like on one short side of the drive substrate 11, and external connection terminals (not illustrated) are formed in this region 210 by extending wiring of the signal line drive circuit 111 and the scanning line drive circuit 112. A flexible printed circuit (FPC) 220 for inputting and outputting signals may be connected to the external connection terminals.

Specific Example 1

FIGS. 27A and 27B illustrate an example of an external appearance of a digital still camera 310. The digital still camera 310 is of a lens interchangeable single lens reflex type, and includes an interchangeable imaging lens unit (interchangeable lens) 312 substantially at the center in front of a camera body portion (camera body) 311, and a grip portion 313 to be held by a photographer on a front left side.

A monitor 314 is provided at a position shifted to the left from the center of a rear surface of the camera body portion 311. An electronic viewfinder (eyepiece window) 315 is provided above the monitor 314. By looking through the electronic viewfinder 315, the photographer can visually recognize a light image of a subject guided from the imaging lens unit 312 and determine a picture composition. As the electronic viewfinder 315, any of the display device 10 and the like can be used.

Specific Example 2

Figure 28:
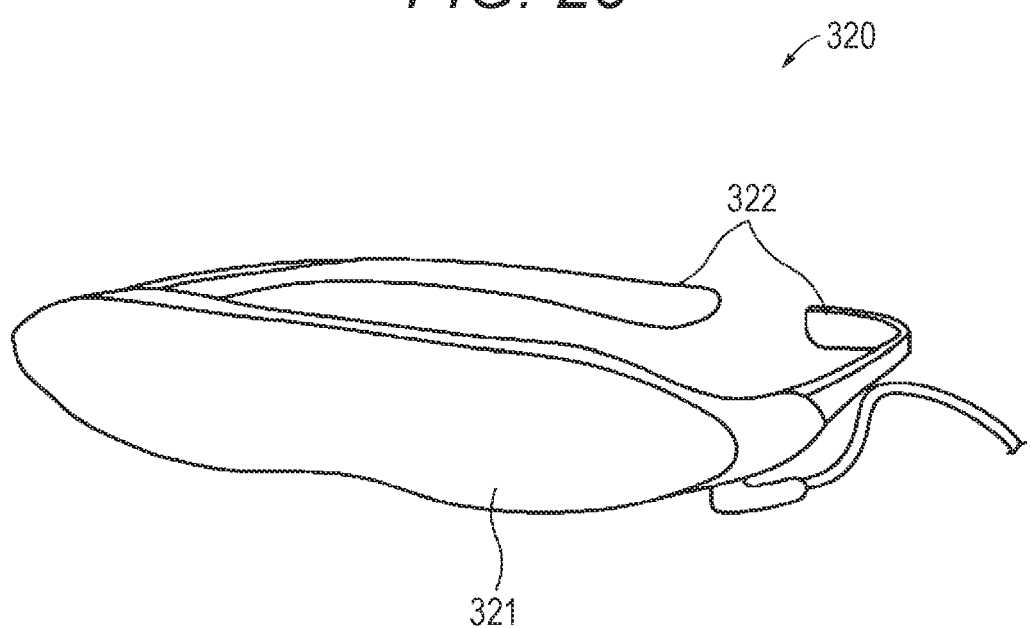
FIG. 28 is a perspective view of an example of an external appearance of a head mounted display.

FIG. 28 illustrates an example of an external appearance of a head mounted display 320. The head mounted display 320 includes, for example, ear hooking portions 322 to be worn on the head of a user on both sides of a glass-shaped display unit 321. As the display unit 321, any one of the display device 10 and the like can be used.

Specific Example 3

Figure 29:
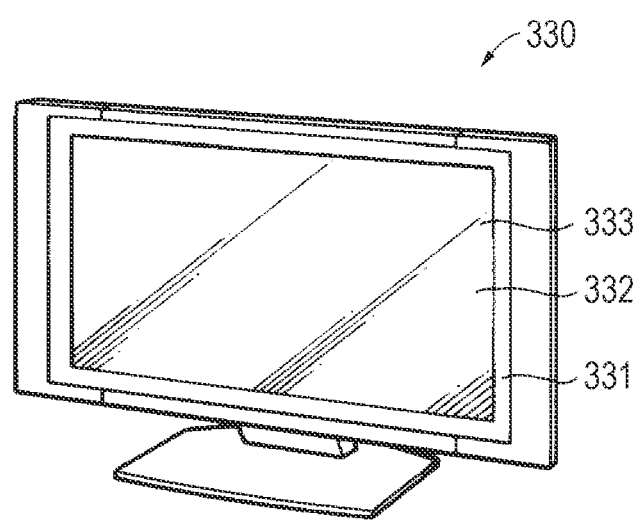
FIG. 29 is a perspective view illustrating an example of an external appearance of a television apparatus.

FIG. 29 illustrates an example of an external appearance of a television apparatus 330. The television apparatus 330 includes, for example, a video display screen unit 331 including a front panel 332 and a filter glass 333, and the video display screen unit 331 includes any of the display device 10 and the like.

5 Simulation Example

Hereinafter, the present disclosure will be specifically described by simulation, but the present disclosure is not limited to these simulations. Note that, in the following simulation, an organic device simulator (setfos (registered trademark), manufactured by Fluxim) was used as simulation software.

[Simulations 1-1, 1-2, 1-3, and 2]

Figure 30:
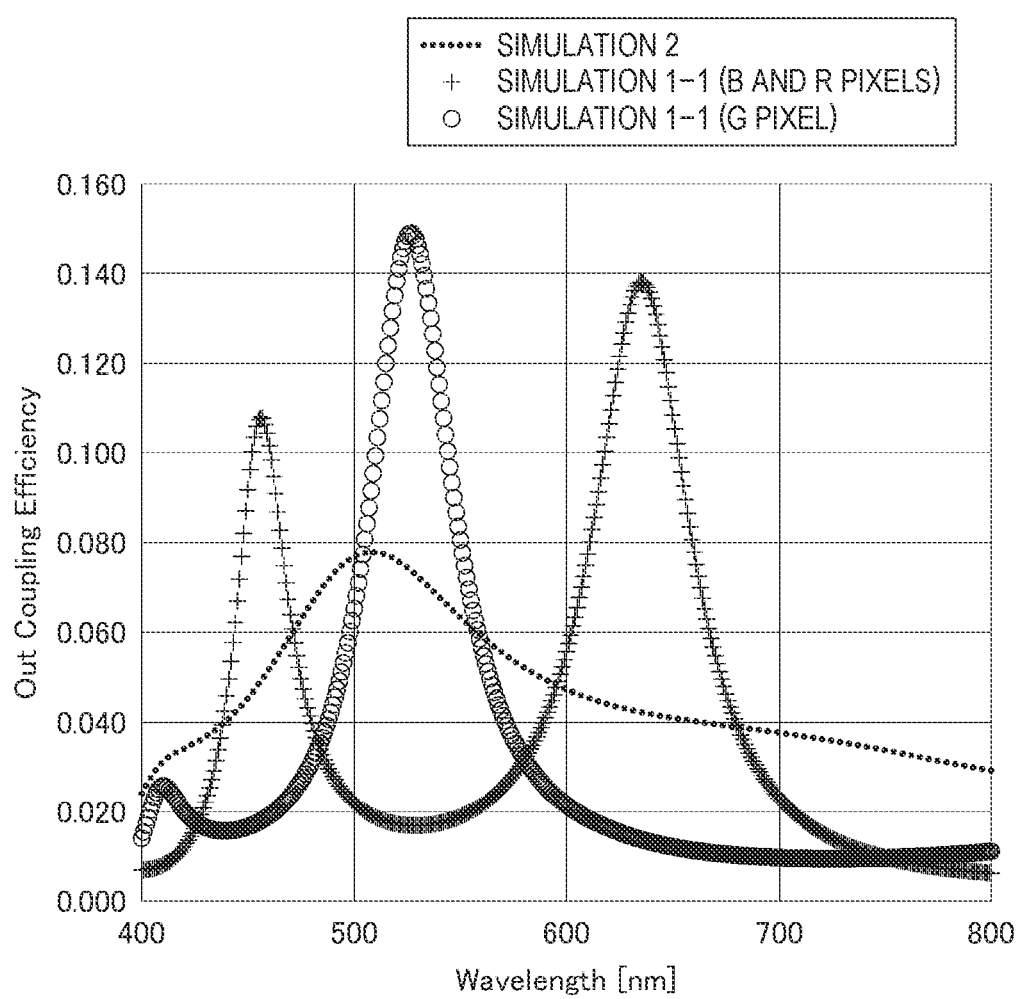
FIG. 30 is a graph showing results of simulations 1-1 and 2.
Figure 31:
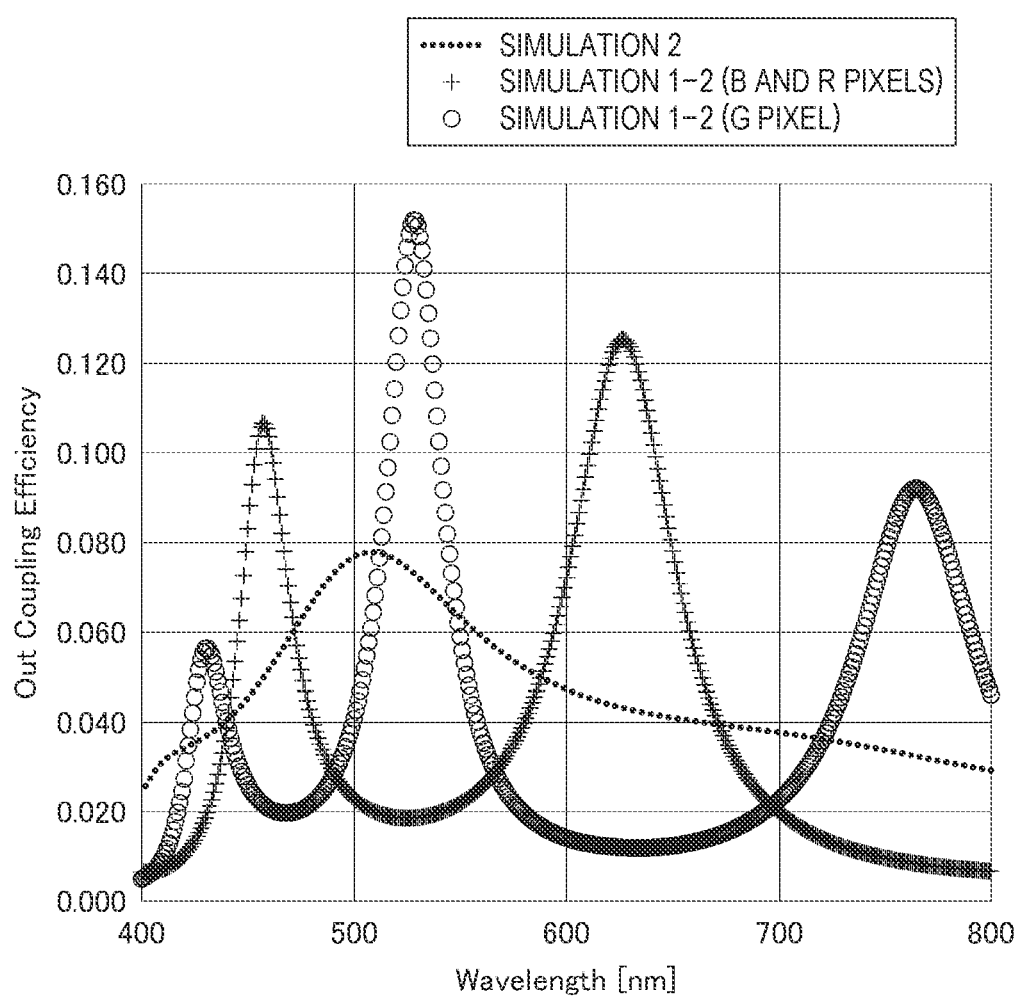
FIG. 31 is a graph showing results of simulations 1-2 and 2.
Figure 32:
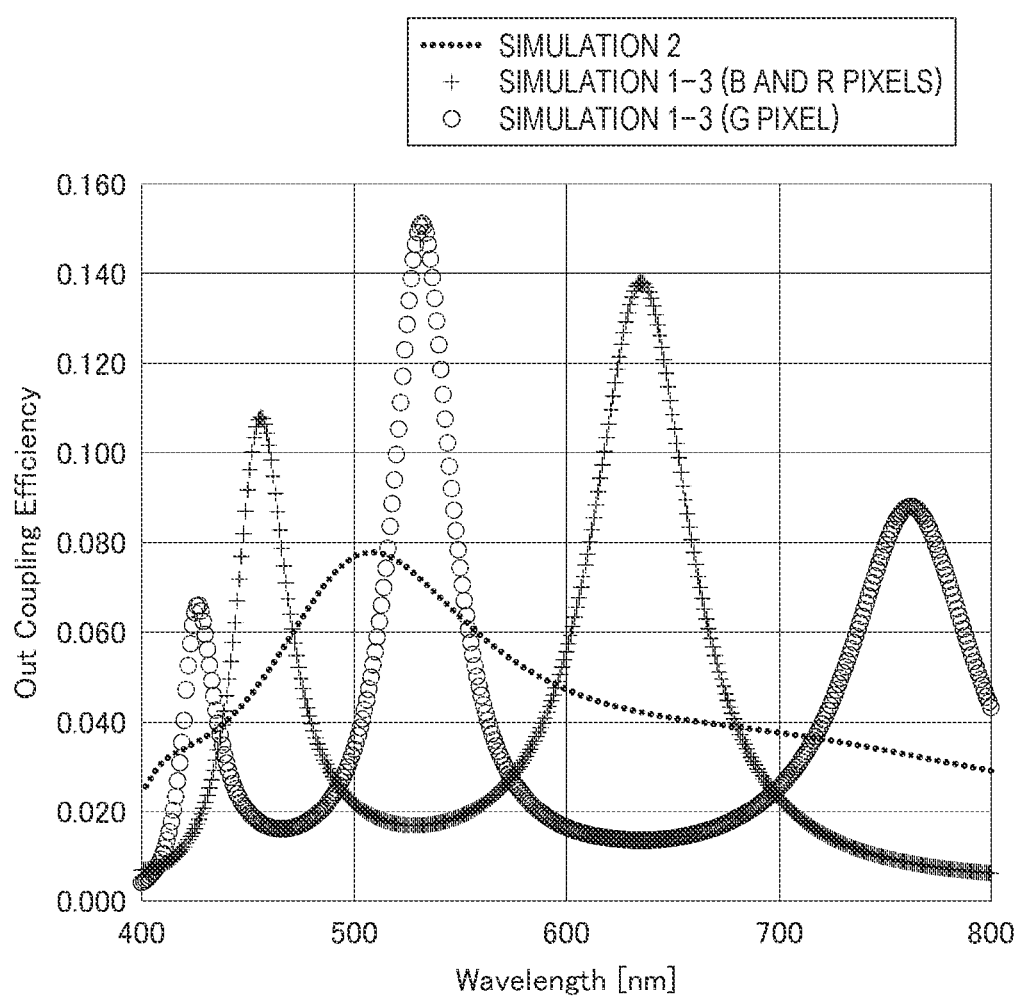
FIG. 32 is a graph showing results of simulations 1-3 and 2.
Figure 36:
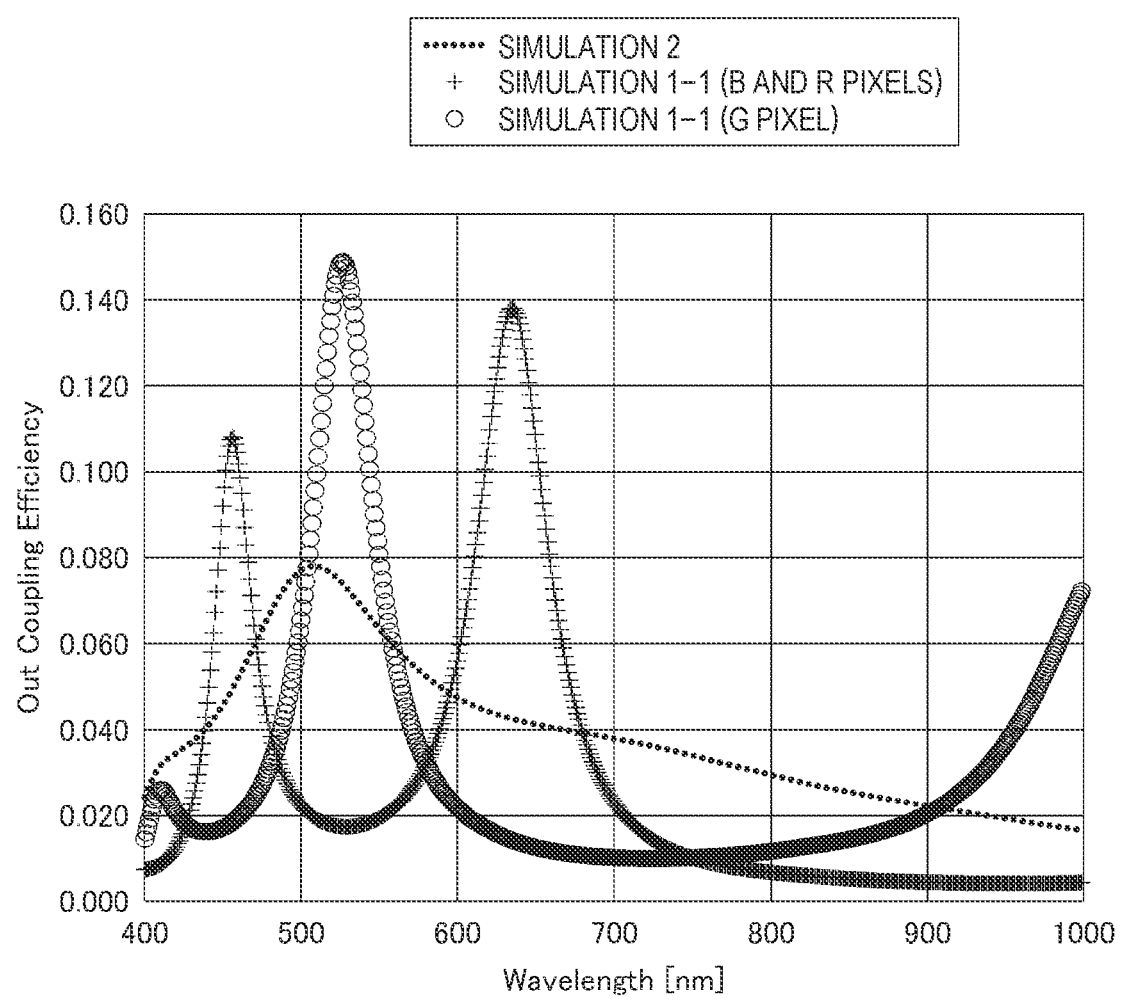
FIG. 36 is a graph showing results of simulations 1-1 and 2.
Figure 37:
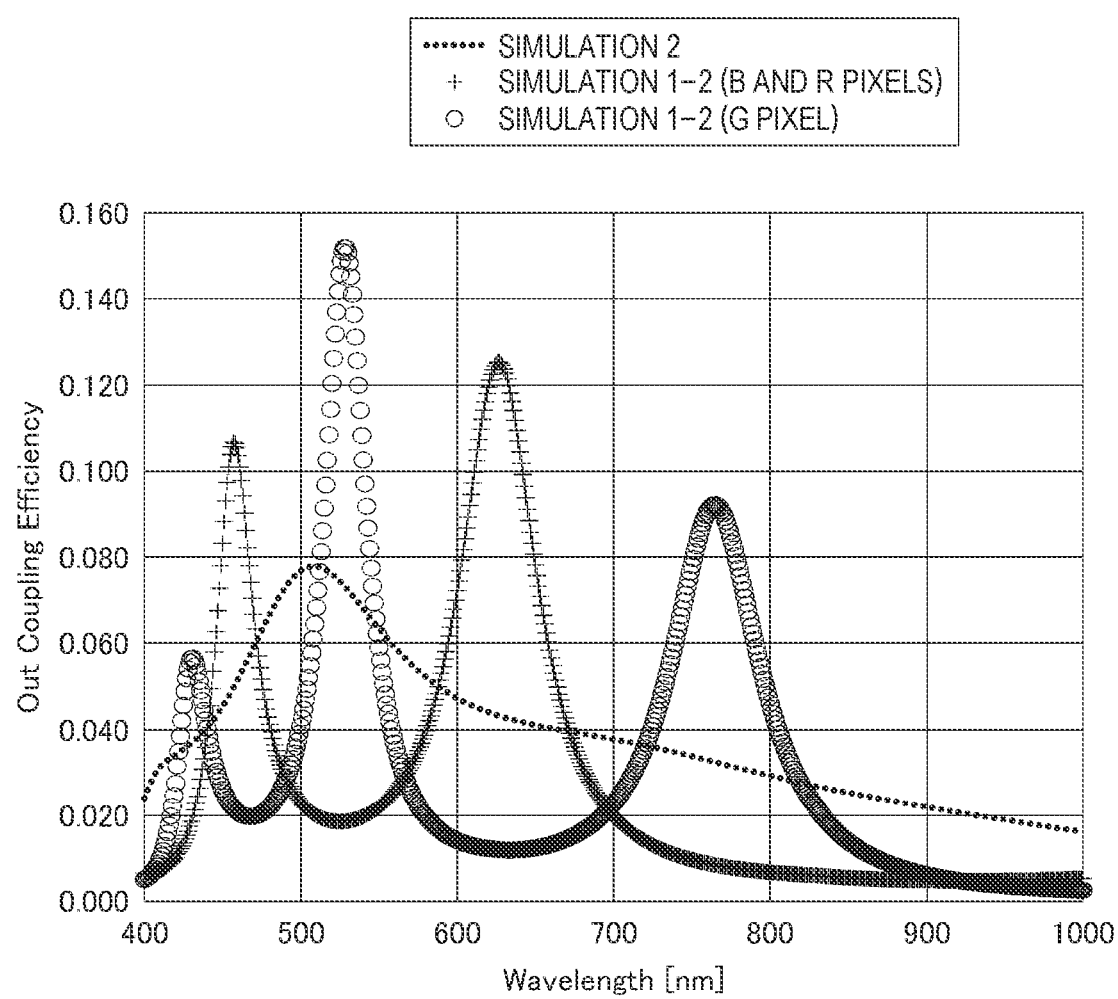
FIG. 37 is a graph showing results of simulations 1-2 and 2.
Figure 38:
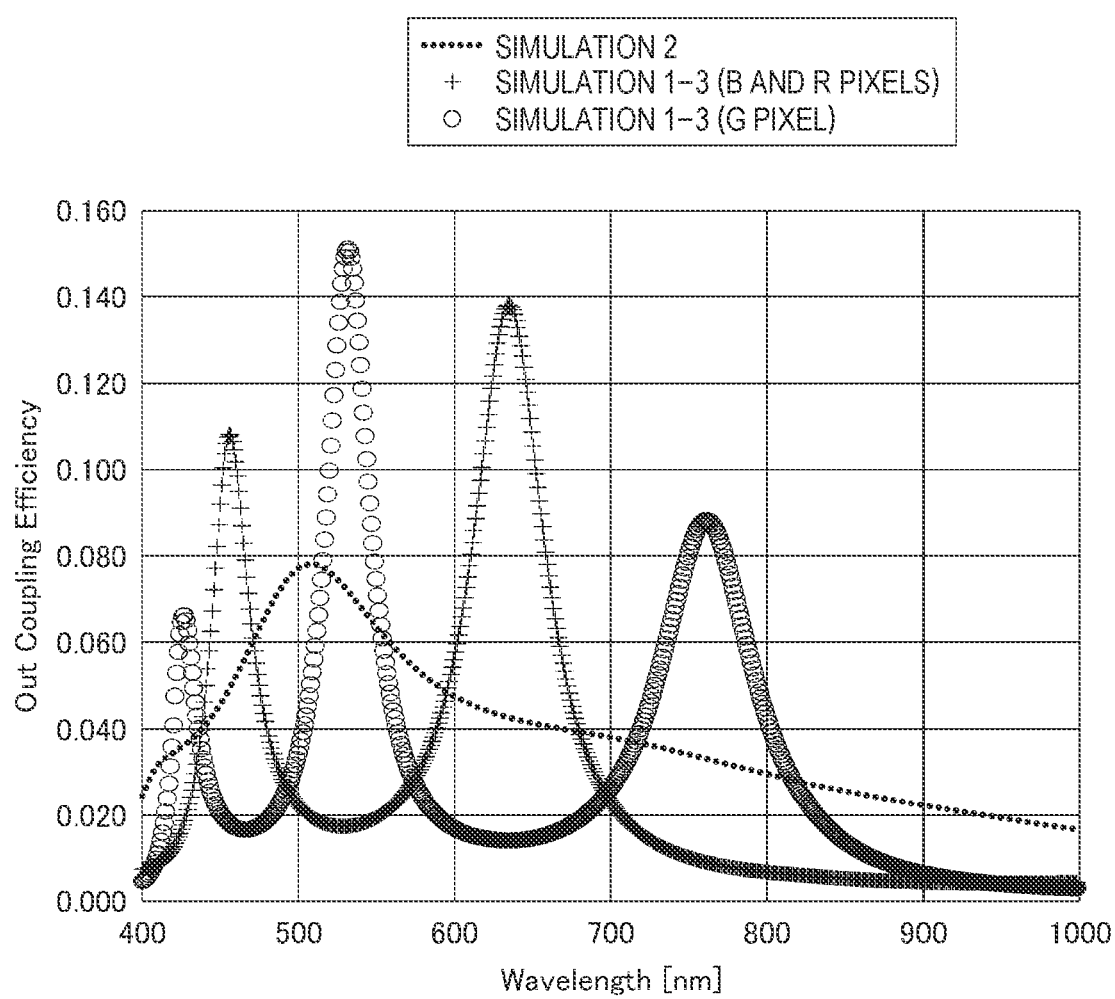
FIG. 38 is a graph showing results of simulations 1-3 and 2.

Simulations 1-1, 1-2, 1-3, and 2 relate to a display device in which an organic EL layer includes a single-layer light-emitting unit. The out coupling efficiency of the display device having the structure shown in Table 1 was obtained by simulation. The configurations of the display devices used in simulations 1-1, 1-2, and 1-3 correspond to the configurations of the display devices illustrated in FIGS. 2, 8, and 9, respectively. However, simulations 1-1, 1-2, and 1-3 were configured without color filters. The results of simulations 1-1, 1-2, and 1-3 in the wavelength range of 400 nm to 800 nm are shown in FIGS. 30, 31, and 32, respectively. The results of simulations 1-1, 1-2, and 1-3 in the wavelength range of 400 nm to 1000 nm are shown in FIGS. 36, 37, and 38, respectively. The results of simulation 2 are shown in all of FIGS. 30, 31, 32, 36, 37, and 38 for comparison with the results of simulations 1-1, 1-2, and 1-3.

[Simulations 3-1, 3-2, 3-3, and 4]

Figure 33:
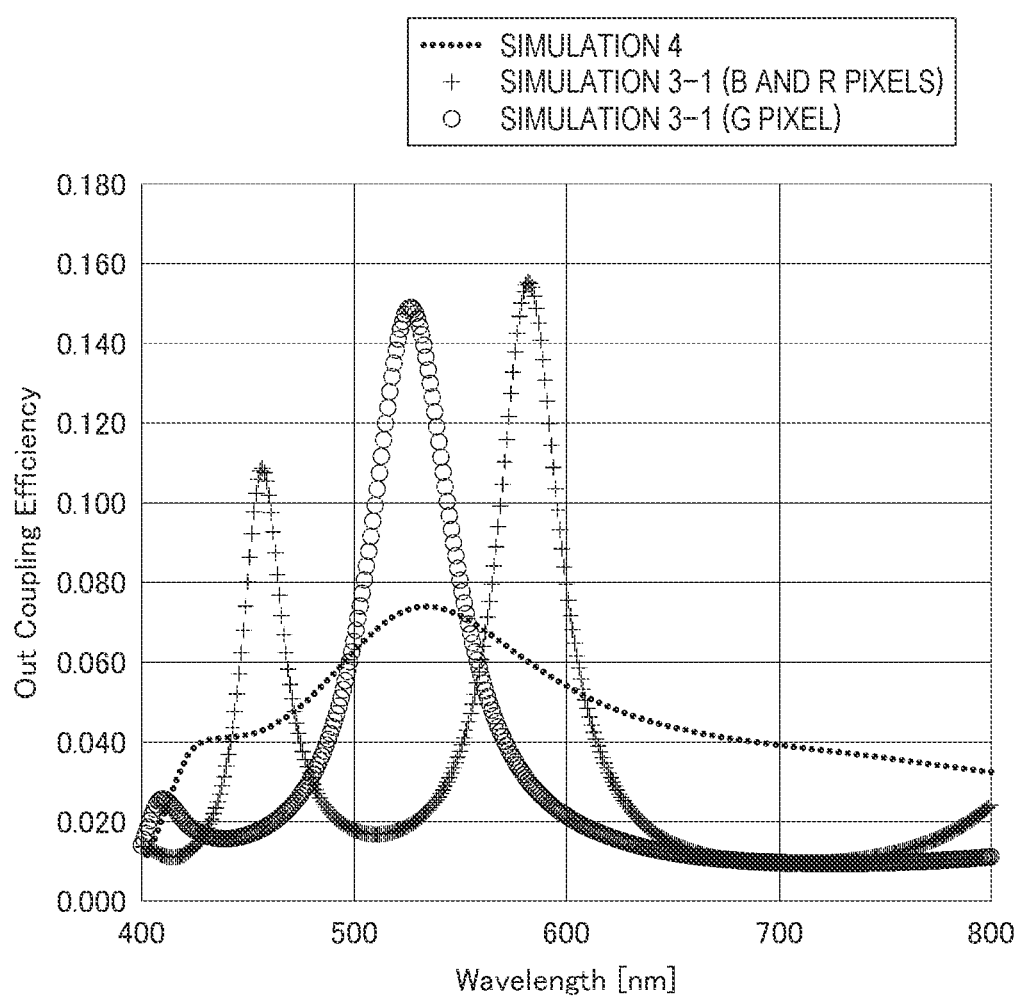
FIG. 33 is a graph showing results of simulations 3-1 and 4.
Figure 34:
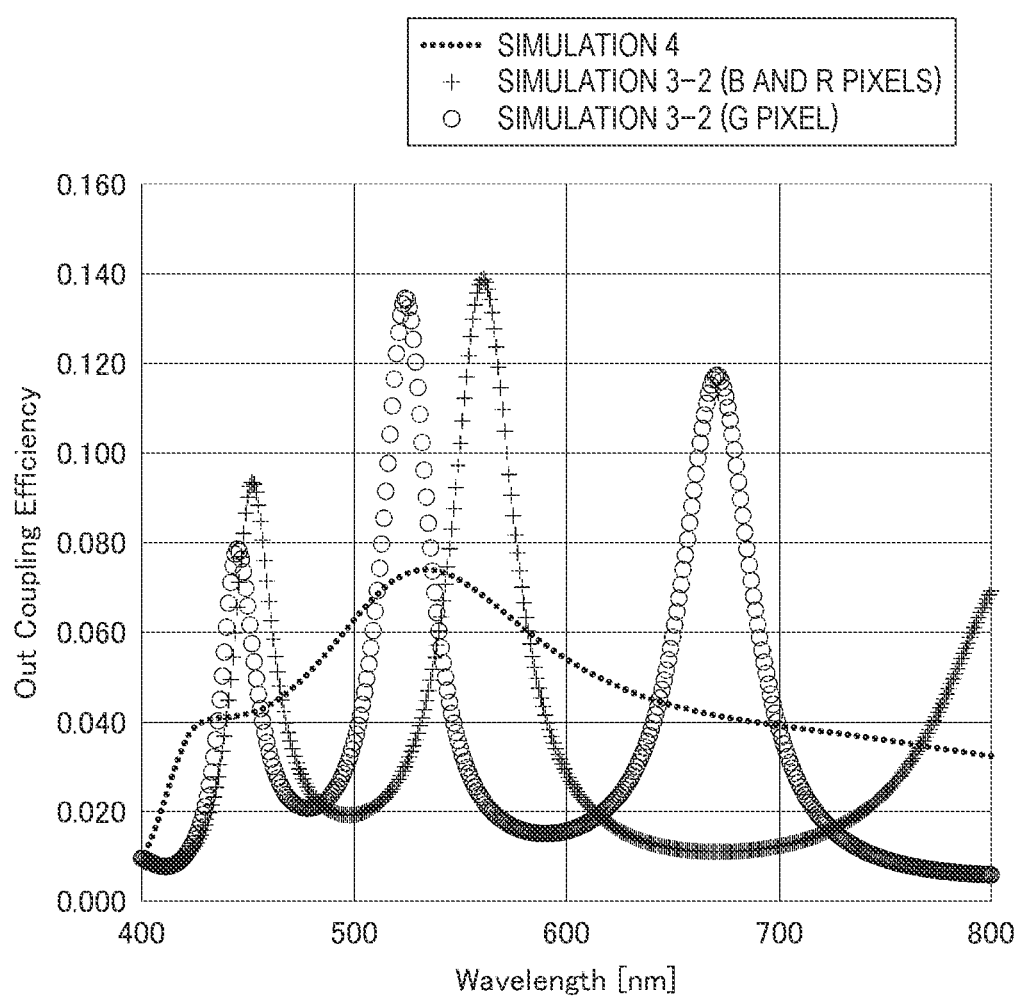
FIG. 34 is a graph showing results of simulations 3-2 and 4.
Figure 35:
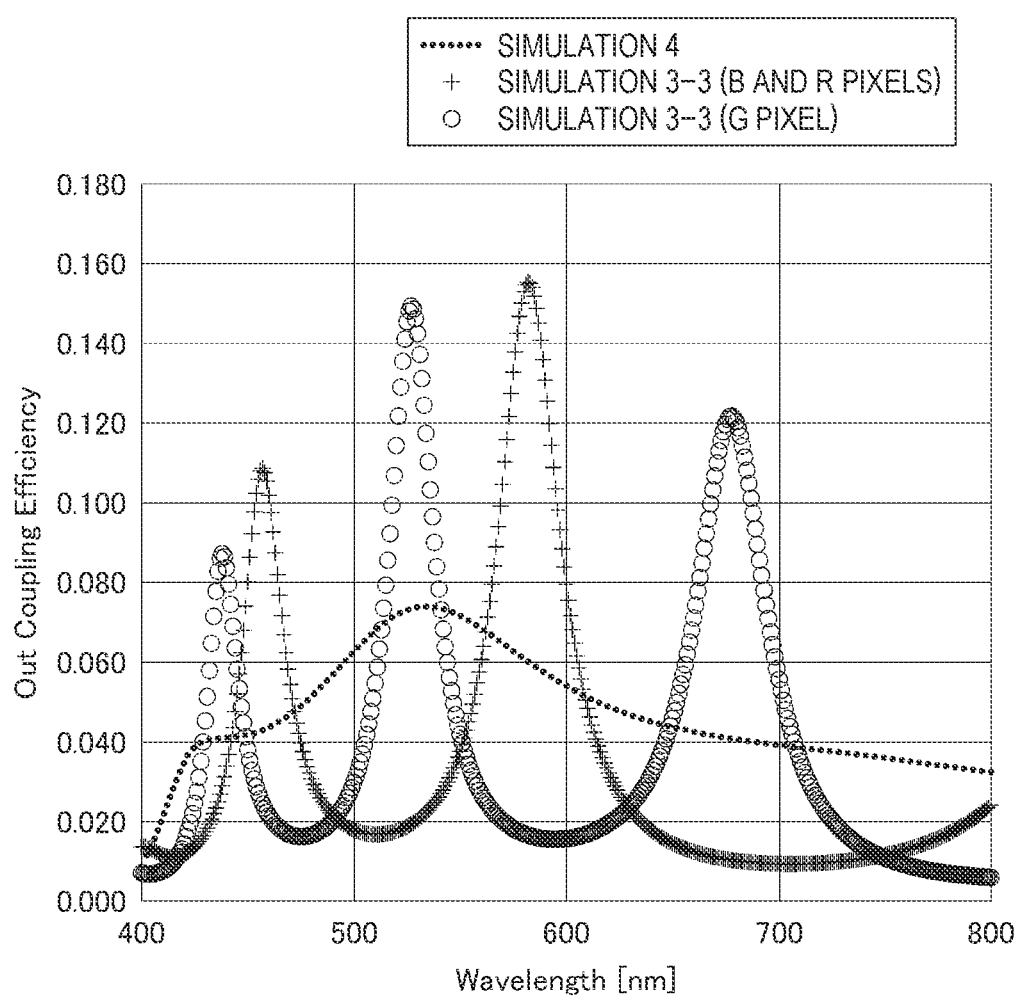
FIG. 35 is a graph showing results of simulations 3-3 and 4.
Figure 39:
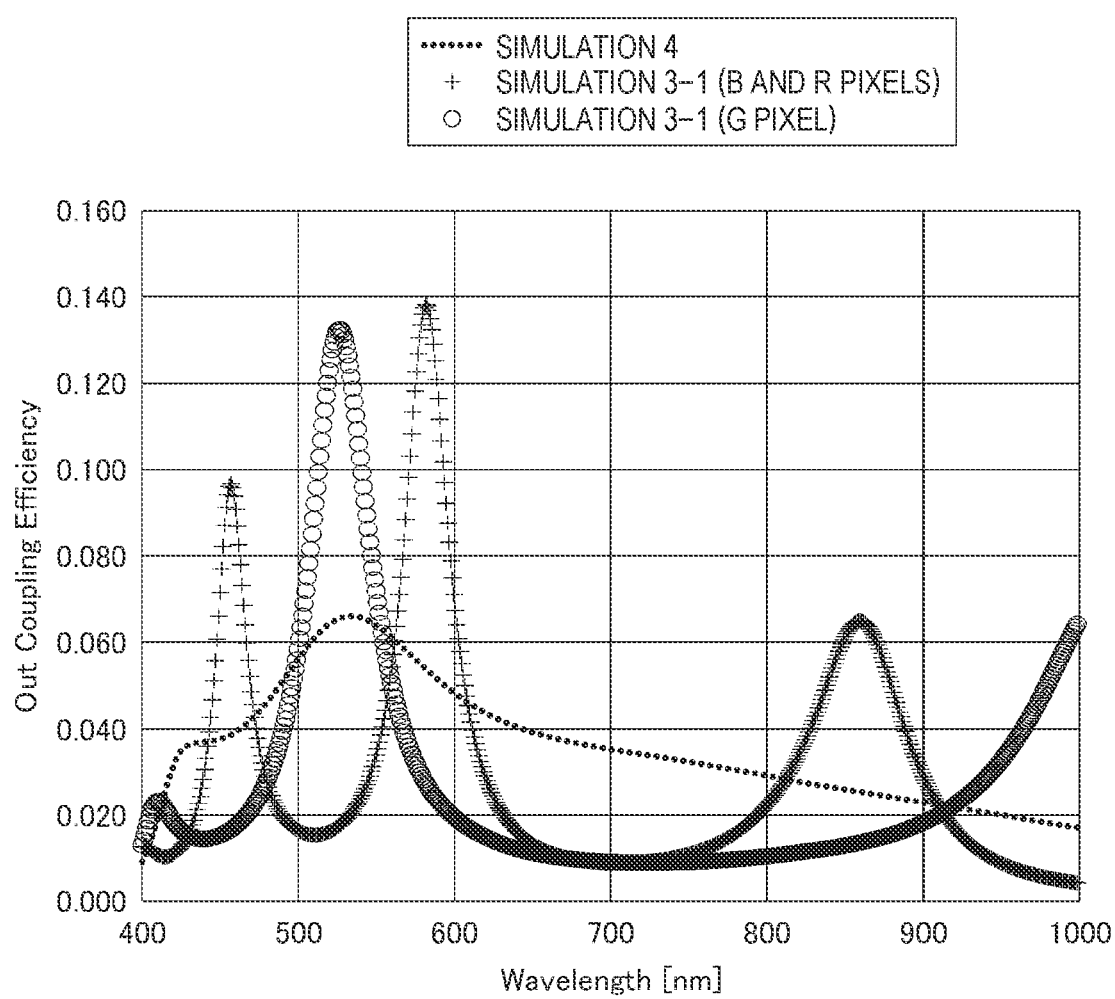
FIG. 39 is a graph showing results of simulations 3-1 and 4.
Figure 40:
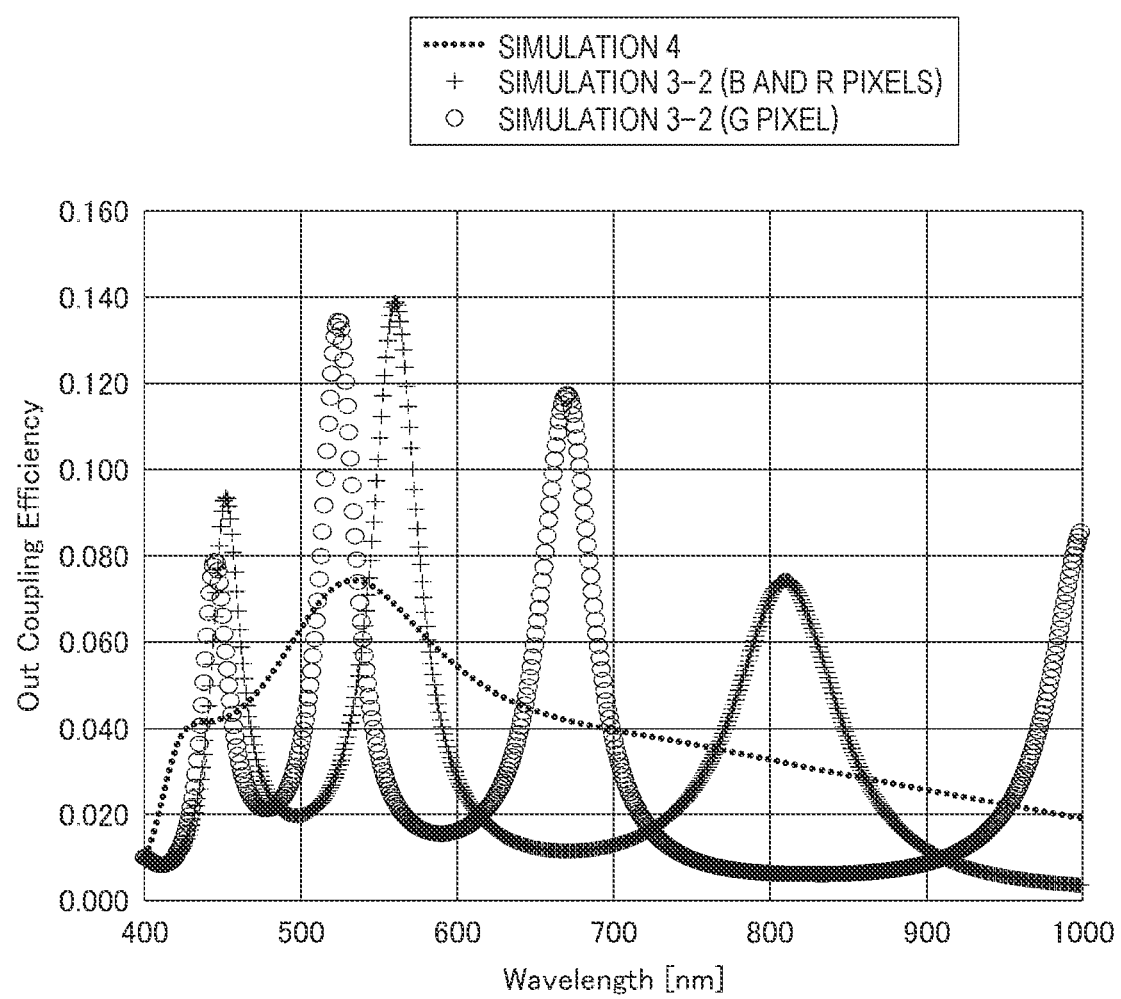
FIG. 40 is a graph showing results of simulations 3-2 and 4.
Figure 41:
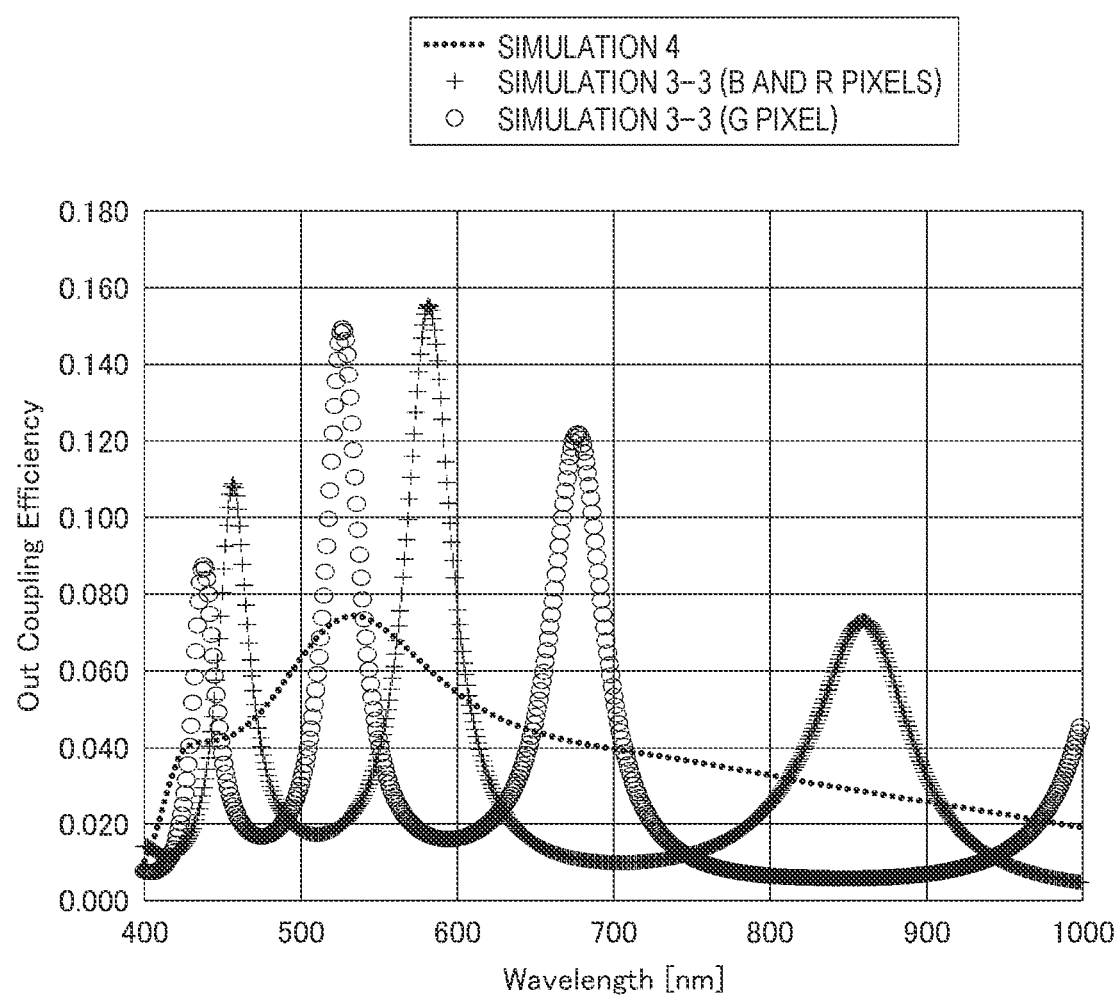
FIG. 41 is a graph showing results of simulations 3-3 and 4.

Simulations 3-1, 3-2, 3-3, and 4 relate to a display device in which an organic EL layer includes a single-layer light-emitting unit. The out coupling efficiency of the display device having the structure shown in Table 2 was obtained by simulation. The configurations of the display devices used in simulations 3-1, 3-2, and 3-3 correspond to the configurations of the display devices illustrated in FIGS. 2, 8, and 9, respectively. However, simulations 3-1, 3-2, and 3-3 were configured without color filters. The results of simulations 3-1, 3-2, and 3-3 in the wavelength range of 400 nm to 800 nm are shown in FIGS. 33, 34, and 35, respectively. The results of simulations 3-1, 3-2, and 3-3 in the wavelength range of 400 nm to 1000 nm are shown in FIGS. 39, 40, and 41, respectively. The results of simulation 4 are shown in all of FIGS. 33, 34, 35, 39, 40, and 41 for comparison with the results of simulations 3-1, 3-2, and 3-3.

[Simulations 5-1, 5-2, 5-3, and 6]

Figure 42:
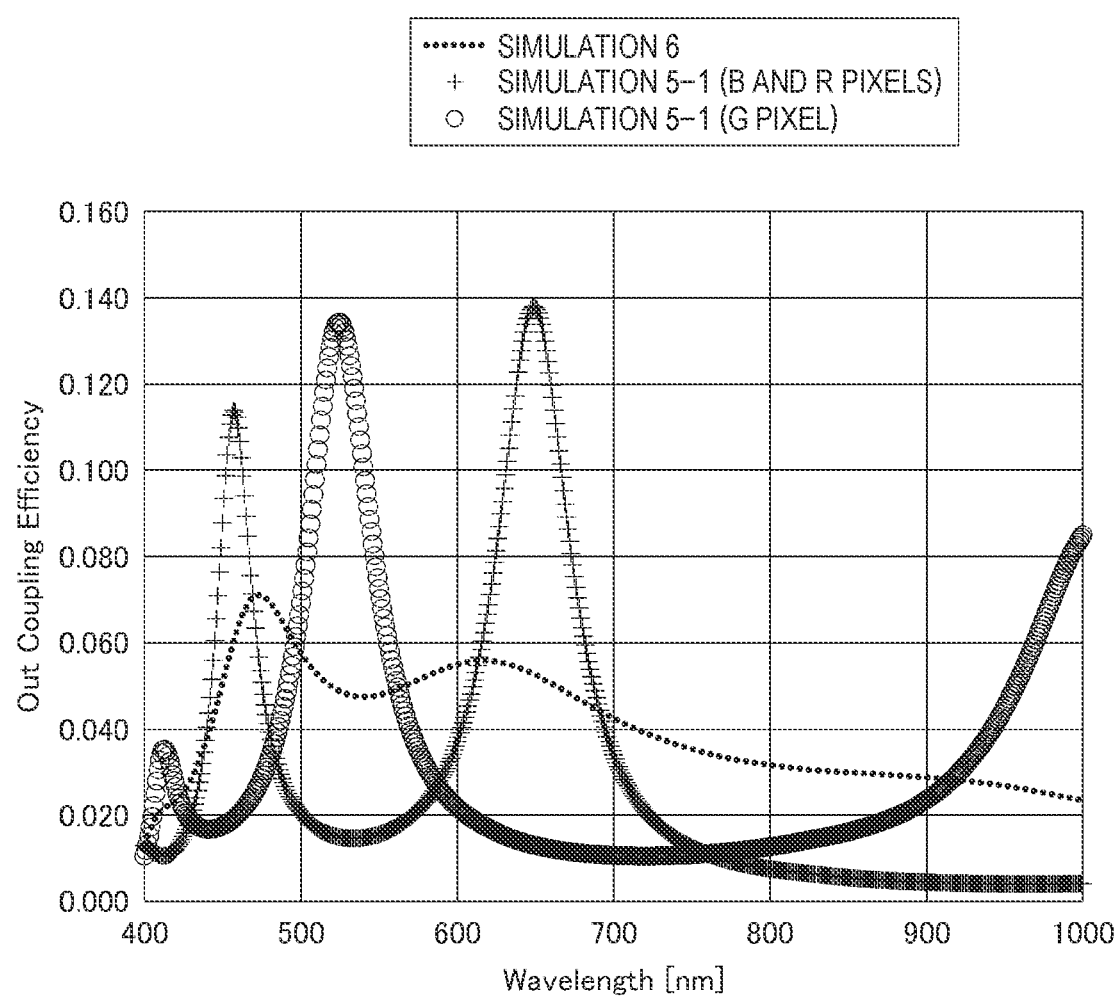
FIG. 42 is a graph showing results of simulations 5-1 and 6.
Figure 43:
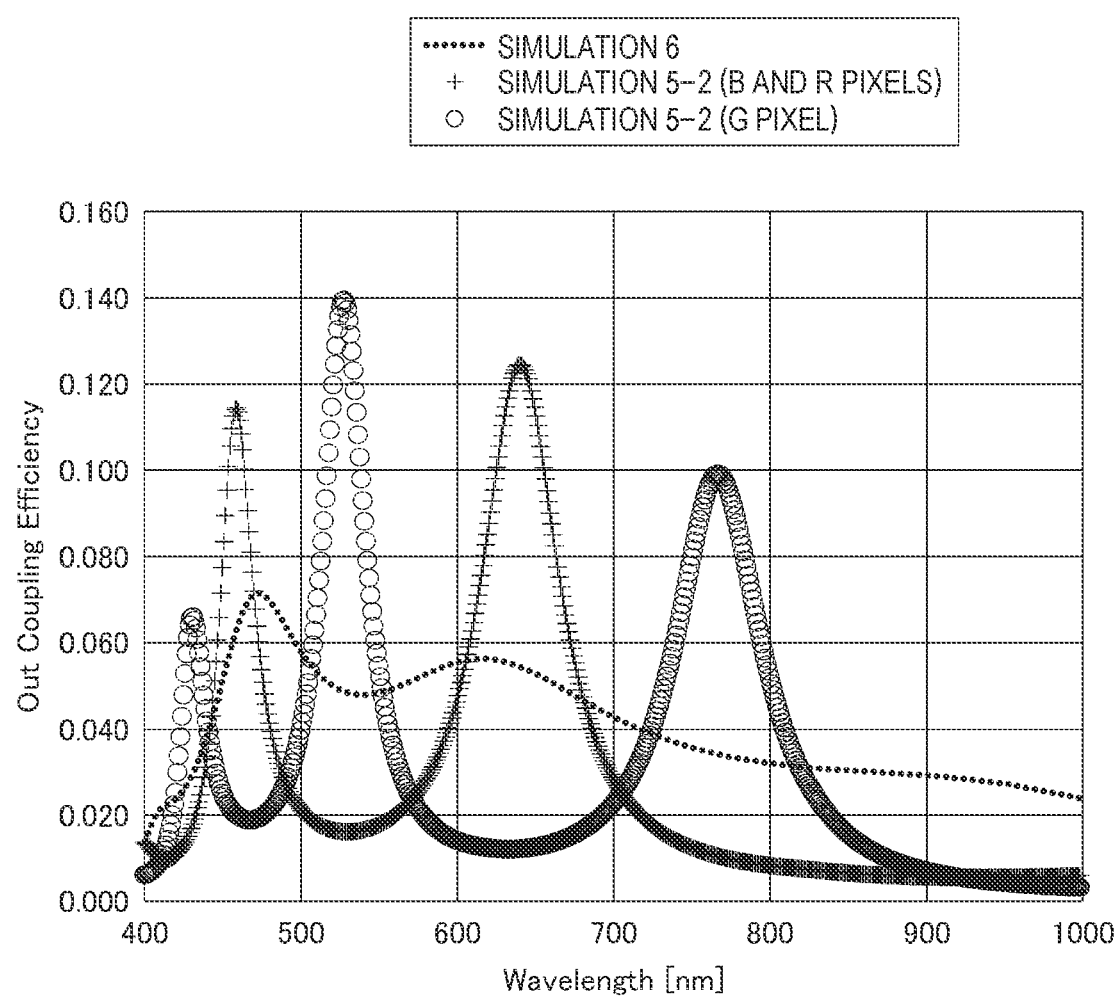
FIG. 43 is a graph showing results of simulations 5-2 and 6.
Figure 44:
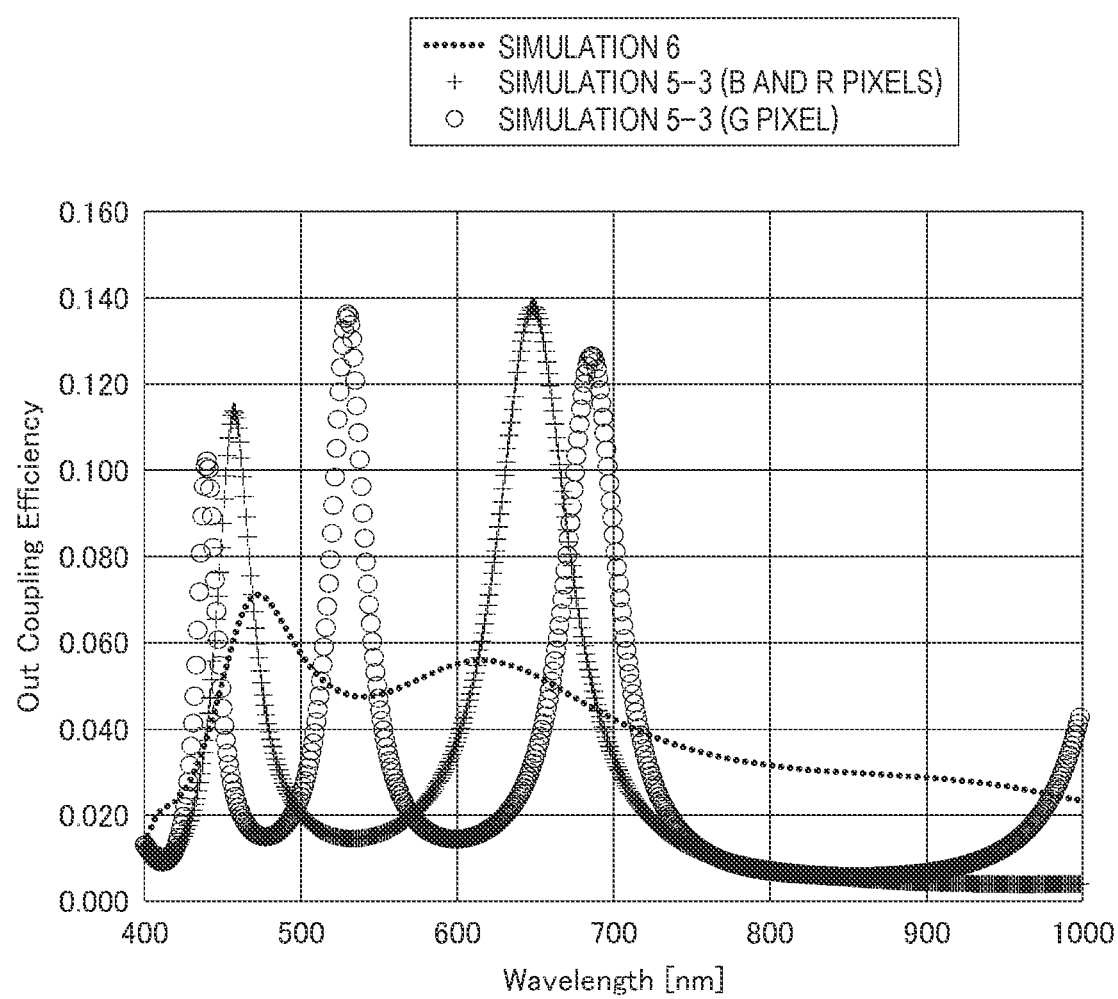
FIG. 44 is a graph showing results of simulations 5-3 and 6.

Simulations 5-1, 5-2, 5-3, and 6 relate to a display device in which an organic EL layer includes a two-layer light-emitting unit (light-emitting unit having a tandem structure). The out coupling efficiency of the display device having the structure shown in Table 3 was obtained by simulation. The configurations of the display devices used in simulations 5-1, 5-2, and 5-3 correspond to the configurations of the display devices illustrated in FIGS. 2, 8, and 9, respectively. However, simulations 5-1, 5-2, and 5-3 were configured without color filters. The results of simulations 5-1, 5-2, and 5-3 in the wavelength range of 400 nm to 1000 nm are shown in FIGS. 42, 43, and 44, respectively. The results of simulation 6 are shown in all of FIGS. 42, 44, and 43 for comparison with the results of simulations 5-1, 5-2, and 5-3.

[Simulations 7-1, 7-2, 7-3, and 8]

Figure 45:
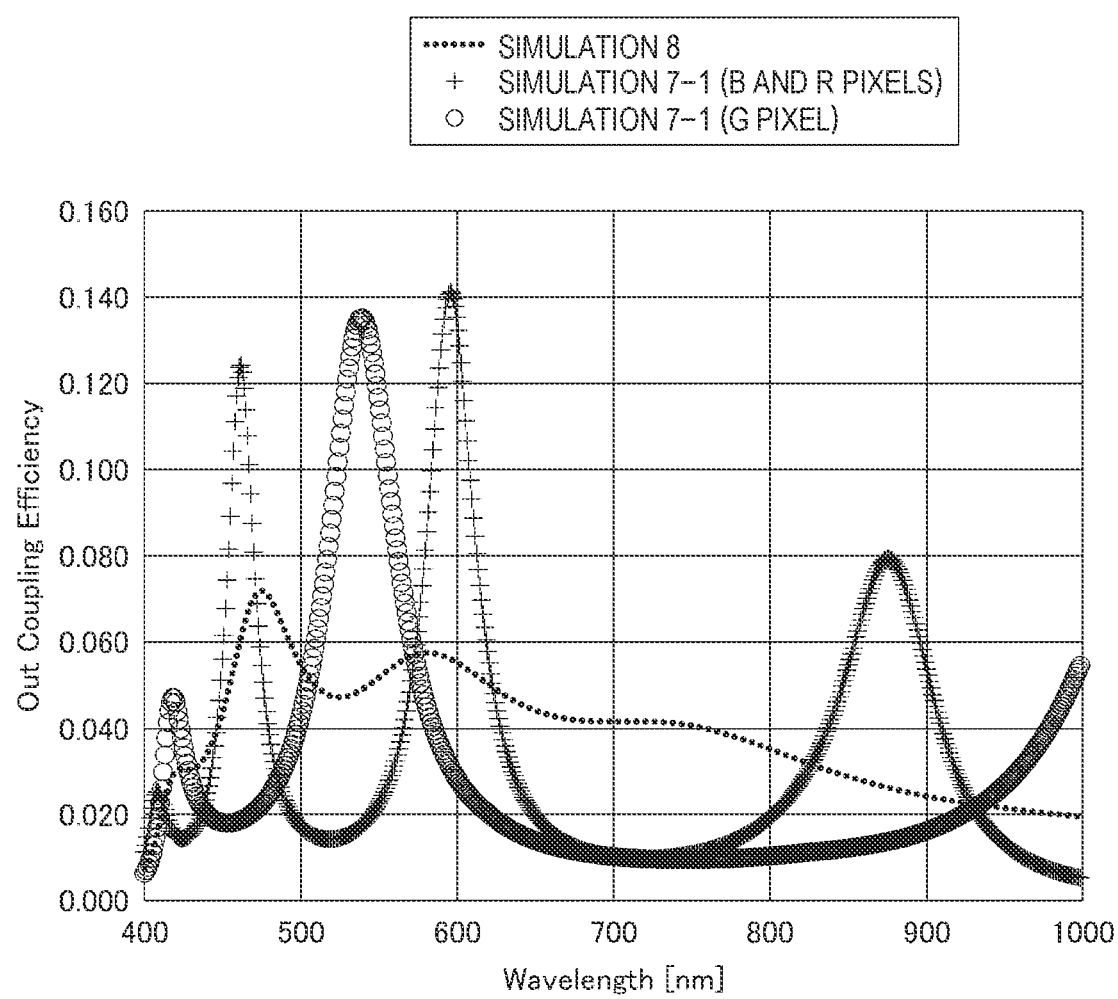
FIG. 45 is a graph showing results of simulations 7-1 and 8.
Figure 46:
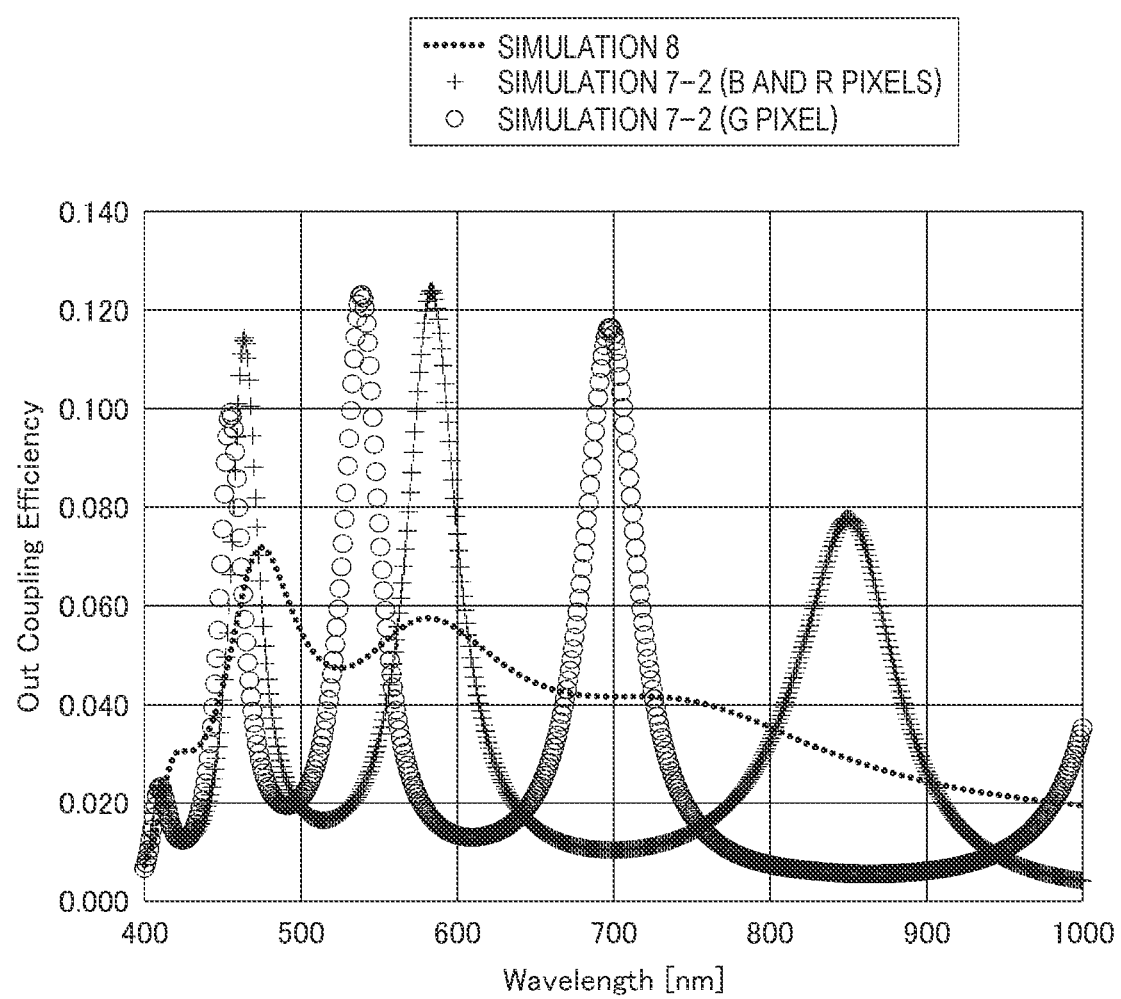
FIG. 46 is a graph showing results of simulations 7-2 and 8.
Figure 47:
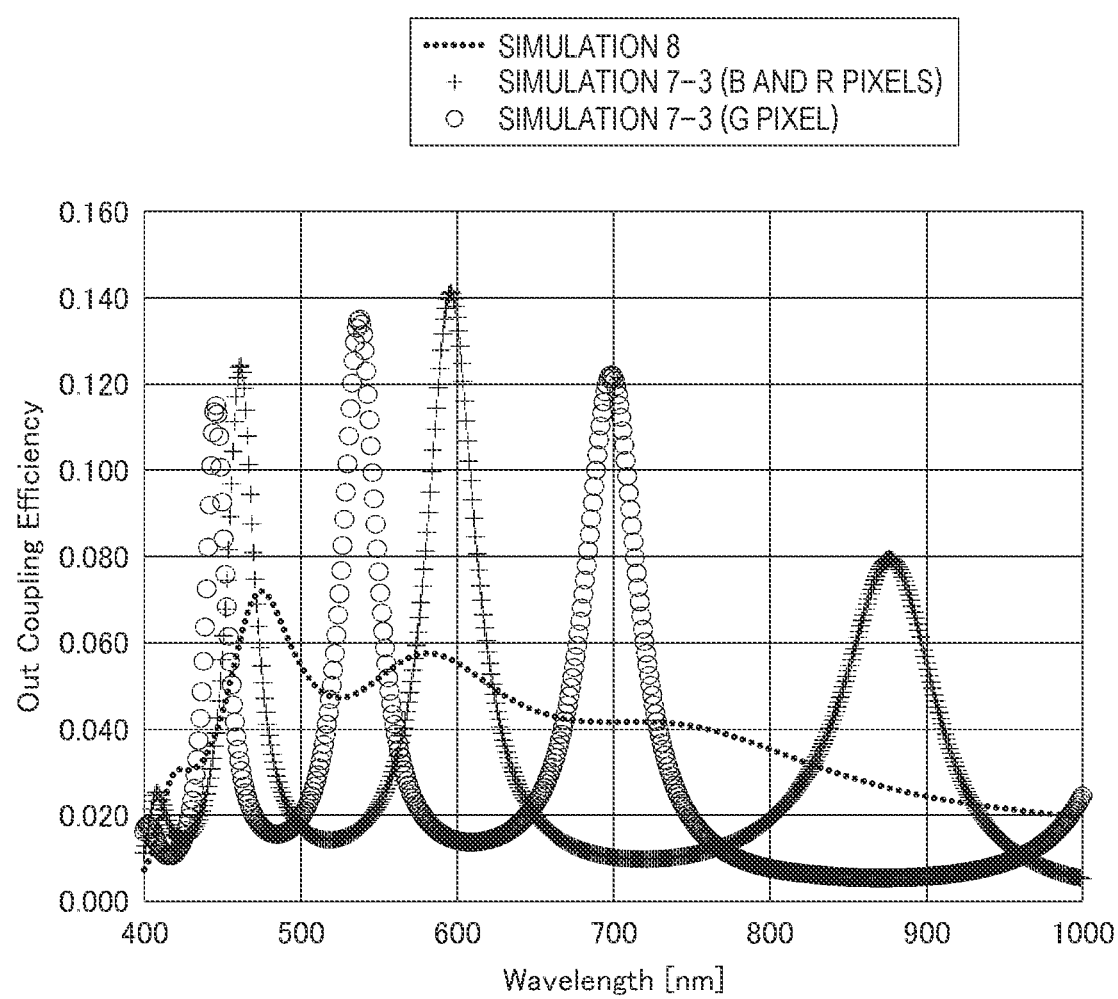
FIG. 47 is a graph showing results of simulations 7-3 and 8.

Simulations 7-1, 7-2, 7-3, and 8 relate to a display device in which an organic EL layer includes a two-layer light-emitting unit (light-emitting unit having a tandem structure). The out coupling efficiency of the display device having the structure shown in Table 4 was obtained by simulation. The configurations of the display devices used in simulations 7-1, 7-2, and 7-3 correspond to the configurations of the display devices illustrated in FIGS. 2, 8, and 9, respectively. However, simulations 7-1, 7-2, and 7-3 were configured without color filters. The results of simulations 7-1, 7-2, and 7-3 in the wavelength range of 400 nm to 1000 nm are shown in FIGS. 45, 46, and 47, respectively. The results of simulation 8 are shown in all of FIGS. 45, 46, and 47 for comparison with the results of simulations 3-1, 3-, and 3-3.

Table 1 shows the configurations of display devices used in simulations 1-1, 1-2, 1-3, and 2.

TABLE 1

|  | Simulation 1-1 | | Simulation 1-2 | | Simulation 1-3 | | Simulation 2 |
| --- | --- | --- | --- | --- | --- | --- | --- |
| Resonator structure | Yes | | Yes | | Yes | | No |
| Pixel | B, R | G | B, R | G | B, R | G | B, G, R |
| Outside | Air | Air | Air | Air | Air | Air | Air |
| Counter substrate | Glass | Glass | Glass | Glass | Glass | Glass | Glass |
| Thickness of protective layer [nm] | 100 | 100 | 100 | 100 | 100 | 100 | 100 |
| Thickness of semi-transmissive reflective layer (Ag layer) [nm] | 12 | 12 | 12 | 12 | 12 | 12 | 0 |
| Thickness of optical adjustment layer (SiN layer) [nm] | 75 | 0 | 0 | 85 | 75 | 150 | 0 |
| Thickness of cathode [nm] | 110 | 110 | 170 | 170 | 110 | 110 | 100 |
| Total thickness of electron injection layer and electron transport layer [nm] | 45 | 45 | 45 | 45 | 45 | 45 | 45 |
| Thickness of green light emitting layer [nm] | 10 | 10 | 10 | 10 | 10 | 10 | 10 |
| Thickness of blue light emitting layer [nm] | 10 | 10 | 10 | 10 | 10 | 10 | 10 |
| Thickness of intermediate layer [nm] | 5 | 5 | 5 | 5 | 5 | 5 | 5 |
| Thickness of red light emitting layer [nm] | 10 | 10 | 10 | 10 | 10 | 10 | 10 |
| Total thickness of hole transport layer and hole injection layer [nm] | 40 | 40 | 40 | 40 | 40 | 40 | 40 |
| Material of anode | Al | Al | Al | Al | Al | Al | Al |

Table 2 shows the configurations of the display devices used in simulations 3-1, 3-2, 3-3, and 4.

TABLE 2

|  | Simulation 3-1 | | Simulation 3-2 | | Simulation 3-3 | | Simulation 4 |
| --- | --- | --- | --- | --- | --- | --- | --- |
| Resonator structure | Yes | | Yes | | Yes | | No |
| Pixel | B, R | G | B, R | G | B, R | G | B, G, R |
| Outside | Air | Air | Air | Air | Air | Air | Air |
| Counter substrate | Glass | Glass | Glass | Glass | Glass | Glass | Glass |
| Thickness of protective layer [nm] | 100 | 100 | 100 | 100 | 100 | 100 | 100 |
| Thickness of semi-transmissive reflective layer (Ag layer) [nm] | 12 | 12 | 12 | 12 | 12 | 12 | 0 |
| Thickness of optical adjustment layer (SiN layer) [nm] | 200 | 0 | 0 | 110 | 200 | 290 | 0 |
| Thickness of cathode [nm] | 110 | 110 | 270 | 270 | 110 | 110 | 110 |
| Thickness of electron transport layer [nm] | 45 | 45 | 45 | 45 | 45 | 45 | 45 |
| Thickness of yellow light emitting layer [nm] | 20 | 20 | 20 | 20 | 20 | 20 | 20 |
| Thickness of intermediate layer [nm] | 5 | 5 | 5 | 5 | 5 | 5 | 5 |
| Thickness of blue light emitting layer [nm] | 20 | 20 | 20 | 20 | 20 | 20 | 20 |

TABLE 2-continued

|  | Simulation 3-1 | | Simulation 3-2 | | Simulation 3-3 | | Simulation 4 |
| --- | --- | --- | --- | --- | --- | --- | --- |
| Total thickness of hole transport layer and hole injection layer [nm] | 40 | 40 | 40 | 40 | 40 | 40 | 40 |
| Material of anode | Al | Al | Al | Al | Al | Al | Al |

Table 3 shows the configurations of the display devices 10 used in simulations 5-1, 5-2, 5-3, and 6.

TABLE 3

|  | Simulation 5-1 | | Simulation 5-2 | | Simulation 5-3 | | Simulation 6 |
| --- | --- | --- | --- | --- | --- | --- | --- |
| Resonator structure | Yes | | Yes | | Yes | | No |
| Pixel | B, R | G | B, R | G | B, R | G | B, G, R |
| Outside | Air | Air | Air | Air | Air | Air | Air |
| Counter substrate | Glass | Glass | Glass | Glass | Glass | Glass | Glass |
| Thickness of protective layer [nm] | 100 | 100 | 100 | 100 | 100 | 100 | 100 |
| Thickness of semi-transmissive reflective layer (Ag layer) [nm] | 12 | 12 | 12 | 12 | 12 | 12 | 0 |
| Thickness of optical adjustment layer (SiN layer) [nm] | 80 | 0 | 0 | 80 | 80 | 295 | 0 |
| Thickness of cathode [nm] | 35 | 35 | 100 | 100 | 35 | 35 | 100 |
| Total thickness of electron injection layer and electron transport layer [nm] | 40 | 40 | 40 | 40 | 40 | 40 | 40 |
| Thickness of blue light emitting layer [nm] | 20 | 20 | 20 | 20 | 20 | 20 | 20 |
| Total thickness of hole transport layer, charge generation layer, and electron transport layer [nm] | 70 | 70 | 70 | 70 | 70 | 70 | 70 |
| Thickness of red light emitting layer [nm] | 10 | 10 | 10 | 10 | 10 | 10 | 10 |
| Thickness of green light emitting layer [nm] | 10 | 10 | 10 | 10 | 10 | 10 | 10 |
| Thickness of hole transport layer [nm] | 50 | 50 | 50 | 50 | 50 | 50 | 50 |
| Material of anode | Al | Al | Al | Al | Al | Al | Al |

Table 4 shows the configurations of the display devices used in simulations 7-1, 7-2, 7-3, and 8.

TABLE 4

|  | Simulation 7-1 | | Simulation 7-2 | | Simulation 7-3 | | Simulation 8 |
| --- | --- | --- | --- | --- | --- | --- | --- |
| Resonator structure | Yes | | Yes | | Yes | | No |
| Pixel | B, R | G | B, R | G | B, R | G | B, G, R |
| Outside | Air | Air | Air | Air | Air | Air | Air |
| Counter substrate | Glass | Glass | Glass | Glass | Glass | Glass | Glass |
| Thickness of protective layer [nm] | 100 | 100 | 100 | 100 | 100 | 100 | 100 |
| Thickness of semi-transmissive reflective layer (Ag layer) [nm] | 12 | 12 | 12 | 12 | 12 | 12 | 0 |
| Thickness of optical adjustment layer (SiN layer) [nm] | 200 | 0 | 0 | 110 | 200 | 295 | 0 |

TABLE 4-continued

|  | Simulation 7-1 | | Simulation 7-2 | | Simulation 7-3 | | Simulation 8 |
| --- | --- | --- | --- | --- | --- | --- | --- |
| Thickness of cathode [nm] | 35 | 35 | 205 | 205 | 35 | 35 | 205 |
| Total thickness of electron injection layer and electron transport layer [nm] | 40 | 40 | 40 | 40 | 40 | 40 | 40 |
| Thickness of blue light emitting layer [nm] | 20 | 20 | 20 | 20 | 20 | 20 | 20 |
| Total thickness of hole transport layer, charge generation layer, and electron transport layer [nm] | 70 | 70 | 70 | 70 | 70 | 70 | 70 |
| Thickness of yellow light emitting layer [nm] | 20 | 20 | 20 | 20 | 20 | 20 | 20 |
| Thickness of hole transport layer [nm] | 50 | 50 | 50 | 50 | 50 | 50 | 50 |
| Material of anode | Al | Al | Al | Al | Al | Al | Al |

Regarding the display device in which the organic EL layer includes a single-layer light-emitting unit, the following can be seen from FIGS. 30 to 35 and 36 to 41.

The out coupling efficiencies of simulations 1-1, 1-2, and 1-3 are higher than the out coupling efficiency of simulation 2. In addition, the out coupling efficiencies of simulations 3-1, 3-2, and 3-3 are higher than the out coupling efficiency of simulation 4. Therefore, in a case where the organic EL layer includes a single-layer light-emitting unit, the out coupling efficiency can be improved by using the configurations of the display devices illustrated in FIGS. 2, 8, and 9.

Regarding the display device in which the organic EL layer includes a two-layer light-emitting unit (light-emitting unit having a tandem structure), the following can be seen from FIGS. 42 to 47.

The out coupling efficiencies of simulations 5-1, 5-2, and 5-3 are higher than the out coupling efficiency of simulation 6. In addition, the out coupling efficiencies of simulations 7-1, 7-2, and 7-3 are higher than the out coupling efficiency of simulation 8. Therefore, in a case where the organic EL layer includes a two-layer light-emitting unit (light-emitting unit having a tandem structure), the out coupling efficiency can be improved by using the configurations of the display devices illustrated in FIGS. 2, 8, and 9.

Although the first and second embodiments of the present disclosure and modifications thereof have been specifically described above, the present disclosure is not limited to the above-described first and second embodiments and modifications thereof, and various modifications based on the technical idea of the present disclosure are possible.

For example, the configurations, methods, steps, shapes, materials, numerical values, and the like mentioned in the above-described first and second embodiments and modifications thereof are merely examples, and configurations, methods, steps, shapes, materials, numerical values, and the like different from these may be used as necessary.

The configurations, methods, steps, shapes, materials, numerical values, and the like of the above-described first and second embodiments and modifications thereof can be combined with each other without departing from the gist of the present disclosure.

The materials exemplified in the above-described first and second embodiments and modifications thereof can be used alone or in combination of two or more unless otherwise specified.

Further, the present disclosure can also employ the following configurations.

(1)

A display device including a plurality of first sub-pixels, a plurality of second sub-pixels, and a plurality of third sub-pixels, in which the first sub-pixel includes a first light emitting element that emits first light and third light, the second sub-pixel includes a second light emitting element that emits second light, the third sub-pixel includes a third light emitting element that emits first light and third light, the first light emitting element, the second light emitting element, and the third light emitting element each include a first electrode, an organic layer including a light emitting layer, a second electrode, and a semi-transmissive reflective layer, and a resonator structure is configured by the first electrode and the semi-transmissive reflective layer, and heights of the semi-transmissive reflective layers in the first light emitting element and the third light emitting element are the same.

(2)

The display device according to (1), in which at least one sub-pixel of the first sub-pixel, the second sub-pixel, or the third sub-pixel further includes a filter.

(3)

The display device according to (2), in which, in a case where the first sub-pixel includes the filter, the filter is a filter having the same color as the first light, in a case where the second sub-pixel includes the filter, the filter is a filter having the same color as the second light, and in a case where the third sub-pixel includes the filter, the filter is a filter having the same color as the third light.

(4)

The display device according to (1), in which the first sub-pixel further includes a first filter having the same color as the first light, the second sub-pixel further includes a second filter having the same color as the second light, and the third sub-pixel further includes a third filter having the same color as the third light.

(5)

The display device according to any one of (1) to (4),
in which the first light emitting element and the third light emitting element each further include an optical adjustment layer between the second electrode and the semi-transmissive reflective layer, and
thicknesses of the optical adjustment layers in the first light emitting element and the third light emitting element are the same.

(6)

The display device according to (5), in which the second electrode and the semi-transmissive reflective layer are adjacent to each other in the second light emitting element.

(7)

The display device according to any one of (1) to (4), in which the second light emitting element further includes an optical adjustment layer between the second electrode and the semi-transmissive reflective layer.

(8)

The display device according to (7), in which the second electrode and the semi-transmissive reflective layer are adjacent to each other in the first light emitting element and the third light emitting element.

(9)

The display device according to any one of (1) to (4),
in which the first light emitting element, the second light emitting element, and the third light emitting element each further include an optical adjustment layer between the second electrode and the semi-transmissive reflective layer, and
a thickness of the optical adjustment layer in the second light emitting element is different from thicknesses of the optical adjustment layers in the first light emitting element and the third light emitting element.

(10)

The display device according to (9), in which the thickness of the optical adjustment layer in the second light emitting element is thicker than the thicknesses of the optical adjustment layers in the first light emitting element and the third light emitting element.

(11)

The display device according to any one of (1) to (10), in which the first light, the second light, and the third light are red light, green light, and blue light, respectively.

(12)

The display device according to any one of (1) to (11),
in which the first light emitting element and the third light emitting element are configured to resonate the first light and the third light in the resonator structure, and
the second light emitting element is configured to resonate the second light in the resonator structure.

(13)

The display device according to any one of (1) to (12), in which the organic layer is provided over the plurality of first sub-pixels, the plurality of second sub-pixels, and the plurality of third sub-pixels.

(14)

The display device according to (1), further including a plurality of fourth sub-pixels,
in which the fourth sub-pixel includes a fourth light emitting element that emits second light and fourth light,
the second light emitting element further emits fourth light,
the fourth light emitting element includes the first electrode, the organic layer, the second electrode, and the semi-transmissive reflective layer, and a resonator structure is configured by the first electrode and the semi-transmissive reflective layer, and
heights of the semi-transmissive reflective layers in the second light emitting element and the fourth light emitting element are the same.

(15)

The display device according to (14), in which at least one sub-pixel of the first sub-pixel, the second sub-pixel, the third sub-pixel, of the fourth sub-pixel further includes a filter.

(16)

The display device according to (15),
in which, in a case where the first sub-pixel includes the filter, the filter is a filter having the same color as the first light,
in a case where the second sub-pixel includes the filter, the filter is a filter having the same color as the second light,
in a case where the third sub-pixel includes the filter, the filter is a filter having the same color as the third light, and
in a case where the fourth sub-pixel includes the filter, the filter is a filter configured to transmit the fourth light.

(17)

The display device according to (14),
in which the first sub-pixel further includes a first filter having the same color as the first light,
the second sub-pixel further includes a second filter having the same color as the second light,
the third sub-pixel further includes a third filter having the same color as the third light, and
the fourth sub-pixel further includes a fourth filter configured to transmit the fourth light.

(18)

The display device according to any one of (14) to (17), in which the first light, the second light, the third light, and the fourth light are red light, green light, blue light, and infrared light, respectively.

(19)

The display device according to any one of (14) to (18),
in which the first light emitting element and the third light emitting element are configured to resonate the first light and the third light in the resonator structure, and
the second light emitting element and the fourth light emitting element are configured to resonate the second light and the fourth light in the resonator structure.

(20)

An electronic device including the display device according to any one of (1) to (19).

Furthermore, the present disclosure can also employ the following configurations.

(21)

A display device including a plurality of first sub-pixels that emits first light, a plurality of second sub-pixels that emits second light, and a plurality of third sub-pixels that emits third light,
in which each of the first sub-pixels includes a first light emitting element that emits the first light and the third light, and a first color filter having the same color as the first light,
each of the second sub-pixels includes a second light emitting element that emits the second light, and a second color filter having the same color as the second light, each of the third sub-pixels includes a third light emitting element that emits the first light and the third light, and a third color filter having the same color as the third light, the first light emitting element, the second light emitting element, and the third light emitting element each include a first electrode, an organic layer including a light emitting layer, a second electrode, and a semi-transmissive reflective layer, and a resonator structure is configured by the first electrode and the semi-transmissive reflective layer, and heights of the semi-transmissive reflective layers in the first light emitting element and the third light emitting element are the same.

(22)

The display device according to (21), in which the first light emitting element and the third light emitting element each further include an optical adjustment layer between the second electrode and the semi-transmissive reflective layer, and thicknesses of the optical adjustment layers in the first light emitting element and the third light emitting element are the same.

(23)

The display device according to (22), in which the second electrode and the semi-transmissive reflective layer are adjacent to each other in the second light emitting element.

(24)

The display device according to (21), in which the second light emitting element further includes an optical adjustment layer between the second electrode and the semi-transmissive reflective layer.

(25)

The display device according to (24), in which the second electrode and the semi-transmissive reflective layer are adjacent to each other in the first light emitting element and the third light emitting element.

(26)

The display device according to (21), in which the first light emitting element, the second light emitting element, and the third light emitting element each further include an optical adjustment layer between the second electrode and the semi-transmissive reflective layer, and a thickness of the optical adjustment layer in the second light emitting element is different from thicknesses of the optical adjustment layers in the first light emitting element and the third light emitting element.

(27)

The display device according to (26), in which the thickness of the optical adjustment layer in the second light emitting element is thicker than the thicknesses of the optical adjustment layers in the first light emitting element and the third light emitting element.

(28)

The display device according to any one of (21) to (27), in which the first light, the second light, and the third light are red light, green light, and blue light, respectively.

(29)

The display device according to any one of (21) to (28), in which the first light emitting element and the third light emitting element are configured to resonate the first light and the third light in the resonator structure, and the second light emitting element is configured to resonate the second light in the resonator structure.

(30)

The display device according to any one of (21) to (29), in which the organic layer is provided over the plurality of first sub-pixels, the plurality of second sub-pixels, and the plurality of third sub-pixels.

(31)

The display device according to (21), further including a plurality of fourth sub-pixels that emits fourth light, in which each of the fourth sub-pixels includes a fourth light emitting element that emits the second light and the fourth light, each of the second light emitting elements further emits the fourth light, the fourth light emitting element includes the first electrode, the organic layer, the second electrode, and the semi-transmissive reflective layer, and a resonator structure is configured by the first electrode and the semi-transmissive reflective layer, and heights of the semi-transmissive reflective layers in the second light emitting element and the fourth light emitting element are the same.

(32)

The display device according to (31), in which the first light emitting element and the third light emitting element each further include an optical adjustment layer between the second electrode and the semi-transmissive reflective layer, and thicknesses of the optical adjustment layers in the first light emitting element and the third light emitting element are the same.

(33)

The display device according to (32), in which the second electrode and the semi-transmissive reflective layer are adjacent to each other in the second light emitting element and the fourth light emitting element.

(34)

The display device according to (31), in which the second light emitting element and the fourth light emitting element each further includes an optical adjustment layer between the second electrode and the semi-transmissive reflective layer.

(35)

The display device according to (34), in which the second electrode and the semi-transmissive reflective layer are adjacent to each other in the first light emitting element and the third light emitting element.

(36)

The display device according to (31), in which the first light emitting element, the second light emitting element, the third light emitting element, and the fourth light emitting element each further include an optical adjustment layer between the second electrode and the semi-transmissive reflective layer, and thicknesses of the optical adjustment layers in the second light emitting element and the fourth light emitting element are different from thicknesses of the optical adjustment layers in the first light emitting element and the third light emitting element.

(37)

The display device according to any one of (31) to (36), in which the first light, the second light, the third light, and the fourth light are red light, green light, blue light, and infrared light, respectively.

(38)
 The display device according to any one of (31) to (37), in which the first light emitting element and the third light emitting element are configured to resonate the first light and the third light in the resonator structure, and the second light emitting element and the fourth light emitting element are configured to resonate the second light and the fourth light in the resonator structure.

(39)
 The display device according to any one of (31) to (38), in which the organic layer is provided over the plurality of first sub-pixels, the plurality of second sub-pixels, the plurality of third sub-pixels, and the plurality of fourth sub-pixels.

(40)
 An electronic device including the display device according to any one of (1) to (39).

Furthermore, the present disclosure can also employ the following configurations.

(41)
 A display device including a plurality of first sub-pixels, a plurality of second sub-pixels, and a plurality of third sub-pixels,
 in which the first sub-pixel includes a first light emitting element that emits first light and third light,
 the second sub-pixel includes a second light emitting element that emits second light,
 the third sub-pixel includes a third light emitting element that emits first light and third light,
 the first light emitting element, the second light emitting element, and the third light emitting element each include a first electrode, an organic layer including a light emitting layer, a second electrode, and a semi-transmissive reflective layer, and a resonator structure is configured by the first electrode and the semi-transmissive reflective layer, and
 heights of the semi-transmissive reflective layers in the first light emitting element and the third light emitting element are the same.

(42)
 The display device according to (41),
 in which at least one sub-pixel of the first sub-pixel, the second sub-pixel, or the third sub-pixel further includes a filter,
 in a case where the first sub-pixel includes the filter, the filter is a filter having the same color as the first light,
 in a case where the second sub-pixel includes the filter, the filter is a filter having the same color as the second light, and
 in a case where the third sub-pixel includes the filter, the filter is a filter having the same color as the third light.

(43)
 The display device according to (41),
 in which the first sub-pixel further includes a first filter having the same color as the first light,
 the second sub-pixel further includes a second filter having the same color as the second light, and
 the third sub-pixel further includes a third filter having the same color as the third light.

(44)
 The display device according to any one of (41) to (43),
 in which the first light emitting element and the third light emitting element each further include an optical adjustment layer between the second electrode and the semi-transmissive reflective layer, and
 thicknesses of the optical adjustment layers in the first light emitting element and the third light emitting element are the same.

(45)
 The display device according to (44), in which the second electrode and the semi-transmissive reflective layer are adjacent to each other in the second light emitting element.

(46)
 The display device according to (44) or (45), in which the optical adjustment layer includes an organic layer and an inorganic layer in that order.

(47)
 The display device according to any one of (41) to (43),
 in which the first light emitting element and the third light emitting element each further include a base layer and an optical adjustment layer in that order between the second electrode and the semi-transmissive reflective layer,
 the first light emitting element further includes the base layer between the second electrode and the semi-transmissive reflective layer, and
 an etching rate of the base layer is slower than an etching rate of the optical adjustment layer.

(48)
 The display device according to any one of (41) to (43), in which the second light emitting element further includes an optical adjustment layer between the second electrode and the semi-transmissive reflective layer.

(49)
 The display device according to (48), in which the second electrode and the semi-transmissive reflective layer are adjacent to each other in the first light emitting element and the third light emitting element.

(50)
 The display device according to any one of (41) to (43),
 in which the first light emitting element, the second light emitting element, and the third light emitting element each further include an optical adjustment layer between the second electrode and the semi-transmissive reflective layer, and
 a thickness of the optical adjustment layer in the second light emitting element is different from thicknesses of the optical adjustment layers in the first light emitting element and the third light emitting element.

(51)
 The display device according to (50), in which the thickness of the optical adjustment layer in the second light emitting element is thicker than the thicknesses of the optical adjustment layers in the first light emitting element and the third light emitting element.

(52)
 The display device according to any one of (41) to (51),
 in which the first light emitting element and the third light emitting element are configured to resonate the first light and the third light in the resonator structure, and
 the second light emitting element is configured to resonate the second light in the resonator structure.

(53)
 The display device according to any one of (41) to (43), further including a plurality of fourth sub-pixels,
 in which the fourth sub-pixel includes a fourth light emitting element that emits second light and fourth light,
 the second light emitting element further emits fourth light,
 the fourth light emitting element includes the first electrode, the organic layer, the second electrode, and the semi-transmissive reflective layer, and a resonator structure is configured by the first electrode and the semi-transmissive reflective layer, and heights of the semi-transmissive reflective layers in the second light emitting element and the fourth light emitting element are the same.

(54)

The display device according to (53), in which at least one sub-pixel of the first sub-pixel, the second sub-pixel, the third sub-pixel, or the fourth sub-pixel further includes a filter, in a case where the first sub-pixel includes the filter, the filter is a filter having the same color as the first light, in a case where the second sub-pixel includes the filter, the filter is a filter having the same color as the second light, in a case where the third sub-pixel includes the filter, the filter is a filter having the same color as the third light, and in a case where the fourth sub-pixel includes the filter, the filter is a filter configured to transmit the fourth light.

(55)

The display device according to (53), in which the first sub-pixel further includes a first filter having the same color as the first light, the second sub-pixel further includes a second filter having the same color as the second light, the third sub-pixel further includes a third filter having the same color as the third light, and the fourth sub-pixel further includes a fourth filter configured to transmit the fourth light.

(56)

The display device according to any one of (53) to (55), in which the first light emitting element and the third light emitting element are configured to resonate the first light and the third light in the resonator structure, and the second light emitting element and the fourth light emitting element are configured to resonate the second light and the fourth light in the resonator structure.

(57)

The display device according to any one of (41) to (56), in which the organic layer includes at least one charge generation layer.

(58)

The display device according to any one of (41) to (57), further including a contact portion and an auxiliary electrode, in which the auxiliary electrode electrically connects the semi-transmissive reflective layer and the contact portion.

(59)

The display device according to any one of (41) to (57), further including a contact portion, in which the semi-transmissive reflective layer electrically connects the second electrode and the contact portion.

(60)

An electronic device including the display device according to any one of (41) to (59).

REFERENCE SIGNS LIST 10, 10A, 10B, 10C, 10D, 10E, 10F, 10G, 10H, 10I, 20, 20A,
20B, 20C, 20D, 20E, 20F, 20G, 20H Display device
11 Drive substrate
12 First electrode
12A Contact portion
13 Insulating layer
13A Opening
14 Organic electroluminescence layer
15 Second electrode
16 Optical adjustment layer
16A Opening
16B Protrusion
16C Recess
17 Semi-transmissive reflective layer
18 Protective layer
19 Color filter
19R Red filter
19G Green filter
19B Blue filter
19IR IR filter
21 Etching stop layer
22A First optical adjustment layer
22B Second optical adjustment layer
22, 23, 24 Optical adjustment layer
23A, 24B Organic layer
23B, 24A, 24C Inorganic layer
25 Transparent electrode
25A Peripheral edge portion
100R, 100G, 100B, 100IR Sub-pixel
101R, 101G, 101B, 101IR Light emitting element
110A Display region
110B Peripheral region
111 Signal line drive circuit
111A Signal line
112 Scanning line drive circuit
112A Scanning line
310 Digital still camera (electronic device)
320 Head mounted display (electronic device)
330 Television apparatus (electronic device)

The invention claimed is:

1. A display device comprising a plurality of first sub-pixels, a plurality of second sub-pixels, and a plurality of third sub-pixels, wherein the first sub-pixel includes a first light emitting element that emits first light and third light, the second sub-pixel includes a second light emitting element that emits second light, the third sub-pixel includes a third light emitting element that emits first light and third light, the first light emitting element, the second light emitting element, and the third light emitting element each include a first electrode, an organic layer including a light emitting layer, a second electrode, and a semi-transmissive reflective layer, and a resonator structure is configured by the first electrode and the semi-transmissive reflective layer, and heights of the semi-transmissive reflective layers in the first light emitting element and the third light emitting element are the same.

2. The display device according to claim 1, wherein at least one sub-pixel of the first sub-pixel, the second sub-pixel, or the third sub-pixel further includes a filter, in a case where the first sub-pixel includes the filter, the filter is a filter having the same color as the first light, in a case where the second sub-pixel includes the filter, the filter is a filter having the same color as the second light, and in a case where the third sub-pixel includes the filter, the filter is a filter having the same color as the third light.

3. The display device according to claim 1,
wherein the first sub-pixel further includes a first filter having the same color as the first light,
the second sub-pixel further includes a second filter having the same color as the second light, and
the third sub-pixel further includes a third filter having the same color as the third light.

4. The display device according to claim 1,
wherein the first light emitting element and the third light emitting element each further include an optical adjustment layer between the second electrode and the semi-transmissive reflective layer, and
thicknesses of the optical adjustment layers in the first light emitting element and the third light emitting element are the same.

5. The display device according to claim 4, wherein the second electrode and the semi-transmissive reflective layer are adjacent to each other in the second light emitting element.

6. The display device according to claim 4, wherein the optical adjustment layer includes an organic layer and an inorganic layer in that order.

7. The display device according to claim 1,
wherein the first light emitting element and the third light emitting element each further include a base layer and an optical adjustment layer in that order between the second electrode and the semi-transmissive reflective layer,
the first light emitting element further includes the base layer between the second electrode and the semi-transmissive reflective layer, and
an etching rate of the base layer is slower than an etching rate of the optical adjustment layer.

8. The display device according to claim 1, wherein the second light emitting element further includes an optical adjustment layer between the second electrode and the semi-transmissive reflective layer.

9. The display device according to claim 8, wherein the second electrode and the semi-transmissive reflective layer are adjacent to each other in the first light emitting element and the third light emitting element.

10. The display device according to claim 1,
wherein the first light emitting element, the second light emitting element, and the third light emitting element each further include an optical adjustment layer between the second electrode and the semi-transmissive reflective layer, and
a thickness of the optical adjustment layer in the second light emitting element is different from thicknesses of the optical adjustment layers in the first light emitting element and the third light emitting element.

11. The display device according to claim 10, wherein the thickness of the optical adjustment layer in the second light emitting element is thicker than the thicknesses of the optical adjustment layers in the first light emitting element and the third light emitting element.

12. The display device according to claim 1,
wherein the first light emitting element and the third light emitting element are configured to resonate the first light and the third light in the resonator structure, and
the second light emitting element is configured to resonate the second light in the resonator structure.

13. The display device according to claim 1, further comprising a plurality of fourth sub-pixels,
wherein the fourth sub-pixel includes a fourth light emitting element that emits second light and fourth light,
the second light emitting element further emits fourth light,
the fourth light emitting element includes the first electrode, the organic layer, the second electrode, and the semi-transmissive reflective layer, and a resonator structure is configured by the first electrode and the semi-transmissive reflective layer, and
heights of the semi-transmissive reflective layers in the second light emitting element and the fourth light emitting element are the same.

14. The display device according to claim 13,
wherein at least one sub-pixel of the first sub-pixel, the second sub-pixel, the third sub-pixel, or the fourth sub-pixel further includes a filter,
in a case where the first sub-pixel includes the filter, the filter is a filter having the same color as the first light,
in a case where the second sub-pixel includes the filter, the filter is a filter having the same color as the second light,
in a case where the third sub-pixel includes the filter, the filter is a filter having the same color as the third light, and
in a case where the fourth sub-pixel includes the filter, the filter is a filter configured to transmit the fourth light.

15. The display device according to claim 13,
wherein the first sub-pixel further includes a first filter having the same color as the first light,
the second sub-pixel further includes a second filter having the same color as the second light,
the third sub-pixel further includes a third filter having the same color as the third light, and
the fourth sub-pixel further includes a fourth filter configured to transmit the fourth light.

16. The display device according to claim 13,
wherein the first light emitting element and the third light emitting element are configured to resonate the first light and the third light in the resonator structure, and
the second light emitting element and the fourth light emitting element are configured to resonate the second light and the fourth light in the resonator structure.

17. The display device according to claim 1, wherein the organic layer includes at least one charge generation layer.

18. The display device according to claim 1, further comprising a contact portion and an auxiliary electrode,
wherein the auxiliary electrode electrically connects the semi-transmissive reflective layer and the contact portion.

19. The display device according to claim 1, further comprising a contact portion,
wherein the semi-transmissive reflective layer electrically connects the second electrode and the contact portion.

20. An electronic device comprising the display device according to claim 1.

* * * * *